(12) United States Patent
Washio et al.

(10) Patent No.: US 9,373,815 B2
(45) Date of Patent: Jun. 21, 2016

(54) SEALING LAYER OF ORGANIC EL DEVICE

(71) Applicant: Kaneka Corporation, Osaka-shi, Osaka (JP)

(72) Inventors: Takahiro Washio, Aomori (JP); Kazuhiro Kubo, Aomori (JP); Motoi Sasaki, Aomori (JP); Hideo Yamagishi, Kamikita-gun (JP); Akira Nishikawa, Kamikita-gun (JP); Katsuhiko Hayashi, Kusatsu (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 14/426,931

(22) PCT Filed: Sep. 5, 2013

(86) PCT No.: PCT/JP2013/073921
§ 371 (c)(1),
(2) Date: Mar. 9, 2015

(87) PCT Pub. No.: WO2014/038625
PCT Pub. Date: Mar. 13, 2014

(65) Prior Publication Data
US 2015/0228926 A1    Aug. 13, 2015

(30) Foreign Application Priority Data

Sep. 10, 2012  (JP) ................................ 2012-198589
Sep. 10, 2012  (JP) ................................ 2012-198590
Sep. 14, 2012  (JP) ................................ 2012-203148
Sep. 14, 2012  (JP) ................................ 2012-203149

(51) Int. Cl.
*H01L 51/52*    (2006.01)
*H01L 33/10*    (2010.01)
*H05B 33/10*    (2006.01)

(52) U.S. Cl.
CPC ........ *H01L 51/5253* (2013.01); *H01L 51/5246* (2013.01); *H05B 33/10* (2013.01); *H01L 51/5203* (2013.01)

(58) Field of Classification Search
CPC ..................... H01L 51/5253; H01L 51/5246
See application file for complete search history.

(56) References Cited

U.S. PATENT DOCUMENTS

2005/0127818 A1    6/2005 Ohtani
2009/0200930 A1*   8/2009 Hayashi .............. H01L 27/3276
                                                          313/504

FOREIGN PATENT DOCUMENTS

JP    05089959 A    4/1993
JP    08236271 A    9/1996
(Continued)

OTHER PUBLICATIONS

International Bureau of WIPO, International Preliminary Report on Patentability Issued in Application No. PCT/JP2013/073921, Mar. 19, 2015, WIPO, 10 pages.

(Continued)

*Primary Examiner* — Mamadou Diallo
(74) *Attorney, Agent, or Firm* — Alleman Hall McCoy Russell & Tuttle LLP

(57) ABSTRACT

Provided is an organic EL device which can prevent invasion of moisture to an organic EL element. The organic EL device has an organic EL element in which a first electrode layer, a functional layer, and a second electrode layer are stacked in sequence on a transparent substrate having a planar expanse, and an inorganic sealing layer for sealing at least an emission area of the organic EL element. A soft adhesion layer is stacked directly onto the inorganic sealing layer with a planar expanse, and the soft adhesion layer is made of a resin, and has flexibility.

6 Claims, 31 Drawing Sheets

(56) References Cited

FOREIGN PATENT DOCUMENTS

| JP | 11204808 A | 7/1999 |
| JP | 2005285659 A | 10/2005 |
| JP | 2009218117 A | 9/2009 |
| JP | 2010033734 A | 2/2010 |
| JP | 2011100742 A | 5/2011 |

OTHER PUBLICATIONS

ISA Japanese Patent Office, International Search Report of PCT/JP2013/073921, Dec. 24, 2013, WIPO, 4 pages.

* cited by examiner

FIG. 4
A-A
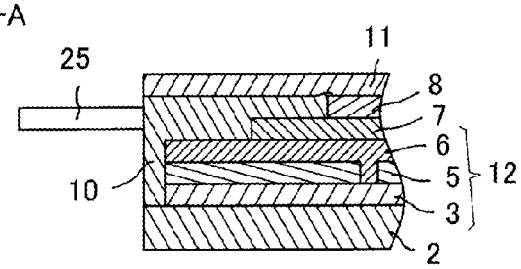
B-B
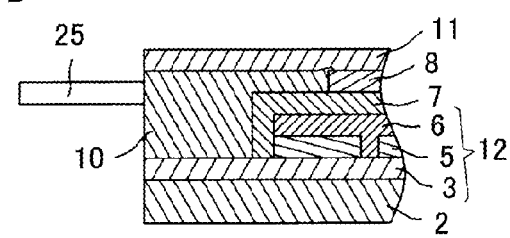
C-C
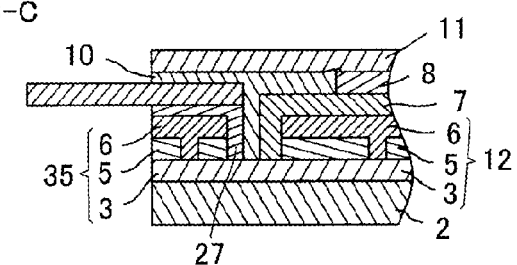
D-D
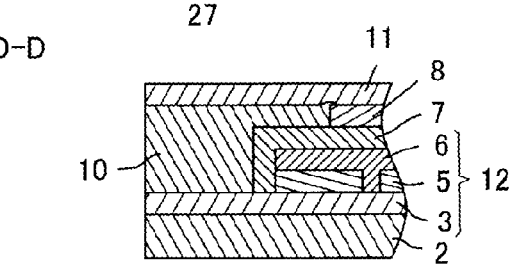
E-E
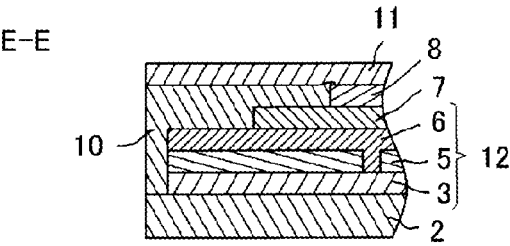
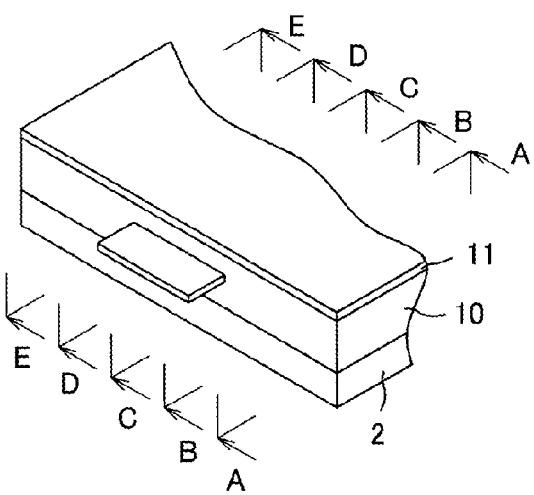

A-A section

B-B section

SEALING LAYER OF ORGANIC EL DEVICE

TECHNICAL FIELD

The present invention relates to an organic EL (Electro Luminescence) device, and a method for manufacturing the same.

BACKGROUND ART

Nowadays, an organic EL device attracts attention as a lighting device replacing an incandescent lamp and a fluorescent lamp, and many studies are made.

As used herein, the organic EL device means one in which an organic EL element is stacked on a transparent substrate such as a glass substrate or a transparent resin film.

In the organic EL element, two electrodes in which one or both the electrodes have translucency are opposed to each other, and a light emitting layer made of an organic compound is stacked between the electrodes. The organic EL device emits light by energy of recombination of an electron and a hole that are electrically excited.

The organic EL device is a self-luminous device, and the organic EL device can emit the light having various wavelengths by properly selecting a material for the light emitting layer. The organic EL device is extremely thin compared with an incandescent lamp and a fluorescent lamp, and the organic EL device planarly emits the light. Therefore, there are few restrictions to an installation place.

In order to prevent moisture or oxygen (hereinafter, also referred to as water or the like) from invading into the organic EL element, the organic EL device has a sealing structure that blocks the organic EL element from an external atmosphere.

However, in the case where the organic EL element has the insufficient sealing function, a non-luminous point called a dark spot is generated after a long period of use of the organic EL device.

The dark spot will be described in detail. In the case where the organic EL element has the insufficient sealing function, the water or the like invades into the sealing structure, and the organic EL element is exposed to the water or the like. At this point, when the organic EL element is used (lit), the electrode constituting the organic EL element or an organic compound layer in the vicinity of the electrode interface is partially oxidized, and an insulating oxide layer is formed on the surface. When the oxide layer is formed, the place where the oxide layer is formed is partially insulated. Therefore, the place does not emit the light during the lighting, but the dark spot is formed.

In order to prevent the formation of the dark spot in the organic EL device, it is necessary to surely prevent the water or the like from invading into the organic EL element.

As a technique of preventing invasion of water or the like into the organic EL element, Patent Document 1 is known. Patent Document 1 discloses a technique of providing an organic EL element having a structure in which a first electrode (electrode), an organic compound layer (light emitting layer), and a second electrode (electrode) are sequentially stacked on a base member, and sealing it by overlaying a silicon alloy layer as a sealing layer on the second electrode.

PRIOR ART DOCUMENT

Patent Document

Patent Document 1: JP 2005-285659 A

SUMMARY OF INVENTION

Technical Problem

Although the organic EL device of Patent Document 1 has a certain level of sealing performance, the sealing is not sufficient only with the silicon alloy layer. For this reason, an organic EL device having higher sealing performance is demanded, and there is still room for improvement.

The present invention has been devised to solve the aforementioned problems, and provides an organic EL device capable of preventing invasion of moisture into the organic EL element and avoiding occurrence of malfunction such as unlit due to a short circuit.

Solution to Problem

In order to solve the above problem, inventors of the present application experimentally manufactured an organic EL device having such a structure that a silicon alloy layer is further covered with a hard sealing layer by reference to the structure of Patent Document 1. That is, the present inventors experimentally manufactured an organic EL device having a double sealing structure made up of a silicon alloy layer and a hard sealing layer to improve the sealing performance. Specifically, as illustrated in FIG. 33A, an experimentally manufactured organic EL device 500 was manufactured by stacking, on a glass substrate 502, an organic EL element 520 in which a transparent electrode layer 503, an organic light emitting layer 505 and a back side electrode layer 506 are stacked in sequence. On the back side electrode layer 506, a silicon alloy layer 507 was stacked. Further, outsides of the organic EL element 520 and the silicon alloy layer 507 were sealed with a hard epoxy resin layer 508.

Since the experimentally manufactured organic EL device 500 had a double sealing structure, the sealing performance seemed to be significantly improved compared with the conventional one. The present inventors expected that the number of generated dark spots, and growth of dark spots would be greatly decreased, and thus the reliability and the service life of the device would be greatly improved.

However, such an effect as expected by the present inventors was not obtained by the experimentally manufactured organic EL device 500. That is, in the experimentally manufactured organic EL device 500, unlit that seems to be caused by a short circuit was observed in many devices although growth of dark spots was suppressed compared with the conventional one.

Through consideration of the reason, the present inventors built up a certain hypothesis. Specifically, the present inventors assumed that the electrode layers 503, 506, and the organic light emitting layer 505 deform by local thermal expansion, breakage and the like occurring inside the organic EL device 500.

Regarding this point, in the organic EL device 500, an initial defect, the environment, an external factor and the like can cause expansion or breakage and thus scattering of part of the organic EL element 520. In this case, in the silicon alloy layer 507, since the stress escapes toward the outside (the side opposite to the organic EL element 520) as illustrated in FIG. 33B in response to the pressure or impact, the stress is hardly applied to the side of the organic EL element 520.

However, in the case of the experimentally manufactured organic EL device 500, a hard epoxy resin layer 108 covers the outside of the silicon alloy layer 507. Therefore, as illustrated in FIG. 33C, the silicon alloy layer 507 is pushed back toward the organic EL element 520 due to the rigidity of the epoxy resin layer 108 covering the outside.

Also a distortion tends to occur due to a difference in the coefficient of thermal expansion between the silicon alloy layer 507 and the epoxy resin layer 508 caused by the heat generated in the organic EL element 520 at the time of driving. Therefore, inside the organic EL device 500, the silicon alloy layer 507 presses the expanded region of the organic EL element 520 to make the distance between the transparent electrode layer 503 and the back side electrode layer 506 smaller, to cause a new short circuit.

The inventors considered that in the structure of the experimentally manufactured organic EL device 500, once a dark spot is generated, the dark spot causes an increase in dark spots although the sealing performance is improved compared with the conventional one. The inventors also considered that the increase in dark spots triggers unlit of the overall organic EL device 500.

Based on the aforementioned hypothesis, the present inventors experimentally manufactured a structure in which a buffer layer having flexibility is interposed between the silicon alloy layer 507 and the epoxy resin layer 508 so that the buffer layer alleviates the stress. As a result, reduction in the number of generated dark spots, and significant decrease in the growth exceeding expectations were observed. Also it was found that the organic EL device in which the buffer layer is interposed hardly causes unlit.

One aspect of the present invention derived based on these findings is an organic EL device having a sectional structure including a laminate having a first electrode layer, an organic light emitting layer and a second electrode layer on a base member, and a sealing layer that seals the whole or part of the laminate, wherein a buffer layer is stacked directly or indirectly with respect to the sealing layer, and the buffer layer is a soft resin layer made of a resin, having flexibility.

The state being stacked "directly" with respect to the sealing layer used herein refers to the state that the buffer layer is directly stacked on the sealing layer.

The state being stacked "indirectly" with respect to the sealing layer used herein refers to the state that a different layer or the like is interposed between the sealing layer and the buffer layer.

The state being stacked "directly" and "indirectly" with respect to the sealing layer refers to the state that only part of the buffer layer is directly stacked on the sealing layer, and the remaining part is stacked with a different layer or the like interposed between the buffer layer and the sealing layer. Those allowable for interposition between the sealing layer and the buffer layer in the case of indirect stacking are limited to those that easily deform, easily break, or deform simultaneously with deformation of the sealing layer, and are substantially ignorable.

According to the present aspect, the buffer layer is stacked directly or indirectly with respect to the sealing layer. That is, since the buffer layer is stacked outside the sealing layer, moisture invasion can be prevented by the buffer layer, in addition to the sealing performance of the sealing layer, and thus the sealing performance can be reinforced. Therefore, the organic EL device of the present aspect has higher sealing performance compared with the conventional one.

Also, since the buffer layer is a soft resin layer that is formed of a resin and has flexibility, even when a short circuit occurs inside the laminate caused by an external factor or the like, and the short circuit part expands or breaks to be scattered, the impact can be absorbed by the buffer layer. Therefore, pushing back of the sealing layer due to the repelling force of the buffer layer hardly occurs, and the laminate would not be pressed. That is, it is possible to prevent occurrence of the sequential short circuit caused in such a way that the first electrode layer and the second electrode layer come closer to each other by pushing back, and the first electrode layer and the second electrode layer come into contact with each other. Therefore, the organic EL device of the present aspect has high durability and high reliability. Also, the organic EL device of the present aspect hardly causes unlit.

In a preferred aspect, the organic EL device has a sectional structure provided with a sealing member separately formed outside the sealing layer when viewed from the side of the base member, an emission area that actually emits light exists when the base member is planarly viewed, and the organic EL device has a hard wall part that surrounds an area including the emission area, and has such a structure that the sealing member is supported by the hard wall part.

According to the present aspect, since the device has such a structure that the sealing member is supported by the hard wall part surrounding the area including the emission area, the sealing performance can be further improved by the hard wall part and the sealing member.

In a preferred aspect, the organic EL device has a sectional structure provided with a sealing member separately formed outside the laminate when viewed from the side of the base member, an emission area that actually emits light exists when the base member is planarly viewed, the soft resin layer is stacked on a projection plane in a lamination direction of the laminate constituting the emission area, an area outside the soft resin layer is surrounded by a hard resin layer that is harder than the soft resin layer when the base member is planarly viewed, and the sealing member is bonded by the soft resin layer and the hard resin layer.

According to the present aspect, the hard resin layer surrounds the area outside the soft resin layer when the base member is planarly viewed, and the sealing member is bonded by the soft resin layer and the hard resin layer. That is, in the emission area, the sealing member is bonded by the soft resin layer, and in the periphery thereof, the sealing member is bonded by the hard resin layer. In brief, the sealing member is bonded by two kinds of resin layer. Therefore, it is possible to alleviate the stress caused by the soft resin layer as described above while securing the bonding area. For this reason, the sealing performance is high, and unlit hardly occurs. Since the soft resin layer can absorb the stress caused by thermal expansion of the laminate, the thermal shock resistance is high, and a crack is hardly generated.

For taking advantage of the surface light emission which is a merit of the organic EL device, it is preferred to secure the area of the emission area that actually emits light as large as possible. When the emission area and the feeding area that contributes to electricity feeding to the emission area are formed on the same base member, the area of the feeding area on the base member decreases as the area of the emission area on the base member increases.

As a measure for increasing the emission area, the structure as disclosed in JP 2011-119239 A is conceivable.

In the light-emitting module (organic EL device) disclosed in JP 2011-119239 A, the feeding terminal located in the emission area, and the feeding electrode (electrode) located in the feeding area are connected with each other by the electrically connecting member (feeding member) on the back side of the supporting member (sealing member). That is, it is assumed that by laying the linear feeding member from the feeding area to the emission area, the area of the feeding area is reduced, and the emission area can be increased.

In the organic EL device of JP 2011-119239 A, however, although the area of the emission area can be increased, the strength is poor because of the linear shape of the feeding member, and the wire breaking can occur due to an external factor.

Also, the electrode and the feeding member are joined by ultrasonic joining, and the whole of the feeding member is exposed. Therefore, when a copper wire is used for the feeding member, for example, the surface of the feeding member is sometimes oxidized. Oxidation of the feeding member inhibits the current flow, and may occasionally lead into breakage of wire to disable the electricity feeding.

A preferred aspect capable of solving the above problem is the organic EL device wherein an emission area that actually emits light and a feeding area to which a feeding member is connected exist when the base member is planarly viewed, the organic EL device has a hard wall part surrounding an area including the emission area, and at least part of the feeding member is embedded in the hard wall part, electricity is fed to the feeding area from outside via the embedded feeding member, the organic EL device further has a conductive base member having electric conductivity on the second electrode layer, the conductive base member and the feeding area are electrically connected with each other via the feeding member, and in the emission area, electricity is fed from the outside via the conductive base member.

The "conductive base member" used herein means a base member having a current conductive pathway, and includes not only base members having a mounted part such as a printed wiring board (PWB), for example, but also base members just having conductivity such as a copper foil.

According to the present aspect, at least part of the feeding member is embedded in the hard wall part, and electricity is fed from the outside to the feeding area via the embedded feeding member. That is, part of the feeding member is covered with the hard wall part, and functions as a pseudo potting sealing. Therefore, noises hardly occur at the time of electricity feeding. Also, even when the feeding member is made of a wire or a foil which is low in strength, for example, wire breakage or damage due to an external factor hardly occurs because the strength of the part of the feeding member is reinforced by the hard wall part. Further, in the case of the metallic feeding member, for example, oxidation of the surface can be prevented.

According to the present aspect, the conductive base member having electric conductivity is provided on the second electrode layer, and the conductive base member and the feeding area are electrically connected with each other via the feeding member, and electricity is fed from the outside via the conductive base member in the emission area when planarly viewed. That is, according to the present aspect, since the conductive base member is provided in the position opposite to the light extraction side of the emission area, it hardly interferes with the electricity feeding, and gives good appearance. Also, according to the present aspect, since the conductive base member is provided in the position opposite to the light extraction side of the emission area, the installation area for the conductive base member can be sufficiently secured. Further, according to the present aspect, it is possible to reduce the area of the feeding area, and at the same time, it is possible to increase the area for emitting light.

In a more preferred aspect, an emission area that actually emits light exists when the base member is planarly viewed, and the soft resin layer is located in the whole of the emission area.

According to the present aspect, since the soft resin layer serving as the buffer layer is located in the whole of the emission area that actually emits light, even when the laminate and the sealing layer expand due to heat generation or the like at the time of driving, the expansion can be absorbed by the soft resin layer.

In a further preferred aspect, an average thickness of the soft resin layer ranges from 2 μm to 1000 μm, inclusive.

In the present invention, from the view point of taking advantage of the thinness of the organic EL device while securing sufficient absorption of expansion or impact, an average thickness of the soft resin layer ranges from 2 μm to 1000 μm, inclusive.

In particular, when other member is bonded with the soft resin layer, the average thickness of the soft resin layer preferably ranges from 10 μm to 200 μm, inclusive from the view point of ensuring the bonding strength, and when the other member has the sealing performance, the average thickness of the soft resin layer more preferably ranges from 20 μm to 100 μm, inclusive, from the view point of making a sufficiently sealed organic EL device while ensuring sufficient bonding strength.

In a preferred aspect, the soft resin layer has a Shore hardness conforming to JIS K 6253 ranging from A30 to A70, inclusive.

According to the present aspect, the soft resin layer serving as the buffer layer has a Shore hardness conforming to JIS K 6253 ranging from A30 to A70, inclusive. When the Shore hardness of the soft resin layer is larger than A70, the rigidity of the soft resin layer is too large to sufficiently absorb the expansion or impact.

In the case of placing other member on the soft resin layer, if the Shore hardness of the soft resin layer is smaller than A30, the rigidity of the soft resin layer can be too small to keep the shape depending on the weight of the other member.

In a preferred aspect, the soft resin layer has a bending modulus of elasticity ranging from 3 MPa to 30 MPa, inclusive.

In a preferred aspect, a hard resin layer that is harder than the soft resin layer is stacked to cover edges of the soft resin layer.

According to the present aspect, it is possible to prevent invasion of water into interlayer spaces of the laminate while fixing the soft resin layer with the hard resin layer.

In a preferred aspect, the organic EL device has a hard resin layer that is harder than the soft resin layer, and the hard resin layer covers the whole surface on the outside of the soft resin layer on the basis of the base member.

In a preferred aspect, the organic EL device has a hard resin layer that is harder than the soft resin layer, a sealing member is placed on a projection plane in a thickness direction of the soft resin layer, and the hard resin layer relatively bonds and integrates the sealing layer and the sealing member.

The expression "relatively bond the sealing layer and the sealing member" used herein refers to bonding the sealing layer and the sealing member directly or indirectly.

According to the present aspect, since the sealing member is attached, the sealing performance is high. Also, since the hard resin layer has the bonding function in addition to the sealing function, the sealing member is easy to be attached.

In a further recommended aspect, the soft resin layer is in the shape of a sheet and has an adhesive property, and relatively integrates the sealing layer and the sealing member.

According to the present aspect, since the soft resin layer serving as the buffer layer has adhesive function in addition to the buffering function, the sealing member is easy to be attached.

In a preferred aspect, the hard resin layer has a Shore hardness conforming to JIS K 6253 ranging from D30 to D95, inclusive.

With this range, the organic EL device having high impact resistance and high reliability is obtained.

In a preferred aspect, the sealing layer is formed by stacking one or a plurality of layers, and at least one layer is formed of a silicon alloy composed of at least one element selected from the group consisting of oxygen, carbon and nitrogen, and silicon element.

In a preferred aspect, the soft resin layer is formed of at least one selected from the group consisting of acryl rubber resins, ethylene propylene rubber resins, silicone rubber resins and butyl rubber resins.

According to the present aspect, the soft resin layer can have a certain water vapor barrier property although it is formed of a material that is available at a relatively low price.

In a preferred aspect, the hard wall part is part or the whole of a hard resin layer that is harder than the soft resin layer, and is formed of a hard adhesive material having a thermosetting property.

According to the present aspect, since the hard wall part is part or the whole of the hard resin layer, and the sealing layer and the sealing member can be integrated by the hard wall part, it is easy to be manufactured.

In a preferred aspect, there is an area where the soft resin layer and the hard resin layer overlap with each other.

According to the present aspect, there is an area where the soft resin layer and the hard resin layer overlap with each other. That is, one of the soft resin layer and the hard resin layer covers the other. In other words, the soft resin layer and the hard resin layer are mutually tangled in the plane direction. Therefore, in the stacking direction, water hardly invades into the laminate in the emission area, and more secure sealing is achieved.

In a preferred aspect, the hard resin layer overlaps with the soft resin layer, and extends toward the center of the emission area.

According to the present aspect, the hard resin layer overlaps with the soft resin layer, and extends toward the center (inward) of the emission area. That is, the hard resin layer covers the soft resin layer toward the center of the emission area in the plane direction of the base member. Therefore, even if the invading water transfers along the interface between the sealing member and the hard resin layer, the overlapped region can block out the moisture invasion into the side of the soft resin layer, so that invasion of moisture into the emission area can be prevented. Further, since the distance from the end part of the sealing member to the boundary region between the hard resin layer and the soft resin layer can be made larger than in the case where they are not overlapped, the laminate of the emission area can be sealed more securely.

In a preferred aspect, an overlapping width of the soft resin layer and the hard resin layer ranges from 0.05 mm to 2 mm, inclusive.

In a preferred aspect, the soft resin layer is formed of a sheet-like soft adhesive, and the hard resin layer is formed by hardening a hard adhesive having fluidity.

According to the present aspect, since the soft resin layer is formed of the sheet-like soft adhesive, the sheet-like form is kept at the time of bonding, and thus uneven bonding hardly occurs. Also, since the hard resin layer is formed of the hard adhesive having fluidity, it is easy to surround the area outside the soft resin layer with the hard resin layer, and a gap is hardly formed by the osmotic pressure.

In a preferred aspect, the conductive base member is bonded by the soft resin layer.

In a preferred aspect, a hard wall part is formed along edges of the base member.

According to the present aspect, since the rigidity of the edge of the base member is improved, it is easy to keep the shape of the base member even if the base member has flexibility.

In a preferred aspect, the feeding member is arranged to stretch from the feeding area to the emission area.

According to the present aspect, since the feeding member is arranged to stretch from the feeding area to the emission area, it is possible to decrease the area of the feeding area. In other words, it is possible to increase the proportion of the emission area on the base member. That is, according to the present aspect, it is possible to provide an organic EL device having a narrow frame.

In a preferred aspect, the hard wall part is a hard resin layer formed of a hard resin having an insulating property, and covers part of the conductive base member.

According to the present aspect, the hard wall part covers part of the conductive base member. That is, the conductive base member and the laminate are integrated by the hard wall part. Therefore, the position of the conductive base member can be fixed to a desired position.

In a preferred aspect, the feeding member is a bonding wire.

In a preferred aspect, the feeding member is wholly embedded in the hard wall part.

According to the present aspect, it is possible to reinforce the strength of the feeding member by the rigidity of the hard wall part. Also, noises hardly occur.

Based on the aforementioned hypothesis, the present inventors also devised a structure that the emission area that actually emits light and generates heat is not pressed from the outside. That is, the inventors experimentally manufactured a structure in which a space is formed above the laminate in the emission area by forming an epoxy resin layer in the area other than the emission area that actually emits light, and supporting the back sheet with the epoxy resin layer.

The experimentally manufactured organic EL device has such a structure that the sealing property is ensured by attaching the back sheet on the laminate in the emission area, and expansion of the laminate in the emission area is received by the space, thereby alleviating the stress received from the silicon alloy layer.

As a result, reduction in the number of generated dark spots, and significant decrease in the growth exceeding expectations were observed. Also it was found that the organic EL device in which the area other than the emission area is solidified by the epoxy resin hardly causes unlit.

One aspect of the present invention based on these findings is an organic EL device having a sectional structure including a laminate having a first electrode layer, an organic light emitting layer and a second electrode layer on a base member, a sealing layer that seals the whole or part of the laminate, and a separately formed sealing member placed on the sealing layer, in which an emission area that actually emits light exists when the base member is planarly viewed, wherein the organic EL device has a hard wall part that surrounds an area including the emission area, and has such a structure that the sealing member is supported by the hard wall part.

According to the present aspect, the hard wall part surrounding the area including the emission area is provided. That is, the hard wall part is located in the area other than the emission area, and the hard wall part is not provided at least in the emission area. In this way, sealing of the laminate in the emission area is ensured by attaching the sealing member, and for the expansion or the like of the laminate in the emission area, the hard wall part supports the sealing member while keeping the distance between the sealing layer and the sealing member constant. For this reason, the sealing layer in the emission area is not pushed by the sealing member. Further, since the sealing member is supported at a predetermined interval by the rigidity of the hard wall part, it is possible to prevent an external pressure from being applied to the emission area from the outside of the sealing member. Further, since the hard wall part functions as a barrier for the emission area, invasion of moisture into the organic EL element can also be prevented.

In a preferred aspect, a hermetically sealed space is formed in the emission area between the sealing layer and the sealing member, and the space is filled with an inert gas.

The "inert gas" used herein refers to gas having no or very low reactivity, and for example, argon gas, helium gas, nitrogen gas and the like can be used.

Here, the term "filled" used herein refers to the condition that more than or equal to 90% of the space is occupied. Preferably, the condition that more than or equal to 95% of the space is occupied, and particularly preferably, more than or equal to 99% of the space is occupied.

According to the present aspect, the hermetically sealed space is formed on the projection plane in the emission area between the sealing layer and the sealing member, and the space is filled with the inert gas. That is, since the outside of the sealing layer is filled with the inert gas, the sealing layer would not be exposed to the air. Therefore, in the organic EL device of the present invention, a dark spot is unlikely to be generated.

Further, since the filled the inert gas functions as a cushion, even when a short circuit occurs inside the laminate caused by an external factor or the like, and the short circuit part expands or breaks to be scattered, the impact can be absorbed by the inert gas in the space. Therefore, pushing back of the sealing layer due to the internal pressure of the space hardly occurs, and the laminate will not be pressed. Therefore, it is possible to prevent occurrence of the sequential short circuit caused in such a way that the first electrode layer and the second electrode layer come closer to each other by pushing back. Therefore, the organic EL device of the present aspect has high durability and high reliability. Also, the organic EL device of the present aspect hardly causes unlit.

One aspect of the present invention is an organic EL device having a sectional structure including a laminate having a first electrode layer, an organic light emitting layer and a second electrode layer in sequence on a base member, a sealing member separately formed outside the laminate when viewed from the side of the base member, in which an emission area that actually emits light exists when the base member is planarly viewed, wherein a soft resin layer is stacked on a projection plane in a lamination direction of the laminate constituting the emission area, an area outside the soft resin layer is surrounded by a hard resin layer when the base member is planarly viewed, and the sealing member is bonded by the soft resin layer and the hard resin layer.

According to the present aspect, the soft resin layer is further stacked on the projection plane in the stacking direction of the laminate constituting the emission area, the hard resin layer surrounds the area outside the soft resin layer when the base member is planarly viewed, and the sealing member is bonded by the soft resin layer and the hard resin layer. That is, in the emission area, the sealing member is bonded by the soft resin layer, and in the periphery thereof, the sealing member is bonded by the hard resin layer. In brief, the sealing member is bonded by two kinds of resin layer. Therefore, it is possible to alleviate the stress caused by the soft resin layer as described above while securing the bonding area. For this reason, the sealing performance is high, and unlit hardly occurs. Since the soft resin layer can absorb the stress caused by thermal expansion of the laminate, the thermal shock resistance is high, and a crack hardly occurs.

One aspect of the present invention is an organic EL device having a sectional structure including a laminate having a first electrode layer, an organic light emitting layer and a second electrode layer in sequence on a base member, in which an emission area that actually emits light and a feeding area to which a feeding member is connected exist when the base member is planarly viewed, wherein the organic EL device has a hard wall part surrounding an area including the emission area, and at least part of the feeding member is embedded in the hard wall part, electricity is fed to the feeding area from outside via the embedded feeding member, the organic EL device further has a conductive base member having electric conductivity on the second electrode layer, and the conductive base member and the feeding area are electrically connected with each other via the feeding member, and in the emission area, electricity is fed from the outside via the conductive base member.

According to the present aspect, at least part of the feeding member is embedded in the hard wall part, and electricity is fed from the outside to the feeding area via the embedded feeding member. That is, part of the feeding member is covered with the hard wall part, and functions as a pseudo potting sealing. Therefore, noises hardly occur at the time of electricity feeding. Also, even when the feeding member is made of a wire or a foil which is low in strength, for example, wire breakage or damage due to an external factor hardly occurs because the strength of the part of the feeding member is reinforced by the hard wall part. Further, in the case of the metallic feeding member, for example, oxidation of the surface can be prevented.

According to the present aspect, the conductive base member having electric conductivity and the feeding area are electrically connected with each other on the second electrode layer via the feeding member, and electricity is fed from the outside via the conductive base member in the emission area when planarly viewed. That is, since the conductive base member is provided in the position opposite to the light extraction side of the emission area, it hardly interferes with the electricity feeding, and gives good appearance. Also, it is possible to secure the installation area for the conductive base member. Further, it is possible to reduce the area of the feeding area, and at the same time, it is possible to increase the area for emitting light.

One aspect of the present invention is an organic EL device having a sectional structure including an organic EL element, an inorganic sealing layer, and a sealing member stacked on a transparent insulating substrate, in which an emission area that actually emits light and a feeding area to which a feeding member is connected exist when the transparent insulating substrate is planarly viewed, wherein the organic EL element is formed by sandwiching an organic light emitting layer between a transparent conductive oxide layer and a back side electrode layer, the inorganic sealing layer seals the whole or part of the organic EL element, and includes a layer formed of a silicon alloy composed of at least one element selected from the group consisting of oxygen, carbon and nitrogen, and silicon element, the sealing member is formed separately from the inorganic sealing layer, a soft resin layer having flexibility is stacked on the inorganic sealing layer in the emission area, a hard resin layer harder than the soft resin layer surrounds the soft resin layer along edges of the soft resin layer, the hard resin layer covers part of the soft resin layer over the circumference, the sealing member is integrated by the soft resin layer and the hard resin layer, and in the feeding area, part or the whole of the feeding member is embedded in the hard resin layer.

According to the present aspect, it is possible to prevent invasion of moisture into the laminate, and it is possible to prevent occurrence of malfunction such as unlit due to short circuit.

In a preferred aspect, the sealing member is a conductive base member having a multi-layer structure, and at least includes at least one sealing sheet and at least one conductive film stacked in the thickness direction, and the feeding member is a bonding wire, and is electrically connectable with an external power source via the conductive film.

According to the present aspect, it is possible to easily feed electricity to the laminate in the emission area from the outside.

One aspect of the present invention is a method for manufacturing an organic EL device having a sectional structure including a laminate having a first electrode layer, an organic light emitting layer and a second electrode layer on a base member, a sealing layer that seals the whole or part of the laminate, and a separately formed sealing member placed on the sealing layer, in which an emission area that actually emits light exists when the base member is planarly viewed, the method comprising: a laminate forming step of forming the laminate; a sealing layer forming step of forming the sealing layer; and a sealing member bonding step of bonding the sealing member to the sealing layer via a hard wall part, wherein in the sealing member bonding step, an adhesive is applied to surround an area including the emission area, and the adhesive is solidified to form the hard wall part.

According to the present aspect, it is possible to readily form the hard wall part, so that production is facilitated.

One aspect of the present invention is a method for manufacturing an organic EL device having a sectional structure including a laminate having a first electrode layer, an organic light emitting layer and a second electrode layer in sequence on a base member, and a sealing member separately formed and placed on the laminate, in which an emission area that actually emits light exists when the base member is planarly viewed, the method being a method for manufacturing an organic EL device in which a soft resin layer is stacked on a projection plane in a lamination direction of the laminate constituting the emission area, an area outside the soft resin layer is surrounded by a hard resin layer when the base member is planarly viewed, and the sealing member is bonded by the soft resin layer and the hard resin layer, the method comprising: a laminate forming step of forming the laminate; and a sealing member bonding step of bonding the sealing member, wherein in the sealing member bonding step, a soft resin layer forming step of forming the soft resin layer and a hard resin layer forming step of forming the hard resin layer are conducted in this sequence, in the hard resin layer forming step, a hard adhesive having fluidity is applied to part of the soft resin layer, and the hard resin layer is formed by solidification of the adhesive.

According to the present aspect, since the hard adhesive having fluidity is applied to part of the soft resin layer, and the hard resin layer is formed by solidification of the adhesive, production is facilitated.

Effect of Invention

According to the organic EL device of the present invention, it is possible to prevent invasion of moisture into the laminate.

According to the method for manufacturing an organic EL device of the present invention, production is facilitated.

BRIEF DESCRIPTION OF DRAWINGS

FIG. 4 is a sectional view in each position of the organic EL device in FIG. 1.

FIGS. 24A and 24B are explanatory views of the organic EL device in FIG. 20, in which FIG. 20A is a plan view seen from the side of a conductive base member, and FIG. 20B is a plan view seen from the side of a transparent substrate. For ease of understanding, the hard adhesion layer is omitted.

FIGS. 31A and 31B are explanatory views of a NDS, in which FIG. 31A is a photomicrograph of a NDS, and FIG. 31B is a sketch of FIG. 31A.

FIGS. 32A and 32B are explanatory views of a BDS, in which FIG. 32A is a photomicrograph of a BDS, and FIG. 32B is a sketch of FIG. 32A.

FIGS. 33A to 33C are explanatory views of the case where the organic EL element of the experimentally manufactured organic EL device scatters, in which FIG. 33A illustrates the condition before scattering of the organic EL element, FIG. 33B illustrates the condition at the instant of scattering of the organic EL element, and FIG. 33C illustrates the condition after scattering of the organic EL element.

MODES FOR CARRYING OUT INVENTION

The present invention relates to an organic EL device and a method for manufacturing the same.

Figure 1:
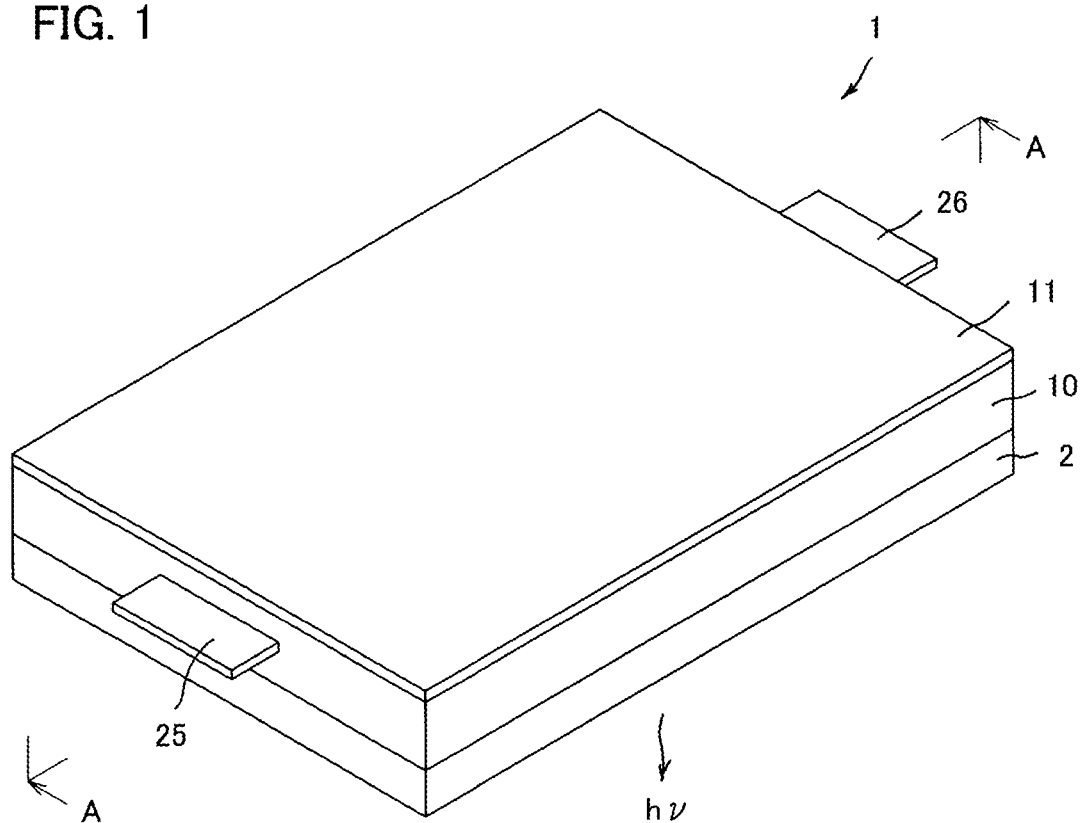
FIG. 1 is a perspective view schematically illustrating an organic EL device according to the first embodiment of the present invention when the organic EL device is viewed from the back side.

FIG. 1 illustrates an organic EL device 1 according to a first embodiment of the present invention. Unless otherwise noted, a positional relationship of up-and-down direction is described based on a posture in FIG. 1. That is, a light extracting side during drive of the organic EL device 1 becomes downside.

Figure 2:
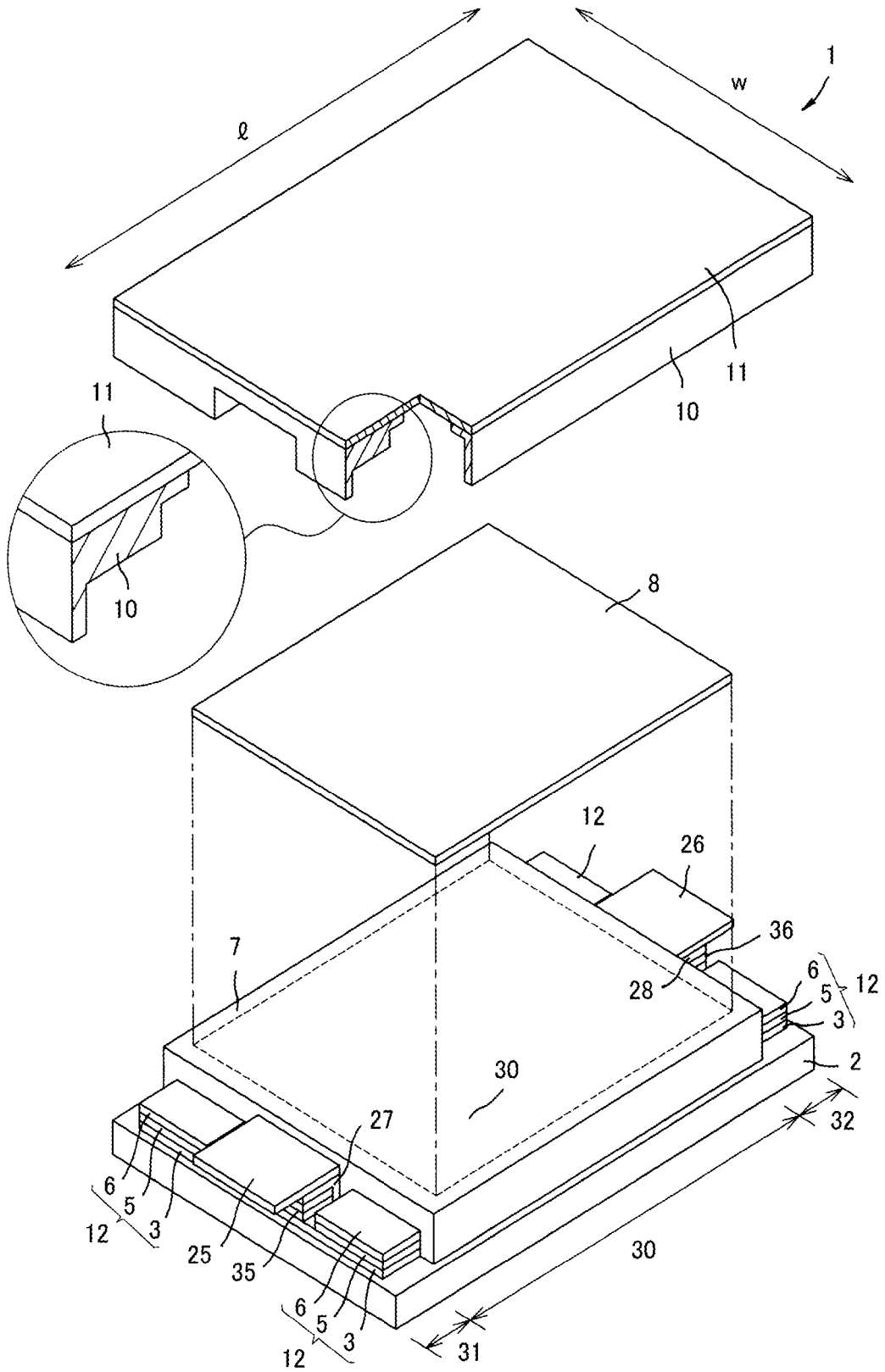
FIG. 2 is an exploded perspective view of the organic EL device in FIG. 1.

As illustrated in FIG. 2, in the organic EL device 1 of the first embodiment, an organic EL element 12 (laminate) is stacked on a transparent substrate 2 (substrate, base member) having translucency. The organic EL device 1 further includes on the organic EL element 12, an inorganic sealing layer 7 (sealing layer), a soft adhesion layer 8 (buffer layer, soft resin layer, soft adhesive), a hard adhesion layer 10 (hard resin layer, hard wall part, hard adhesive), and a moisture-proof member 11 (sealing member). The organic EL element 12 is made up of a first electrode layer 3 (transparent electrode layer, transparent conductive oxide layer), a functional layer 5 (organic light emitting layer), and a second electrode layer 6 (back side electrode layer).

In the organic EL device 1 of the first embodiment, generation of a dark spot and occurrence of light emission disabled state (unlit) are prevented by stacking the soft adhesion layer 8 on the inorganic sealing layer 7.

Further, in the organic EL device 1 of the first embodiment, the hard adhesion layer 10 surrounds the area of the organic EL element 12 other than an emission area 30 that mainly generates heat during operation. In the organic EL device 1, by attaching the moisture-proof member 11 thereon, pressure on the emission area 30 is prevented, and generation of a dark spot and occurrence of light emission disabled state (unlit) are prevented.

Further, in the organic EL device 1 of the first embodiment, the inorganic sealing layer 7 and the moisture-proof member 11 are bonded by means of the soft adhesion layer 8 and the hard adhesion layer 10 and the hard adhesion layer 10 overlaps on the soft adhesion layer 8, so that generation of a dark spot and occurrence of light emission disabled state (unlit) are prevented.

On the basis of the above, a specific structure of the organic EL device 1 of the first embodiment will be described below.

Figure 3:
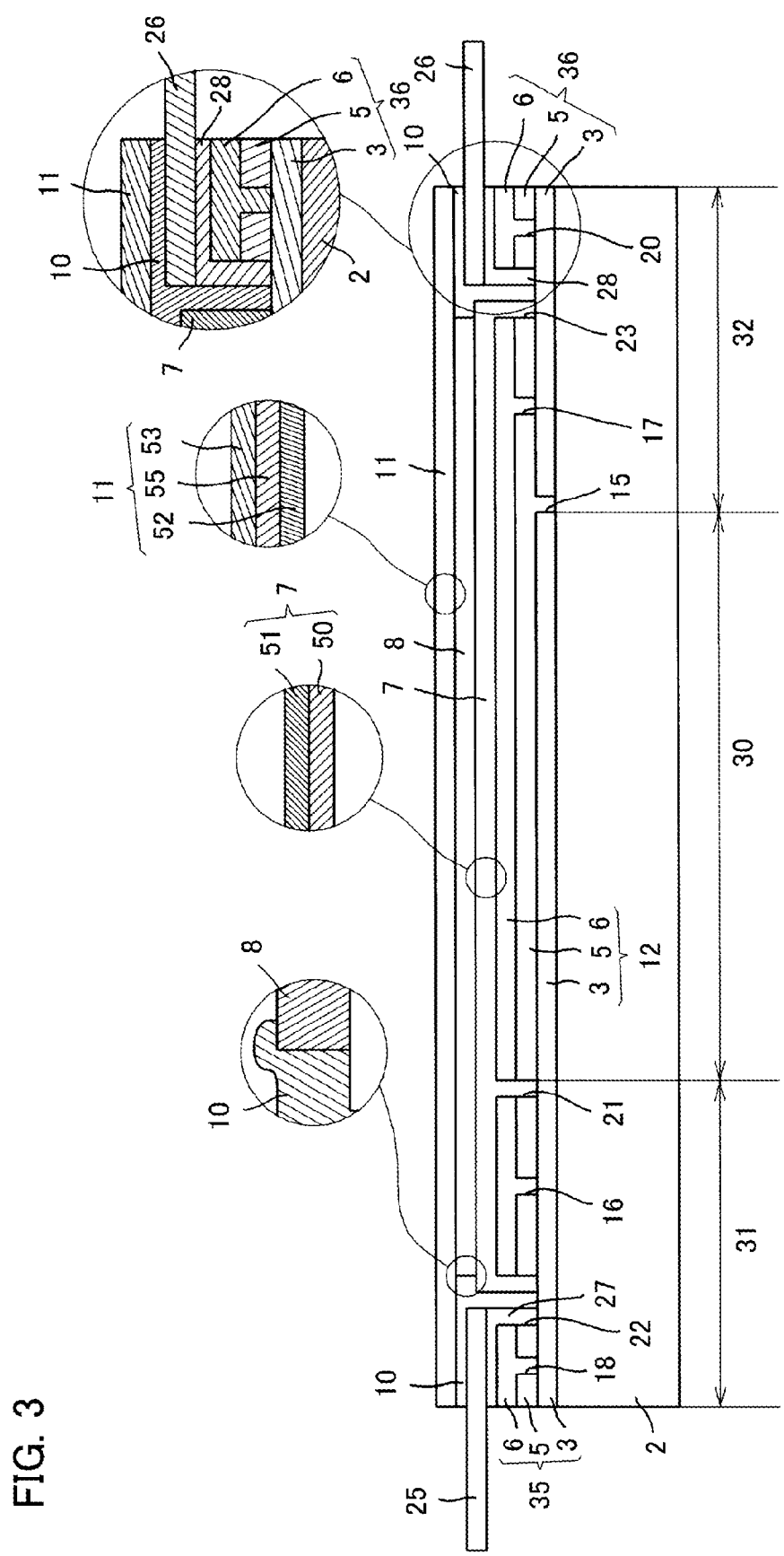
FIG. 3 is a sectional view taken on a line A-A of the organic EL device in FIG. 1, and hatching is omitted for the purpose of easy understanding.

As illustrated in FIG. 2 and FIG. 3, when the transparent substrate 2 is planarly viewed, the organic EL device 1 has the emission area 30 that actually emits light during operation, and feeding areas 31, 32 that feed electricity to the organic EL element 12 in the emission area 30. As illustrated in FIG. 3, the emission area 30 is a region where the first electrode layer 3, the functional layer 5, and the second electrode layer 6 are overlapped with each other.

Figure 5:
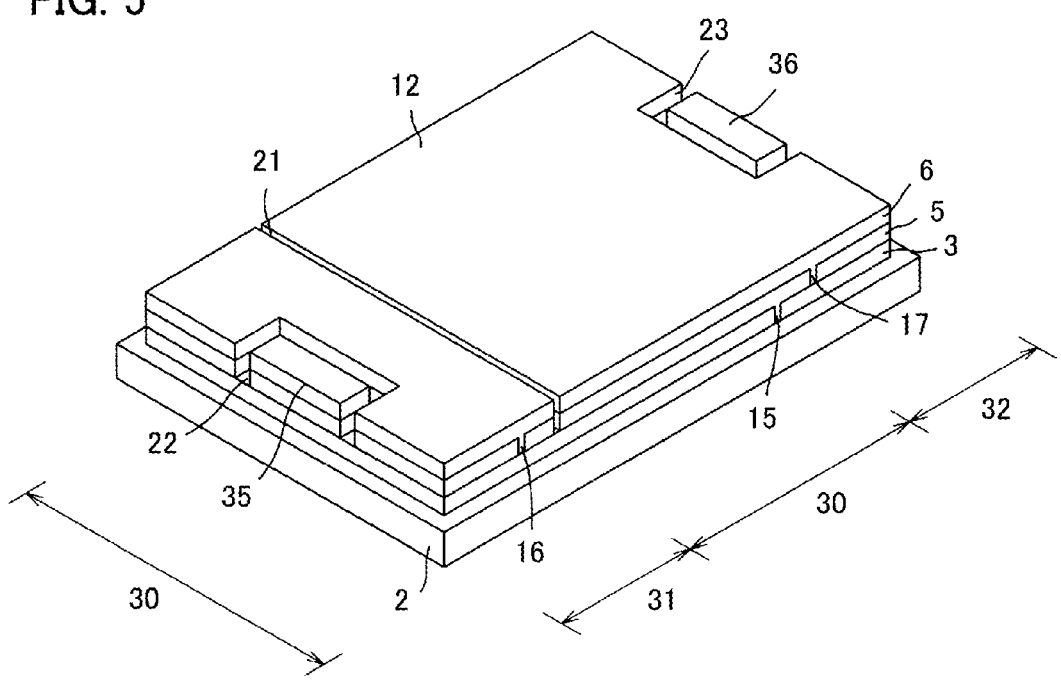
FIG. 5 is a perspective view schematically illustrating a transparent substrate and the organic EL element in FIG. 3.

As illustrated FIG. 2 and FIG. 5, the emission area 30 is located in the center in a length direction l (longitudinal direction) and a width direction w (short direction) (a direction orthogonal to the length direction l), and the feeding areas 31, 32 are located on respective outer sides in the length direction l.

In the center of the width direction w (a direction orthogonal to the longitudinal direction l), the feeding areas 31, 32 have island-like extraction parts 35, 36, respectively, as illustrated in FIG. 5. The extraction parts 35, 36 have rectangular shapes when they are planarly viewed, and are formed along short sides (sides extending in the short direction w) of the transparent substrate 2.

As illustrated in FIG. 2 and FIG. 3, the extraction parts 35, 36 are bonded with electrode members 25, 26 by conductive adhesion members 27, 28, respectively.

As illustrated in FIG. 2, the soft adhesion layer 8 is stacked on the inorganic sealing layer 7 in such a manner that it covers at least the entire projection plane in the member thickness direction (thickness direction) of the emission area 30. In other words, as illustrated in FIG. 3, the soft adhesion layer 8 extends beyond an organic EL element separation groove 21 and a first electrode layer separation groove 15 described later, and preferably extends beyond electrode connection grooves 16, 17, and particularly preferably covers the vicinities of extraction electrode separation grooves 22, 23.

The soft adhesion layer 8 covers the most part of the inorganic sealing layer 7 with a planar expanse. As illustrated in FIG. 2, FIG. 3, and FIG. 4, edges of the soft adhesion layer 8 are preferably covered with part of the hard adhesion layer 10 in the shape of eaves. In other words, the hard adhesion layer 10 preferably covers to extend from the inorganic sealing layer 7 to the soft adhesion layer 8. Preferably, the hard adhesion layer 10 extends inward (the side of the emission area 30) to a predetermined range from four edges of the soft adhesion layer 8.

In this case, edges of the soft adhesion layer 8 are pushed by the hard adhesion layer 10 while the soft adhesion layer 8 keeps the buffering function according to the present invention, so that the organic EL device has higher reliability while achieving the effect of the present invention.

Figure 14:
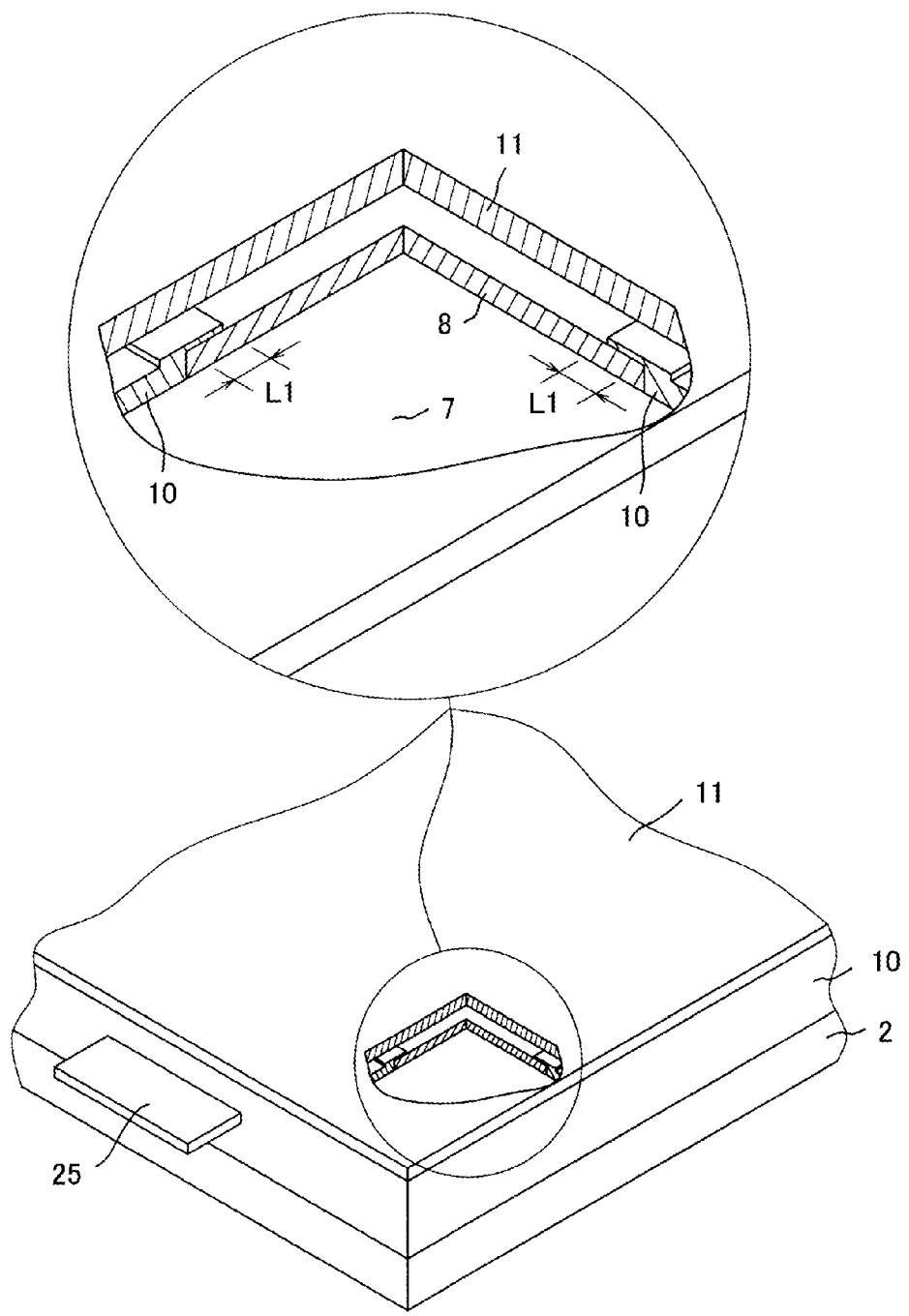
FIG. 14 is a partially broken perspective view of the organic EL device in FIG. 1.

A coverage length (overlapping width) L1 of the hard adhesion layer 10 from the four edges of the soft adhesion layer 8 as illustrated in FIG. 14 preferably ranges from −1 mm to 10 mm, inclusive, including the case where the region in the shape of eaves is not provided (no overlapping width), from the view point of reducing the area of a non-light-emitting frame region (the region other than the emission area 30) to increase the area of the emission area 30. From the view point of providing an organic EL device having high reliability, the length ranges more preferably from 0 mm to 5 mm, inclusive, further preferably from 0.05 mm to 2 mm, inclusive, particularly preferably from 0.1 mm to 1 mm, inclusive, and most preferably from 0.2 mm to 0.5 mm, inclusive.

The hard adhesion layer 10 supports the moisture-proof member 11 so that the moisture-proof member 11 would not come close to the side of the organic EL element 12. In other words, the hard adhesion layer 10 forms a wall (hard wall part) that surrounds the area including the emission area 30.

Also, on the projection plane of the organic EL element 12 in the emission area 30, a hermetically sealed space is formed by the inorganic sealing layer 7, the moisture-proof member 11 and the hard adhesion layer 10, and the soft adhesion layer 8 is located inside the space. In other words, the hermetically sealed space is filled with the soft adhesion layer 8.

The term "filled" used herein refers to the condition that more than or equal to 90% of the space is occupied. Preferably, more than or equal to 95% of the space is occupied, and particularly preferably, more than or equal to 99% of the space is occupied.

In the present embodiment, since the soft adhesion layer 8 in the shape of a sheet is formed, and its periphery is covered with the hard adhesion layer 10, the filling factor is approximately 100%.

Further, as illustrated in FIG. 4, the hard adhesion layer 10 covers part of the electrode members 25, 26. Specifically, the hard adhesion layer 10 covers the electrode members 25, 26 exclusive of projecting regions from the transparent substrate 2 of the electrode members 25, 26. In other words, as illustrated in FIG. 1, in the organic EL device 1, the electrode members 25, 26 are partially exposed from the hard adhesion layer 10.

The organic EL device 1 of the present embodiment is separated into a plurality of segments by a plurality of grooves having different depths.

Specifically, as illustrated in FIG. 3, the organic EL device 1 includes the first electrode layer separation groove 15 where the first electrode layer 3 is partially removed, the electrode connection grooves 16, 17 and extraction electrode fixing grooves 18, 20 where the functional layer 5 is partially removed, and the organic EL element separation groove 21 and the extraction electrode separation grooves 22, 23 where both of the functional layer 5 and the second electrode layer 6 are partially removed, and is separated into a plurality of segments by these grooves.

Figure 6:
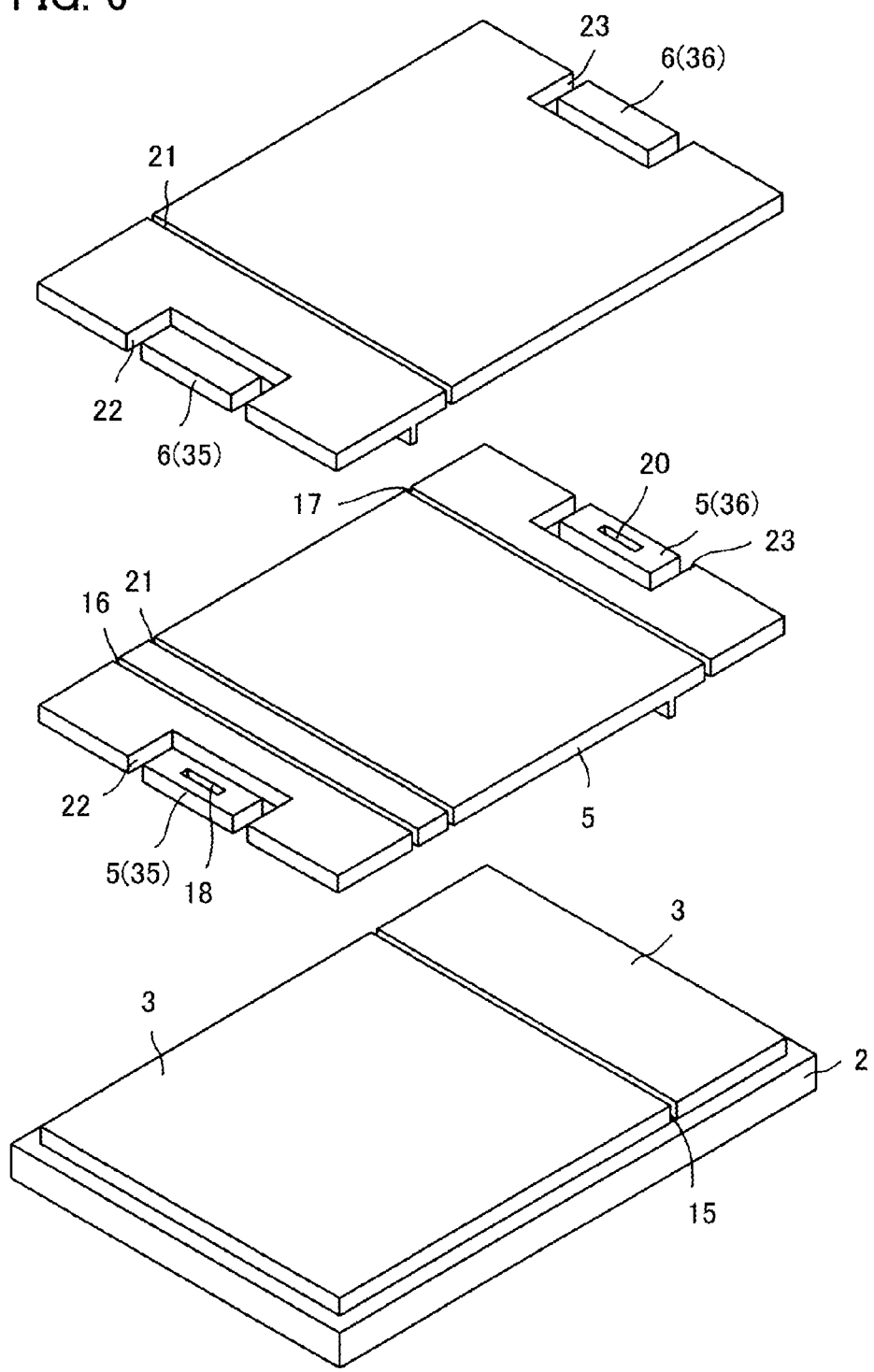
FIG. 6 is an exploded perspective view of the transparent substrate and the organic EL element in FIG. 5.

Each groove will be described in detail. As illustrated in FIG. 3 and FIG. 6, the first electrode layer separation groove 15 separates the first electrode layer 3 stacked on the transparent substrate 2 into two areas and separates the organic EL element 12 into the emission area 30 and the feeding area 32 (on the side of the electrode member 26).

As illustrated in FIG. 3 and FIG. 6, the functional layer 5 proceeds partially in the first electrode layer separation groove 15, and the functional layer 5 is in direct contact with the transparent substrate 2 in a bottom of the first electrode layer separation groove 15. That is, the first electrode layer 3 in the emission area 30 is electrically separated from the first electrode layer 3 in the feeding area 32 in the planar direction by the functional layer 5 having the insulating property.

As illustrated in FIG. 3 and FIG. 6, the electrode connection grooves 16, 17 separate only the functional layer 5 stacked on the first electrode layer 3 into three areas, and are located in the feeding areas 31, 32.

That is, the electrode connection groove 16 is located on the outer side in the longitudinal direction of the organic EL element separation groove 21 in the feeding area 31. The electrode connection groove 17 is located on the outer side in the longitudinal direction of the first electrode layer separation groove 15 in the feeding area 32.

As illustrated in FIG. 3 and FIG. 6, the extraction electrode fixing grooves 18, 20 are provided only in the functional layer 5 of the extraction parts 35, 36 on the outer sides of the extraction electrode separation grooves 22, 23, respectively. As illustrated in FIG. 6, the extraction electrode fixing grooves 18, 20 are provided in the center of the longitudinal direction of the extraction parts 35, 36, respectively, and extend in the short direction.

Specifically, as illustrated in FIG. 6, the extraction electrode fixing grooves 18, 20 are formed in such a manner that their peripheries are surrounded by the extraction electrode separation grooves 22, 23, respectively, and that they divide the extraction parts 35, 36 into two halves in the longitudinal direction.

As illustrated in FIG. 3, the second electrode layer 6 partially proceeds both in the electrode connection grooves 16, 17 and in the extraction electrode fixing grooves 18, 20, and the second electrode layer 6 is in direct contact with the transparent substrate 2 in bottoms of the electrode connection grooves 16, 17 and the extraction electrode fixing grooves 18, 20.

That is, in the feeding areas 31, 32, the first electrode layer 3 and the second electrode layer 6 are electrically connected with each other via the interiors of the electrode connection grooves 16, 17 and the extraction electrode fixing grooves 18, 20.

As illustrated in FIG. 3 and FIG. 6, the organic EL element separation groove 21 separates over both of the functional layer 5 and the second electrode layer 6 stacked on the first electrode layer 3. The organic EL element separation groove 21 separates the organic EL element 12 into the emission area 30 and the feeding area 31.

As illustrated in FIG. 3 and FIG. 5, the extraction electrode separation grooves 22, 23 isolate the functional layer 5 and the second electrode layer 6 stacked on the first electrode layer 3 to form the extraction parts 35, 36 having island-like contours.

Specifically, the extraction electrode separation grooves 22, 23 have rectangular "U" shapes in a planar view, and the extraction electrode fixing grooves 18, 20 are located inside the same, respectively. That is, each of the extraction electrode separation grooves 22, 23 is made up of a region parallel with a short side of the transparent substrate 2, and a region orthogonal to the same (parallel with a long side).

As illustrated in FIG. 3, inorganic sealing layer 7 having the insulating property partially proceeds in the organic EL element separation groove 21 and the extraction electrode separation grooves 22, 23, and the inorganic sealing layer 7 is in direct contact with the first electrode layer 3 in bottoms of the organic EL element separation groove 21 and the extraction electrode separation grooves 22, 23. That is, the second electrode layer 6 in the emission area 30 is electrically separated from the second electrode layer 6 in the feeding area 31 by the inorganic sealing layer 7.

In the feeding area 31, the second electrode layer 6 of the extraction part 35 is electrically separated from the remaining region of the second electrode layer 6 by the inorganic sealing layer 7. Also in the feeding area 32, the second electrode layer 6 of the extraction part 36 is electrically separated from the remaining region of the second electrode layer 6 by the inorganic sealing layer 7.

A configuration of each layer of the organic EL device 1 will be described below.

As described above, in the organic EL device 1, as illustrated in FIG. 3, the first electrode layer 3, the functional layer 5, and the second electrode layer 6 are stacked on the transparent substrate 2 in this sequence, and the inorganic sealing layer 7, the soft adhesion layer 8 and/or the hard adhesion layer 10, and the moisture-proof member 11 are sequentially stacked thereon. As illustrated in FIG. 3 and FIG. 4, the electrode members 25, 26 are fixed to the extraction parts 35, 36 via the adhesion members 27, 28, respectively.

The transparent substrate 2 is a transparent insulating substrate having the translucency and the insulating property. A material for the transparent substrate 2 is not particularly limited as far as it has the translucency and the insulating property, and is properly selected, for example, from flexible film substrates and plastic substrates. Particularly, a glass substrate or a transparent film substrate is suitably used from the viewpoint of transparency or workability.

The transparent substrate 2 has a planar expanse. Specifically, the transparent substrate 2 has a polygonal or a circular shape, and preferably has a quadrangular shape. In the present embodiment, a rectangular glass substrate is used.

A material for the first electrode layer 3 is not particularly limited as far as it is transparent and conductive. For example, a transparent conductive oxide such as indium tin oxide (ITO), indium zinc oxide (IZO), tin oxide ($SnO_2$), or zinc oxide (ZnO) is used. ITO or IZO having high transparency is particularly preferred from the view point of effectively taking out the light generated from the light emitting layer of the functional layer 5. In the present embodiment, ITO is used.

The functional layer 5 is provided between the first electrode layer 3 and the second electrode layer 6 and includes at least one light emitting layer. The functional layer 5 is made up of a plurality of layers mainly made of an organic compound. The functional layer 5 can be formed by a well-known material, such as a low-molecular dye material or a conjugated high-molecular material, which is used in a general organic EL device. The functional layer 5 may have a stacked multi-layer structure including plural layers such as a hole-injection layer, a hole-transport layer, the light emitting layer, an electron-transport layer, and an electron-injection layer.

Figure 12:
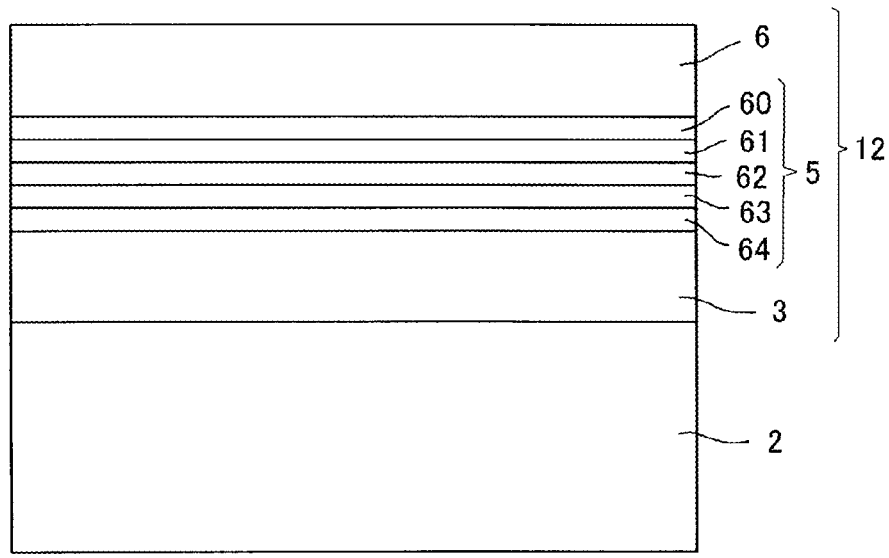
FIG. 12 is an explanatory view illustrating the transparent substrate and the organic EL element in FIG. 1.

In the present embodiment, as illustrated in FIG. 12, the functional layer 5 has such a structure that an electron-injection layer 60, an electron-transport layer 61, a light emitting layer 62, a hole-transport layer 63, and a hole-injection layer 64 are stacked in this sequence from the side of the second electrode layer 6 to the side of the first electrode layer 3. The electron-injection layer 60, the electron-transport layer 61, the light emitting layer 62, the hole-transport layer 63, and the hole-injection layer 64 are made of well-known materials.

These layers constituting the functional layer 5 can properly be deposited by well-known methods such as a vacuum evaporation method, a sputtering method, a CVD method, a dipping method, a roll coating method (printing method), a spin coating method, a bar coating method, a spray method, a die coating method, and a flow coating method.

A material for the second electrode layer 6 is not particularly limited as far as it has conductivity (electric conductivity), and, for example, metals such as silver (Ag) and aluminum (Al) can be cited. The second electrode layer 6 of the present embodiment is made of Al. Preferably the material for the second electrode layer 6 is deposited by the sputtering method or vacuum evaporation method.

The electric conductivity and heat conductivity of the second electrode layer 6 is larger than those of the first electrode layer 3. In other words, the second electrode layer 6 is larger than the first electrode layer 3 in electric conductivity and in heat conductivity.

A material for the inorganic sealing layer 7 is not particularly limited as far as it has the insulating property and the sealing property, and the inorganic sealing layer 7 is preferably formed of a silicon alloy made of at least one kind of element selected from oxygen, carbon and nitrogen, and silicon element, and particularly preferably a layer containing silicon nitride or silicon oxide containing bonds such as Si—O, Si—N, Si—H, and N—H and silicon oxynitride that is an intermediate solid solution of these.

The inorganic sealing layer 7 is preferably a layer in which compression stress occurs in the direction of departing from the organic EL element 12 under a certain condition.

The "certain condition" used herein refers to the case where the layer receives a pushing force resulting from thermal expansion of the organic EL element 12 or the like.

In the present embodiment, the inorganic sealing layer having a multi-layered structure is employed. Specifically, as illustrated in FIG. 3, the inorganic sealing layer 7 is formed by sequentially stacking a first inorganic sealing layer 50 formed by a dry process and a second inorganic sealing layer 51 formed by a wet process from the side of the organic EL element 12.

The first inorganic sealing layer 50 is deposited by chemical vapor deposition, more particularly deposited by a plasma CVD method with silane gas or ammonia gas as a raw material. As will be described later, the first inorganic sealing layer 50 can be deposited subsequent to a process of forming the organic EL element 12 in an atmosphere of a low moisture content in a process of manufacturing the organic EL device 1. Therefore, it can be formed without exposure to air or water vapor, and generation of an initial dark spot can be reduced immediately after the use.

The second inorganic sealing layer 51 is deposited through a chemical reaction after a liquid or gel raw material is applied. More particularly, dense silica is used as the raw material for the second inorganic sealing layer 51. Preferably polysilazane derivative is used as the raw material for the second inorganic sealing layer 51. In the case where the second inorganic sealing layer 51 is deposited through silica conversion using the polysilazane derivative, a weight increases during the silica conversion, and volume shrinkage decreases. There is also an advantage that a crack is hardly generated at temperatures that the resin can sufficiently withstand during the silica conversion (solidification).

As used herein, the polysilazane derivative means a polymer having a silicon-nitrogen bond, and means ceramic precursor polymers such as $SiO_2$ or $Si_3N_4$ containing Si—N, Si—H, and N—H and an intermediate solid solution $SiO_xN_y$. The polysilazane derivative also includes a derivative in which hydrogen bonded to Si is partially substituted with an alkyl group.

Among polysilazane derivatives, perhydropolysilazane in which a chemical side chain contains only hydrogen or a derivative in which hydrogen bonded to silicon is partially substituted with a methyl group is preferred.

Preferably the polysilazane derivative is applied and used in a solution state dissolved in an organic solvent. Examples of the solvent include hydrocarbon solvents such as aliphatic hydrocarbon solvents, alicyclic hydrocarbon solvents, and aromatic hydrocarbon solvents, halogenated hydrocarbon solvents, and ethers such as aliphatic ethers and alicyclic ethers.

The second inorganic sealing layer 51 can be densely formed compared with the first inorganic sealing layer 50. Therefore, the first inorganic sealing layer 50 and the second inorganic sealing layer 51 mutually complement the respective defects to achieve high sealing performance of the inorganic sealing layer 7. Therefore, the inorganic sealing layer 7 can prevent the generation of the new dark spot over time, and suppress the enlargement of the generated dark spot.

As to the position where the inorganic sealing layer 7 is deposited, as illustrated in FIG. 3, the inorganic sealing layer 7 is formed, in the length direction, to at least the outer sides of the electrode connection grooves 16, 17 in the longitudinal direction of the transparent substrate 2, and the position where the inorganic sealing layer 7 is formed in the present embodiment reaches the vicinities of the extraction electrode separation grooves 22, 23 as illustrated in FIG. 3 and FIG. 4. That is, the inorganic sealing layer 7 is deposited at least on the whole surface of the emission area 30, and further reaches part of the feeding areas 31, 32.

An average thickness of the inorganic sealing layer 7 is preferably ranges from 1 μm to 10 μm, inclusive, more preferably ranges from 2 μm to 5 μm, inclusive.

The thickness of the first inorganic sealing layer 50 constituting part of the inorganic sealing layer 7 preferably ranges from 1 μm to 5 μm, inclusive, more preferably ranges from 1 μm to 2 μm, inclusive.

The thickness of the second inorganic sealing layer 51 constituting part of the inorganic sealing layer 7 preferably ranges from 1 μm to 5 μm, inclusive, more preferably ranges from 1 μm to 3 μm, inclusive.

The soft adhesion layer 8 is a resin layer having flexibility which plastically deforms or elastically deforms under a certain condition. In the present embodiment, the soft adhesion layer 8 can plastically deform almost without resisting the stress when it receives a compression stress of the inorganic sealing layer 7 or the like.

A Shore hardness conforming to JIS K 6253 of the soft adhesion layer 8 ranges preferably from A30 to A70, inclusive, more preferably ranges from A40 to A65, inclusive, particularly preferably ranges from A45 to A63, inclusive.

When the Shore hardness of the soft adhesion layer 8 (buffer layer) is larger than A70, the rigidity of the soft adhesion layer 8 (buffer layer) is too large to sufficiently absorb the expansion or the impact. When the Shore hardness of the soft adhesion layer 8 is smaller than A30, for example, in employing a film or the like having low rigidity as the moisture-proof member 11, the shape of the moisture-proof member 11 cannot be kept.

From the same view point for the Shore hardness as described above, a bending modulus of elasticity of the soft adhesion layer 8 ranges preferably from 3 MPa to 30 MPa, inclusive, more preferably from 3 MPa to 25 MPa, inclusive, particularly preferably from 3.9 MPa to 23 MPa, inclusive.

Examples of a specific material used for the soft adhesion layer 8 include a rubber material such as acryl rubber (ACM), ethylene propylene rubber (EPM, EPDM), silicone rubber (Q), butyl rubber (IIR), styrene butadiene rubber (SBR), butadiene rubber (BR), fluorine rubber (FKM), nitrile rubber (NBR), isoprene rubber (IR), urethane rubber (U), chlorosulfonated polyethylene (CSM), epichlorohydrin rubber (CO, ECO), and chloroprene rubber (CR). The material for the soft adhesion layer 8 is preferably at least one selected from the group consisting of an acryl rubber-based resin, an ethylene propylene rubber-based resin, a silicone rubber-based resin and a butyl rubber-based resin in that they have a certain water vapor barrier property and are available at low costs, and among these, a butylene rubber-based resin which is easily available as a film is more preferred. For the soft adhesion layer 8 of the present embodiment, a butyl rubber-based resin sheet (for example, sheet made of polyisobutylene) is used.

The soft adhesion layer 8 of the present embodiment has the bonding property to allow mutual bonding of plural members. Specifically, the soft adhesion layer 8 of the present embodiment is a sheet-like or plate-like member having the surface treated to have stickiness.

An average thickness of soft adhesion layer 8 ranges preferably from 2 μm to 1000 μm, inclusive, more preferably from 10 μm to 200 μm, inclusive, further preferably from 20 μm to 100 μm, inclusive, from the view point of preventing the organic EL device from being unlit due to a local open defect (electrically open) by expansion of a part corresponding to a local short defect (electrically short) of the organic EL element 12, and the view point of taking advantage of the thinness of the organic EL device while ensuring sufficient absorption of an impact.

The hard adhesion layer 10 is made of a material having higher rigidity and higher hardness than the soft adhesion layer 8. Specifically, a Shore hardness conforming to JIS K 6253 (and an approximate estimate of bending modulus of elasticity corresponding thereto) of the hard adhesion layer 10 is preferably more than or equal to Shore A80, namely more than or equal to Shore D 30 (more than or equal to 25 MPa), and from the view point of providing an organic EL device having higher reliability, it ranges more preferably from Shore D 55 (250 MPa) to Shore D 95 (6000 MPa), inclusive, further preferably ranges from Shore D 80 (1500 MPa) to Shore D 90 (4000 MPa), inclusive.

The hard adhesion layer 10 of the present embodiment has the water-proofing property and the bonding property (stickiness) to allow mutual bonding of plural members. Specifically, the hard adhesion layer 10 of the present embodiment is formed by solidifying a fluid such as a solution or gel.

Examples of a specific material used for the hard adhesion layer 10 include an epoxy resin. In the present embodiment, an epoxy resin is used.

The moisture-proof member 11 is a plate-like or sheet-like sealing member having the moisture-proofing property.

A material for the moisture-proof member 11 is not particularly limited as far as it has the moisture-proofing property, and for example, a layer formed of an aluminum foil, a layer formed of polytetrafluoroethylene (PTFE), or a layer formed of $Si_aAl_bO_cN_d$ (sialon) can be used.

The moisture-proof member 11 may be made up of a plurality of layers. Specifically, as illustrated in FIG. 3, the moisture-proof member 11 may be made up of a metallic foil 55 (conductive film), and an insulating resin film 52 (sealing sheet) that coats at least the whole of one face of the metallic foil 55 on the side of the inorganic sealing layer 7 or an insulating resin film 53 (sealing sheet).

In the present embodiment, both faces of the metallic foil 55 are coated with the insulating resin films 52, 53.

The faces of the metallic foil 55 may be preliminarily laminated with the insulating resin films 52, 53.

An average thickness of the metallic foil 55 preferably ranges from 2 μm to 200 μm, inclusive, and the metallic foil 55 may be made up of a plurality of metallic foils by interposing a plurality of resin layers or the like as far as the total thickness falls within this range. For example, when the metallic foil 55 is formed by using a plurality of metallic foils, it is conceivable to use combination of a metallic foil having a thickness ranging from 2 μm to 20 μm, inclusive, and a metallic foil having a thickness ranging from 10 μm to 100

μm, inclusive. The total thickness ranges more preferably 5 μm to 100 μm, inclusive, further preferably 20 μm to 60 μm, inclusive.

A material for the metallic foil 55 is not particularly limited as far as it has the heat equalizing property, the heat dissipation property, and a water-vapor barrier property, and for example, copper, aluminum or stainless can be used, and among these, aluminum is preferred. Aluminum has corrosion resistance property, high heat-transfer function because of its high heat-transfer property, and high sealing property because of its low moisture permeability. Therefore, in the present embodiment, aluminum foil (milled aluminum) is used as the metallic foil 55.

While materials for the insulating resin films 52, 53 are not particularly limited as far as they have the insulating property, they are preferably any one of polyethylene terephthalate (PET), polyvinylidene chloride (PVDC) and polytetrafluoroethylene (PTFE) from the view point of high sealing property.

In the present embodiment, PET is used for the insulating resin film 52 on the side of the inorganic sealing layer 7, and PTFE is used for the insulating resin film 53 on the opposite side.

Average thicknesses of the insulating resin films 52, 53 range preferably from 5 μm to 100 μm, inclusive, more preferably 10 μm to 50 μm, inclusive.

As illustrated in FIG. 3, the moisture-proof member 11 is disposed to cover at least the whole of the soft adhesion layer 8, and to further cover part or the whole of the hard adhesion layer 10. That is, the moisture-proof member 11 covers at least the emission area 30, and further reaches the feeding areas 31, 32.

Therefore, by the heat equalizing property of the metallic foil 55, it is possible to equalize the heat in the entire emission area 30, and to prevent uneven brightness of the organic EL element 12 in the emission area 30.

Further, since the moisture-proof member 11 extends to the feeding areas 31, 32, it is possible to increase the distance from the outside to the organic EL element 12 in the emission area 30, so as to effectively prevent water or the like from invading into the organic EL element 12 in the emission area 30.

In the present embodiment, as illustrated in FIG. 1, the moisture-proof member 11 is laid on the whole surface of the transparent substrate 2. That is, it covers part of the electrode members 25, 26. In other words, the remainders of the electrode members 25, 26 project from the moisture-proof member 11.

The electrode members 25, 26 electrically connect an external power source with the first electrode layer 3 or the second electrode layer 6 of the organic EL element 12. The electrode members 25, 26 are foil-like members or plate-like members having electric conductivity, and are placeable on the extraction parts 35, 36, respectively.

A method for manufacturing the organic EL device 1 of the present embodiment will be described below.

The organic EL device 1 is manufactured by conducting the deposition with a vacuum evaporation apparatus (not illustrated) and/or a CVD apparatus (not illustrated), and conducting the patterning with a patterning apparatus (not illustrated), i.e., a laser scriber in the present embodiment.

First an organic EL element forming process (laminate forming process) for laminating an organic EL element is conducted.

Figure 7A:
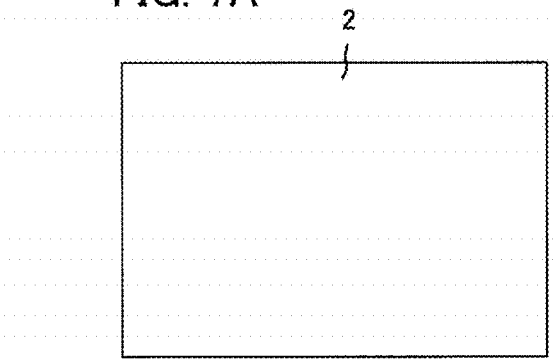
FIGS. 7A to 7H are explanatory views illustrating a manufacturing method of the organic EL device in FIG. 1 up to a sealing layer stacking process, in which A to H denote the respective steps.
Figure 7B:
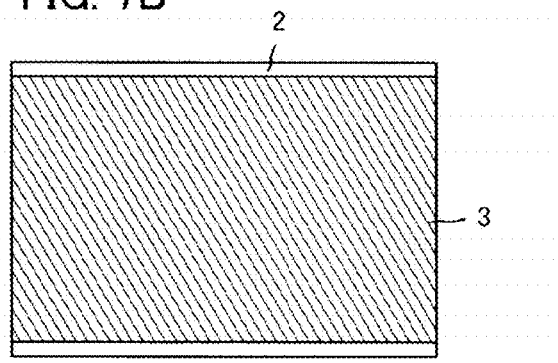

Specifically, the first electrode layer 3 is deposited on part or the whole of the transparent substrate 2 by the sputtering method or the CVD method (FIGS. 7A to 7B).

At this point, in the present embodiment, the first electrode layer 3 is not stacked in the vicinity of the long side (the side extending in the longitudinal direction) of the transparent substrate 2. The term "the vicinity of the long side" used herein represents the area situated at a distance of 1 mm or less, preferably 500 μm or less from the long side.

The average thickness of the formed first electrode layer 3 preferably ranges from 50 nm to 800 nm, inclusive, more preferably ranges from 100 nm to 400 nm, inclusive.

Figure 7C:
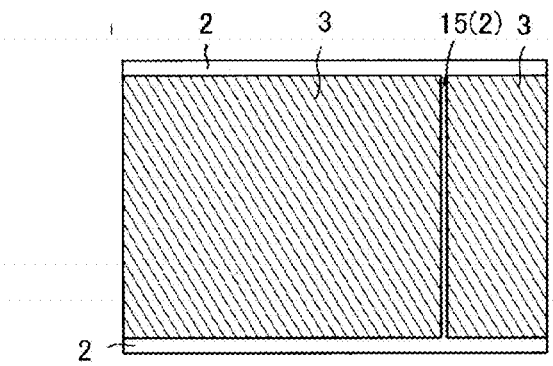

Then, in the substrate (hereinafter, referred to as the substrate including the laminate on the transparent substrate 2) on which the first electrode layer 3 is deposited, the first electrode layer separation groove 15 is formed with a laser scriber (FIGS. 7B to 7C).

At this time, the first electrode layer separation groove 15 is formed in parallel with a short side of the transparent substrate 2, and extends throughout the short direction.

As illustrated in FIG. 3, the first electrode layer separation groove 15 is formed in a boundary region between the feeding area 32 and the emission area 30 when the organic EL device 1 is formed. That is, the first electrode layer separation groove 15 divides the first electrode layer 3 into two areas in the longitudinal direction.

On this substrate, the first electrode layer 3 exists in almost the whole surface exclusive of the first electrode layer separation groove 15. Therefore, the laser scribing can be used as described above, and the masking process of hiding the deposition surface to which the deposition is not conducted can be eliminated in depositing the first electrode layer 3.

Figure 7D:
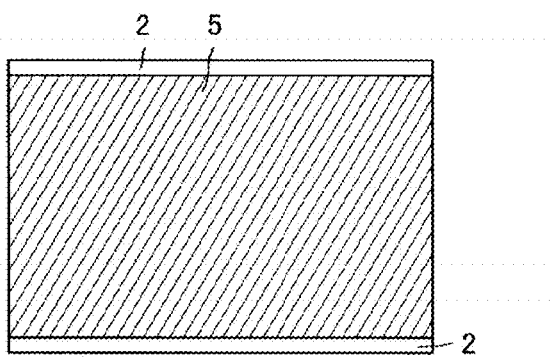

Then the hole-injection layer 64, the hole-transport layer 63, the light emitting layer 62, the electron-transport layer 61, the electron-injection layer 60 and so on are sequentially stacked from the side of the first electrode layer 3 with the vacuum evaporation apparatus to form the functional layer 5 (FIG. 7C to FIG. 7D).

At this point, the functional layer 5 is stacked in the first electrode layer separation groove 15, and the first electrode layer separation groove 15 is filled with the functional layer 5, and the functional layer 5 is stacked on almost the whole surface of this substrate.

Figure 7E:
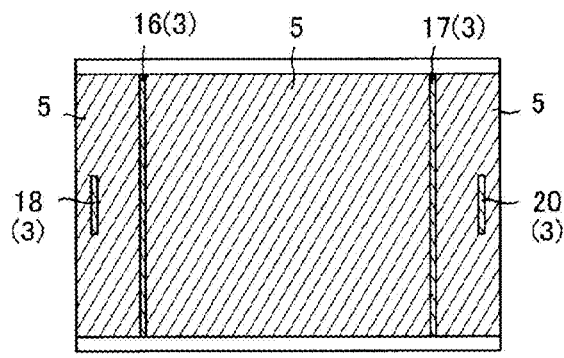

Then the electrode connection grooves 16, 17 and the extraction electrode fixing grooves 18, 20 are formed with the laser scriber in the substrate in which the functional layer 5 is deposited (FIG. 7D to FIG. 7E).

At this point, the electrode connection grooves 16, 17 are formed in parallel with a short side of the substrate, and are formed throughout the short direction of the substrate. That is, they are parallel with the first electrode layer separation groove 15. Also, the electrode connection grooves 16, 17 separate the functional layer 5 on the substrate into at least three areas.

As illustrated in FIG. 6, the extraction electrode fixing grooves 18, 20 are formed in the centers of the extraction parts 35, 36 in the completed organic EL device 1, and provided to equally divide the extraction parts 35, 36 into two halves in the longitudinal direction, respectively.

Then, on the substrate, the functional layer 5 exists exclusive of the electrode connection grooves 16, 17 and the extraction electrode fixing grooves 18, 20. Therefore, the laser scribing can be used as described above, and the masking process of hiding the deposition surface to which the deposition is not conducted can be eliminated in depositing the functional layer 5.

Figure 7F:
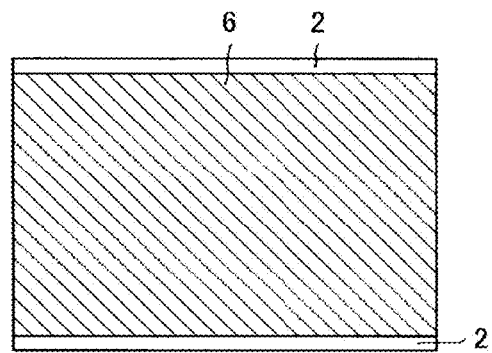

Then the second electrode layer 6 is deposited on the substrate with the vacuum evaporation apparatus (FIG. 7E to FIG. 7F).

At this point, the second electrode layer 6 is stacked in the electrode connection grooves 16, 17 and the extraction electrode fixing grooves 18, 20, and the electrode connection grooves 16, 17 and the extraction electrode fixing grooves 18, 20 are filled with the second electrode layer 6, and the second electrode layer 6 is stacked on the whole surface of this substrate. That is, the first electrode layer 3 and the second electrode layer 6 are fixedly bonded in the bottoms of the electrode connection grooves 16, 17 and the extraction electrode fixing grooves 18, 20 while they are in contact with each other, and thus the first electrode layer 3 and the second electrode layer 6 are electrically connected to each other.

For this reason, compared with the case where the functional layer 5 is interposed between the first electrode layer 3 and the second electrode layer 6, a peeling strength between these three layers can be enhanced.

Figure 7G:
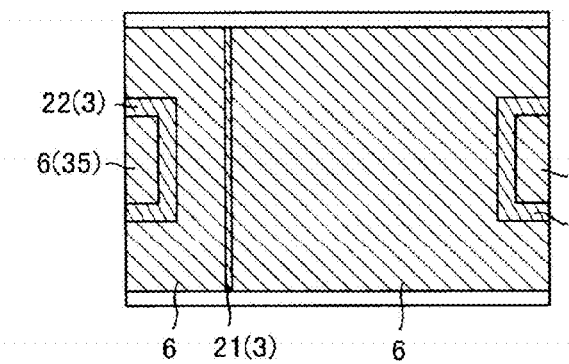

Then, the organic EL element separation groove 21 and the extraction electrode separation grooves 22, 23 extending over the functional layer 5 and the second electrode layer 6 are formed with the laser scriber in the substrate on which the second electrode layer 6 is deposited (FIG. 7F to FIG. 7G).

At this point, as illustrated in FIG. 6, the organic EL element separation groove 21 is formed in parallel with the electrode connection grooves 16, 17, and is formed throughout the short direction of the area where the second electrode layer 6 is stacked. That is, the organic EL element separation groove 21 is also parallel with the first electrode layer separation groove 15.

As illustrated in FIG. 3, the organic EL element separation groove 21 is formed in a boundary region between the feeding area 31 and the emission area 30 when the organic EL device 1 is formed. That is, the organic EL element separation groove 21 divides the functional layer 5 and the second electrode layer 6 into two areas in the longitudinal direction.

Specifically, the organic EL element separation groove 21 divides the second electrode layer 6 into the second electrode layer 6 in the emission area 30 and the second electrode layer 6 in the feeding area 31.

As illustrated in FIG. 5, the extraction electrode separation grooves 22, 23 isolate the functional layer 5 and the second electrode layer 6 into island-like forms to form the extraction parts 35, 36, respectively.

On this substrate, the second electrode layer 6 exists exclusive of the organic EL element separation groove 21 and the extraction electrode separation grooves 22, 23. Therefore, the laser scribing can be used as described above, and the masking process of hiding the deposition surface to which the deposition is not conducted can be eliminated in depositing the second electrode layer 6.

The foregoing is the organic EL element forming process.

Subsequently, an inorganic sealing layer forming process for forming the inorganic sealing layer 7 (sealing layer forming process) is conducted.

Figure 7H:
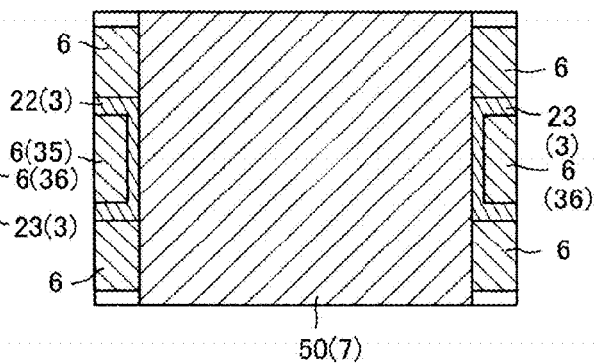

Specifically, first the substrate is partially covered with a mask, and the first inorganic sealing layer 50 is deposited with the CVD apparatus (FIG. 7G to FIG. 7H) (first inorganic sealing layer forming process).

At this point, as illustrated in FIG. 3, the first inorganic sealing layer 50 covers at least the second electrode layer 6 in the emission area 30, and further extends onto the projection plane in the member thickness direction (lamination direction) of the electrode connection grooves 16, 17. That is, the first inorganic sealing layer 50 is stacked in the organic EL element separation groove 21, and the organic EL element separation groove 21 is filled with the first inorganic sealing layer 50. For this reason, the sealing function can sufficiently be secured.

Further, the first inorganic sealing layer 50 of the present embodiment extends to the extraction electrode separation grooves 22, 23 in the longitudinal direction, and reaches a long side of the substrate in the short direction. Therefore, the heat-transfer property and the sealing property can be further improved.

Then, the substrate on which the first inorganic sealing layer 50 is deposited is taken out from the CVD apparatus, and the raw material for the second inorganic sealing layer 51 is applied to the substrate to form the second inorganic sealing layer 51, and thus the inorganic sealing layer 7 is formed (second inorganic sealing layer forming process).

At this point, as illustrated in FIG. 3, the whole surface of the first inorganic sealing layer 50 is covered with the second inorganic sealing layer 51.

In this way, the second inorganic sealing layer 51 is stacked on the first inorganic sealing layer 50, and thus the inorganic sealing layer 7 is formed.

Then the electrode members 25, 26 are bonded with the extraction parts 35, 36, respectively, by a conductive adhesive.

At this point, after placing the electrode members 25, 26 on the extraction parts 35, 36 on which the conductive adhesive is applied, the adhesion members 27, 28 are formed with a vacuum laminating machine.

The area where the conductive adhesive is applied is the whole surface of the exposed regions of the extraction parts 35, 36 including the projection plane in the member thickness direction of the extraction electrode fixing grooves 18, 20 in the longitudinal direction.

The conductive adhesive material which is the raw material for the adhesion members 27, 28 is not particularly limited as far as it has the conductivity and the adhesiveness, and for example, an epoxy adhesive material, an acryl adhesive material, low-temperature solder or the like can be used.

A quantity of the conductive adhesive to be applied is selected so that thicknesses of the adhesion members 27, 28 formed after solidification range from 500 nm to 50 $fm$, inclusive, and preferably, the thicknesses range from 1 μm to 30 μm, inclusive, and particularly preferably, the thicknesses range from 10 μm to 20 μm, inclusive.

Within these ranges, the thicknesses of the adhesion members 27, 28 do not interfere with the subsequent bonding of the moisture-proof member 11.

The foregoing describes the sealing layer stacking process.

A sealing member bonding process is conducted to bond the moisture-proof member 11 to the inorganic sealing layer 7 formed in the procedure as described above.

In the sealing member bonding process, the moisture-proof member 11 is bonded to the inorganic sealing layer 7, and the soft adhesion layer 8 and the hard adhesion layer 10 are formed.

Figure 8A:
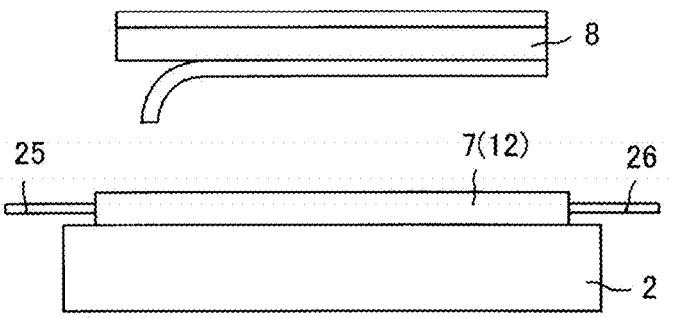
FIGS. 8A to 8C are explanatory views illustrating a process of forming a soft adhesion layer of the organic EL device in FIG. 1, in which A to C denote the respective steps.

Specifically, the soft adhesion layer 8 is bonded onto the inorganic sealing layer 7 with a vacuum laminating machine (FIG. 8A to FIG. 8B) (soft resin layer forming process).

At this point, in forming the soft adhesion layer 8, the soft adhesion layer 8 whose both faces are covered with insulating separators (release tapes) is used. At the time of bonding, the separator on one face of the soft adhesion layer 8 is removed, and the stripped face is bonded onto the inorganic sealing layer 7.

In this bonded state, as illustrated in FIG. 3, the soft adhesion layer 8 covers the whole of the emission area 30, and extends to the electrode connection grooves 16, 17 in the length direction (longitudinal direction). The soft adhesion layer 8 does not reach the extraction electrode separation grooves 22, 23. That is, the soft adhesion layer 8 does not cover the outer sides of the electrode connection grooves 16, 17, and thus the inorganic sealing layer 7 is exposed. In other words, in the inorganic sealing layer 7, the region exposed from the soft adhesion layer 8 and the region covered with the soft adhesion layer 8 coexist, and the region covered with the soft adhesion layer 8 is located in the center of the short direction and the longitudinal direction.

Figure 8B:
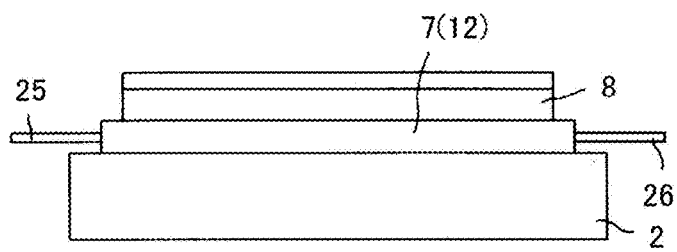
Figure 8C:
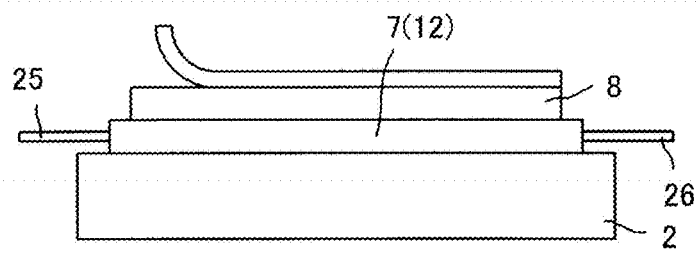

Thereafter, the separator on the opposite side of the stripped face is removed (FIG. 8B to FIG. 8C).

Figure 9D:
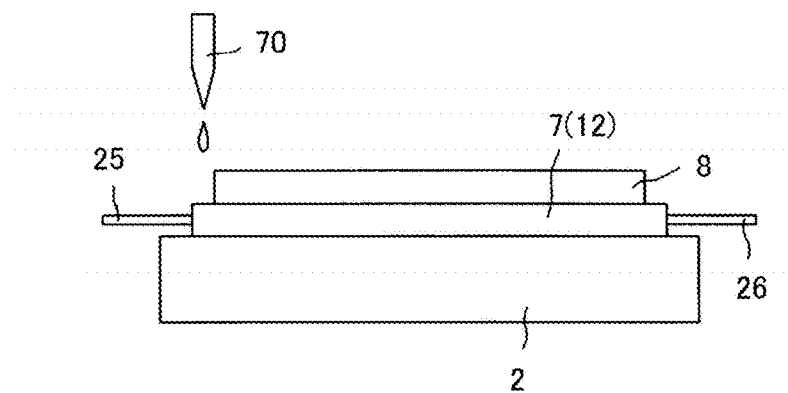
FIGS. 9D and 9E are explanatory views illustrating a process of forming a hard adhesion layer of the organic EL device in FIG. 1, in which D to E denote the respective steps.
Figure 9E:
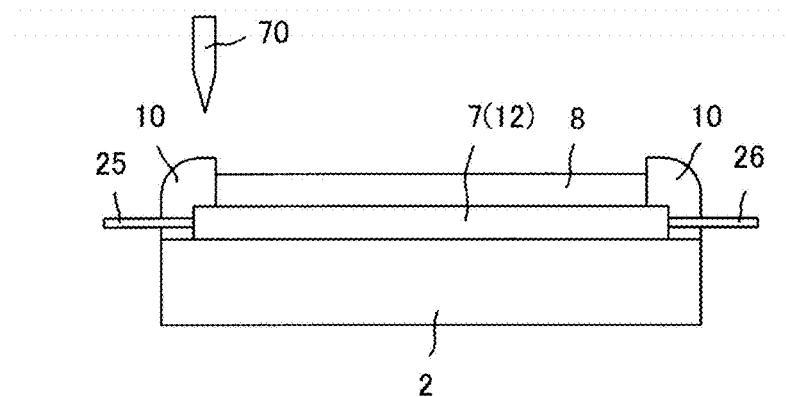

Subsequently, the raw material of the hard adhesion layer 10 is applied to the resultant substrate with a dispenser 70 to deposit the hard adhesion layer 10 (FIG. 9D to FIG. 9E) (hard resin layer forming process).

Figure 11:
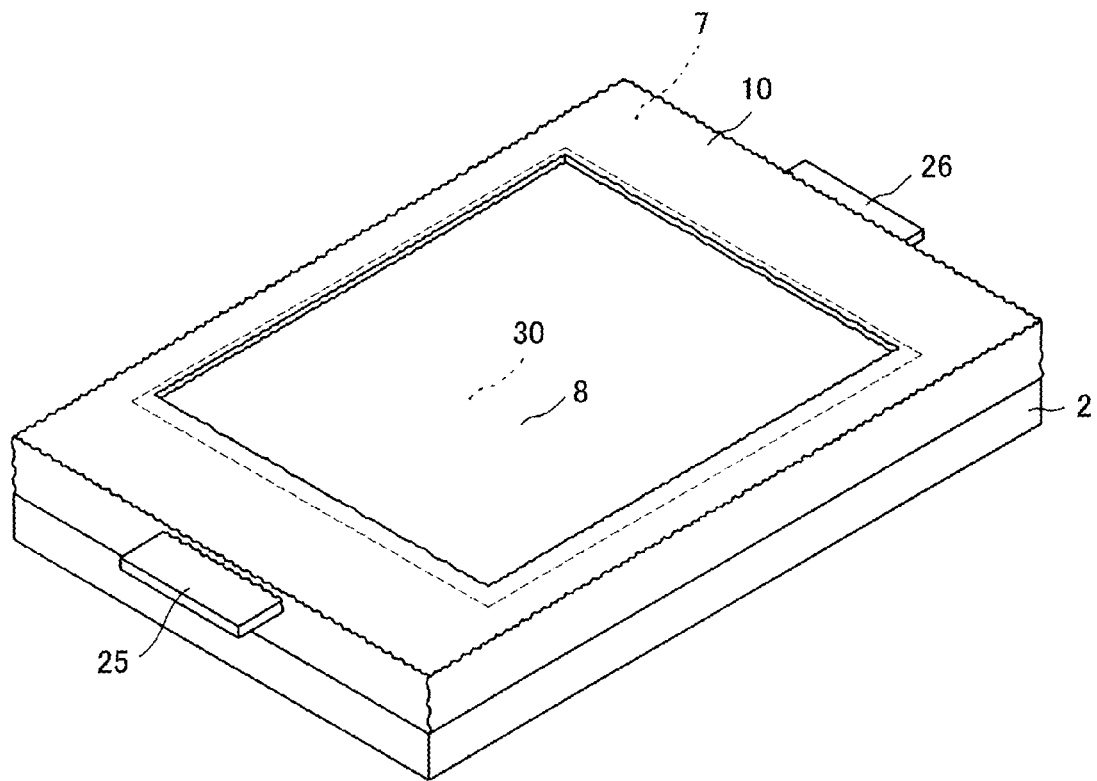
FIG. 11 is an explanatory view of the organic EL device illustrating the condition of FIG. 10F.

The hard adhesion layer 10 covers part or the whole surface of the soft adhesion layer 8. In the present embodiment, the hard adhesion layer 10 covers part of the soft adhesion layer 8, and as illustrated in FIG. 11, it is applied and formed to stretch from the soft adhesion layer 8 to the inorganic sealing layer 7. The most part of the soft adhesion layer 8 located in the emission area 30 is not covered with the hard adhesion layer 10. That is, an opening where the soft adhesion layer 8 is exposed is formed.

An area of the opening is slightly larger than the area of the emission area 30. The area of the opening ranges from 90% to 98%, inclusive, preferably 95% to 98%, inclusive, of the area where the soft adhesion layer 8 is formed.

The hard adhesion layer 10 covers part of the electrode members 25, 26 (projection plane in the member thickness direction of the transparent substrate 2. In other words, the part of the electrode members 25, 26 are embedded in the hard adhesion layer 10. That is, the soft adhesion layer 8 and the hard adhesion layer 10 both having the bonding property cover and overlap with each other.

Figure 10F:
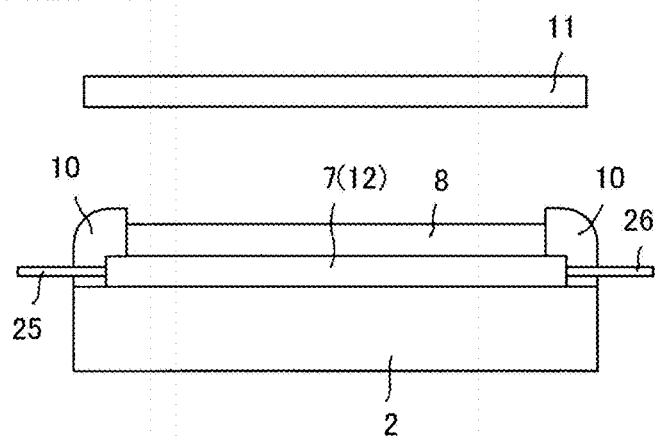
FIGS. 10F and 10G are explanatory views illustrating a process of attaching a moisture-proof member of the organic EL device in FIG. 1, in which F to G denote respective steps.
Figure 10G:
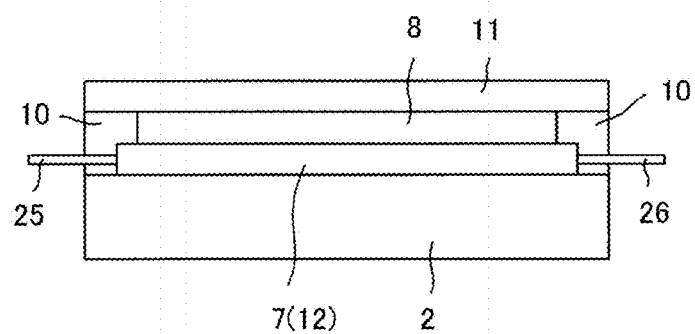

Subsequently, on the substrate, the moisture-proof member 11 that is separately molded is placed on the soft adhesion layer 8 and the hard adhesion layer 10, and is bonded thereto with the vacuum laminator machine (FIG. 10F to FIG. 10G).

At this point, the moisture-proof member 11 covers the whole surfaces of the soft adhesion layer 8 and the hard adhesion layer 10, and is integrated with the inorganic sealing layer 7 or the electrode members 25, 26 by means of the bonding functions of the soft adhesion layer 8 and the hard adhesion layer 10. That is, the moisture-proof member 11 indirectly covers the whole surface of the organic EL element 12.

In this way, the sealing member bonding process ends to complete the organic EL device 1.

Functions of the organic EL device 1 will be described.

Description will be given for the case where part of the organic EL element 12 is damaged by an external factor or the like, and the part of the organic EL element 12 scatters. The organic EL device 1 of the present embodiment prevents invasion of water or the like by the inorganic sealing layer 7, the soft adhesion layer 8, the hard adhesion layer 10 and the moisture-proof member 11. Accordingly, the sealing function is high and basically a dark spot is not generated, however, the following description will be given assuming the case where a short circuit or the like occurs due to an external factor or the like, and a dark spot is generated.

Figure 13:
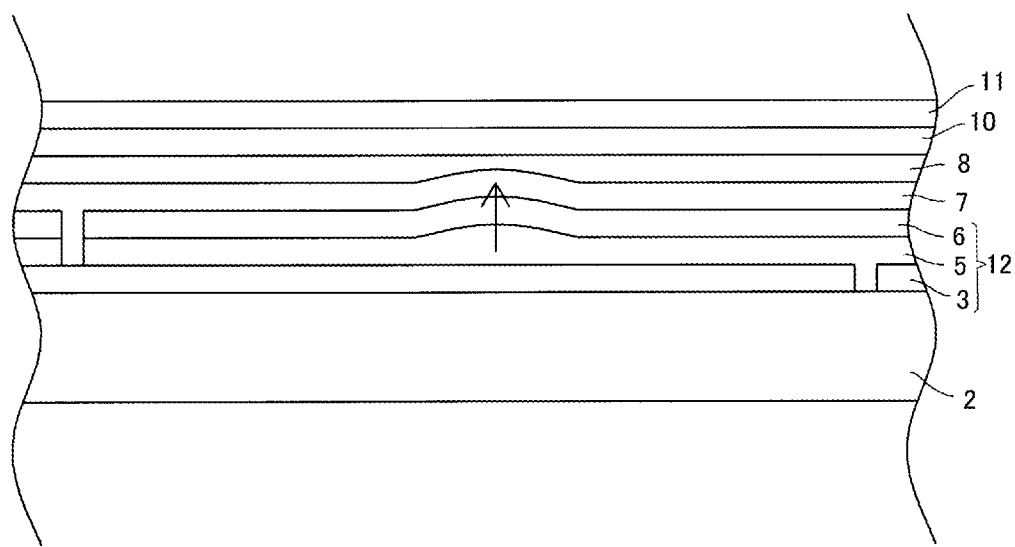
FIG. 13 is an explanatory view of the case where the organic EL element of the organic EL device in FIG. 1 scatters, illustrating the condition after scattering of the organic EL element.

As illustrated in FIG. 13, when an external factor or the like causes a short circuit in the organic EL element 12 and scattering of the broken organic EL element 12, the soft adhesion layer 8 is pushed via the inorganic sealing layer 7, and plastically deforms. The pushing force is received by the elastic deformation or the plastic deformation of the soft adhesion layer 8, and dispersed. Therefore, the pushing force little transfers to the hard adhesion layer 10. For this reason, the soft adhesion layer 8 is not pushed back by the hard adhesion layer 10 despite the rigidity of the hard adhesion layer 10, and the organic EL element 12 hardly receives a stress. That is, the distance between the first electrode layer 3 and the second electrode layer 6 hardly decreases, and a short circuit due to the stress hardly occurs.

Also, the sealing function is maintained by the hard adhesion layer 10 and the moisture-proof member 11. Therefore, even if the inorganic sealing layer 7 is broken, invasion of water or the like can be prevented, and further generation of a dark spot in association with invasion of water or the like can be suppressed.

In the foregoing embodiment, the soft adhesion layer 8 is formed on the inorganic sealing layer 7, however, the present invention is not limited to this, and a space may be formed in place of the soft adhesion layer 8.

Specifically, this configuration will be described as a second embodiment. An element identical to that in the first embodiment is denoted by the same reference number, and description thereof is omitted.

Figure 15:
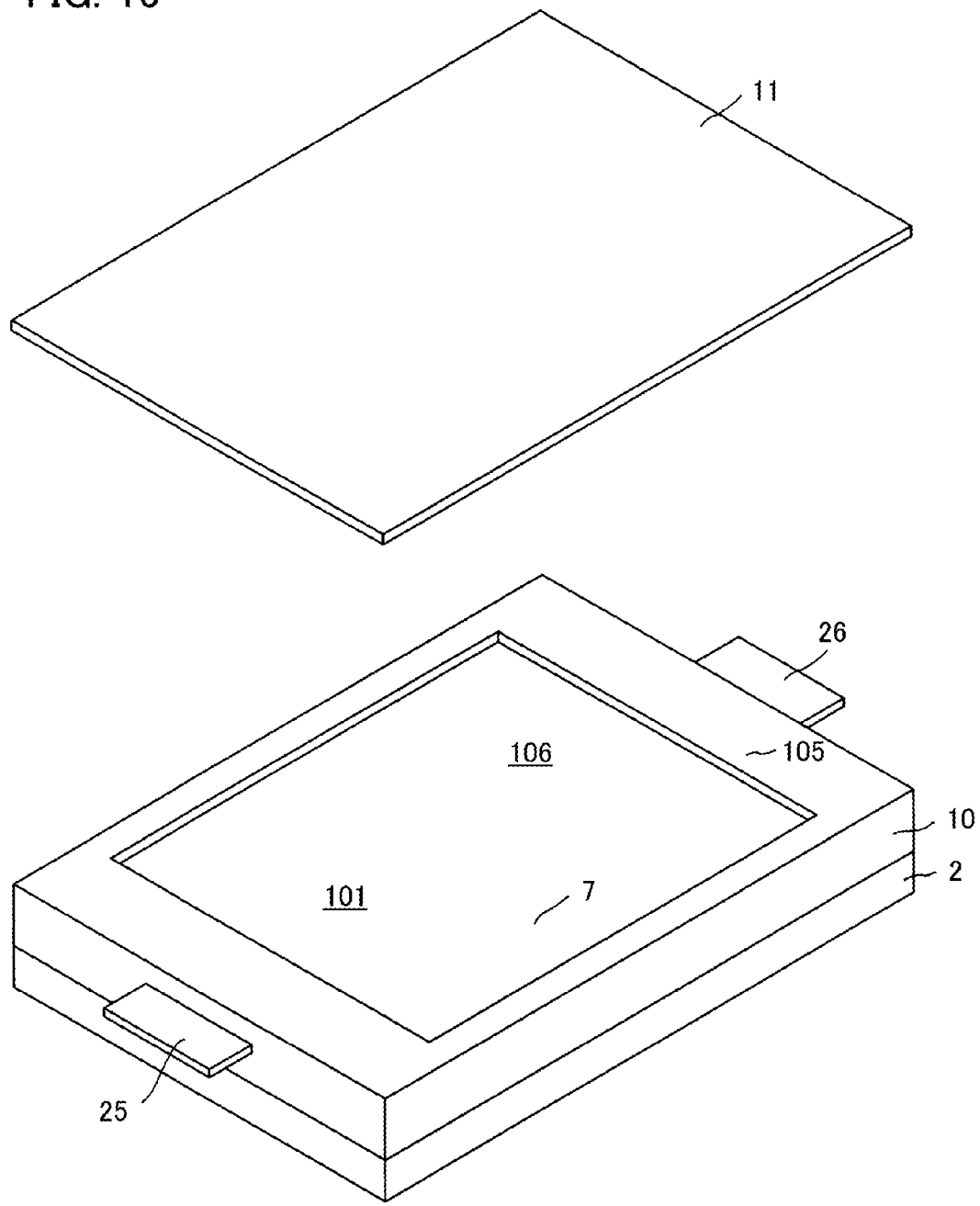
FIG. 15 is an exploded perspective view of an organic EL device in the second embodiment of the present invention.
Figure 16:
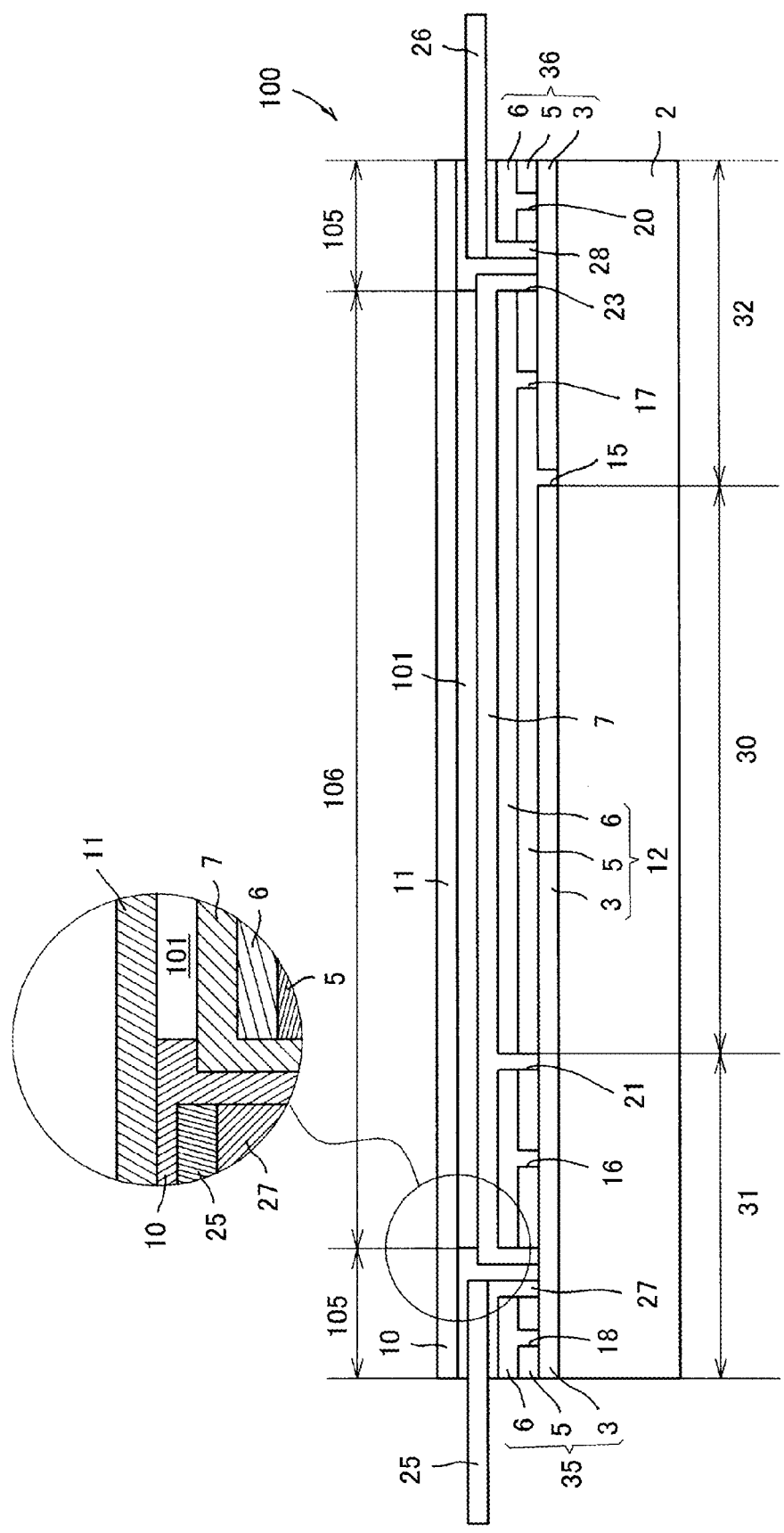
FIG. 16 is a longitudinal section view of the organic EL device in FIG. 15.

As illustrated in FIG. 15 and FIG. 16, an organic EL device 100 of the second embodiment includes a coverage area 105 where the inorganic sealing layer 7 is covered with the hard adhesion layer 10, and an exposed area 106 where the inorganic sealing layer 7 is not covered with the hard adhesion layer 10. In the exposed area 106, a hermetically sealed buffer space 101 is formed between the moisture-proof member 11 and the inorganic sealing layer 7.

The exposed area 106 spans the whole surface of the emission area 30 and occupies the most part of the transparent substrate 2.

The buffer space 101 is a space surrounded by the inorganic sealing layer 7, the hard adhesion layer 10, and the moisture-proof member 11. The buffer space 101 is filled with an inert gas.

The "inert gas" used herein refers to gas having no or very low reactivity, and for example, nitrogen gas, helium gas, argon gas and the like can be used.

The inert gas is preferably an inert gas that contains substantially no moisture. That is, the smaller water content is better. The water content of the inert gas ranges, preferably from 0 ppm and 1 ppm, inclusive, particularly preferably from 0 ppm to 0.1 ppm, inclusive.

Next, a method for manufacturing the organic EL device 100 according to the second embodiment will be described.

Since the processes up to the inorganic sealing process are similar to those in the first embodiment, description for the processes similar to those in the first embodiment will be omitted.

Figure 17A:
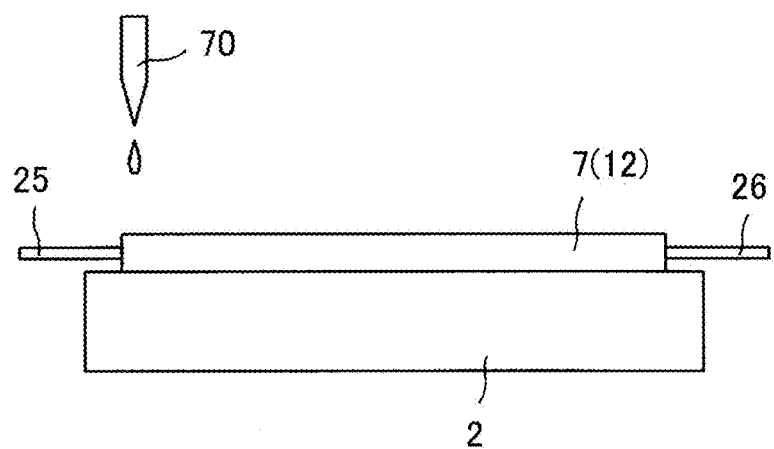
FIGS. 17A and 17B are explanatory views illustrating a process of forming a hard adhesion layer of the organic EL device in FIG. 15, in which A and B denote respective steps.
Figure 17B:
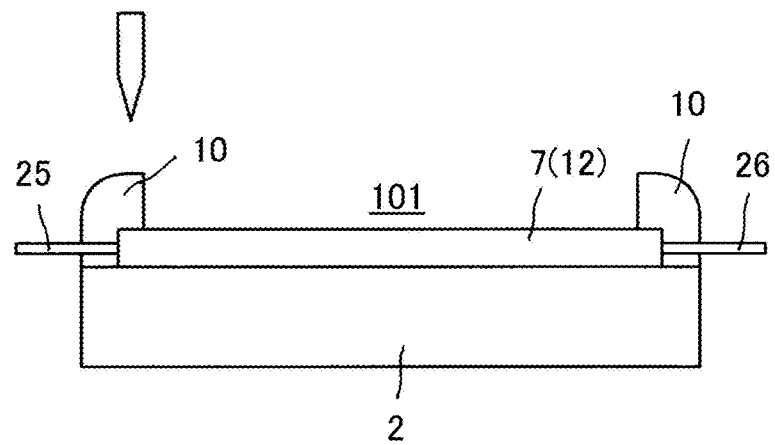

Subsequently, the raw material of the hard adhesion layer 10 is applied on this substrate with the dispenser 70 to deposit the hard adhesion layer 10 (FIG. 17A to FIG. 17B) (hard resin layer forming process).

Figure 19:
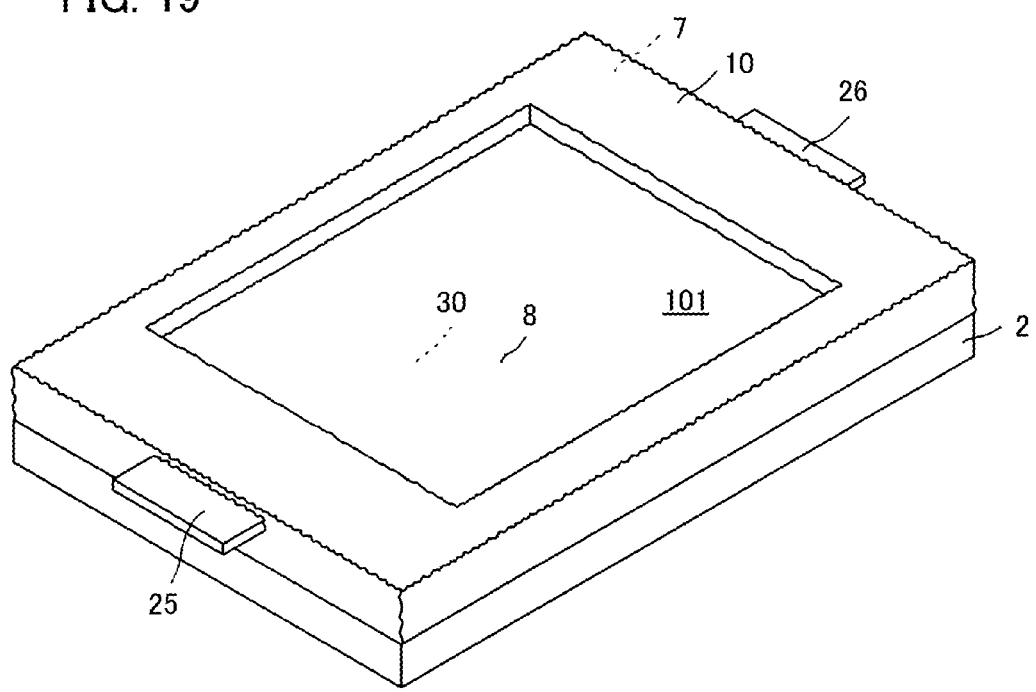
FIG. 19 an explanatory view of the organic EL device illustrating the condition of FIG. 17B.

At this point, as illustrated in FIG. 19, the hard adhesion layer 10 is formed to form an inner wall of the buffer space 101. In other words, the buffer space 101 is not covered with the hard adhesion layer 10. That is, the buffer space 101 opens upward, and thus an opening is formed so that the buffer space 101 communicates with the outside. An area of the opening is slightly larger than the area of the emission area 30.

Also, the hard adhesion layer 10 covers part of the electrode members 25, 26 (the projection plane in the member thickness direction of the transparent substrate 2). In other words, the part of the electrode members 25, 26 are embedded in the hard adhesion layer 10.

Figure 18C:
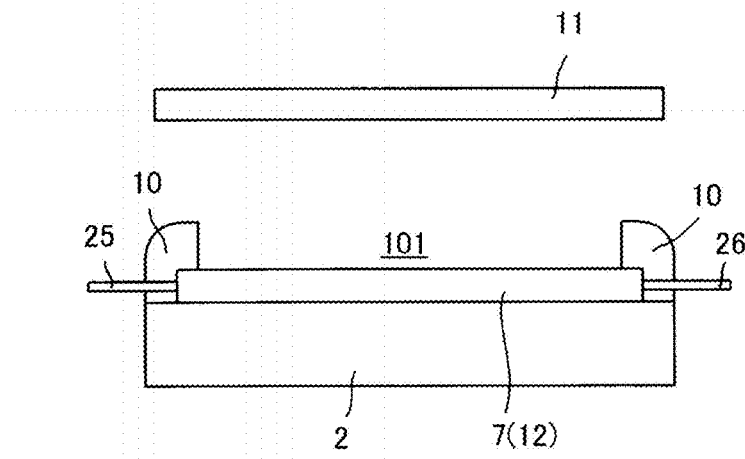
FIGS. 18C and 18D are explanatory views illustrating a process of attaching a moisture-proof member of the organic EL device in FIG. 15, in which C and D denote respective steps.
Figure 18D:
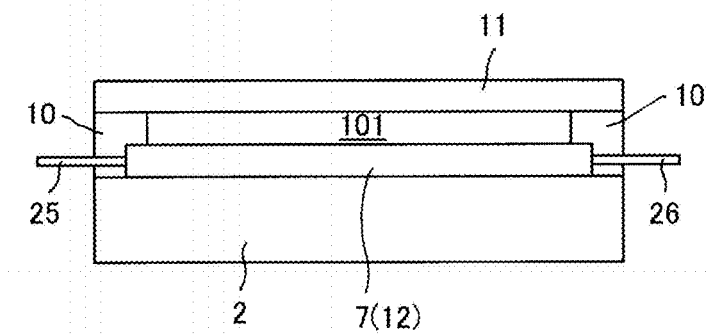

Subsequently, on the substrate, the moisture-proof member 11 is placed on the buffer space 101 and the hard adhesion layer 10, and is bonded thereto in an inert gas condition (FIG. 18C to FIG. 18D).

At this point, the moisture-proof member 11 covers the whole surfaces of the buffer space 101 and the hard adhesion layer 10, and is integrated with the inorganic sealing layer 7 or the electrode members 25, 26 by means of the bonding functions of the buffer space 101 and the hard adhesion layer 10. That is, the moisture-proof member 11 indirectly covers the whole surface of the organic EL element 12. The buffer space 101 is hermetically sealed in an inert gas condition to become a hermetically sealed space in which the inert gas is hermetically sealed.

In this manner, the organic EL device 100 of the second embodiment is completed.

According to the organic EL device 100 of the second embodiment, it is possible to reduce the cost because the buffer space 101 exerts a function of buffering the soft adhesion layer 8.

Next, an organic EL device 200 according to a third embodiment will be described. An element identical to that in the first and second embodiments is denoted by the same reference number, and description thereof is omitted.

Figure 21:
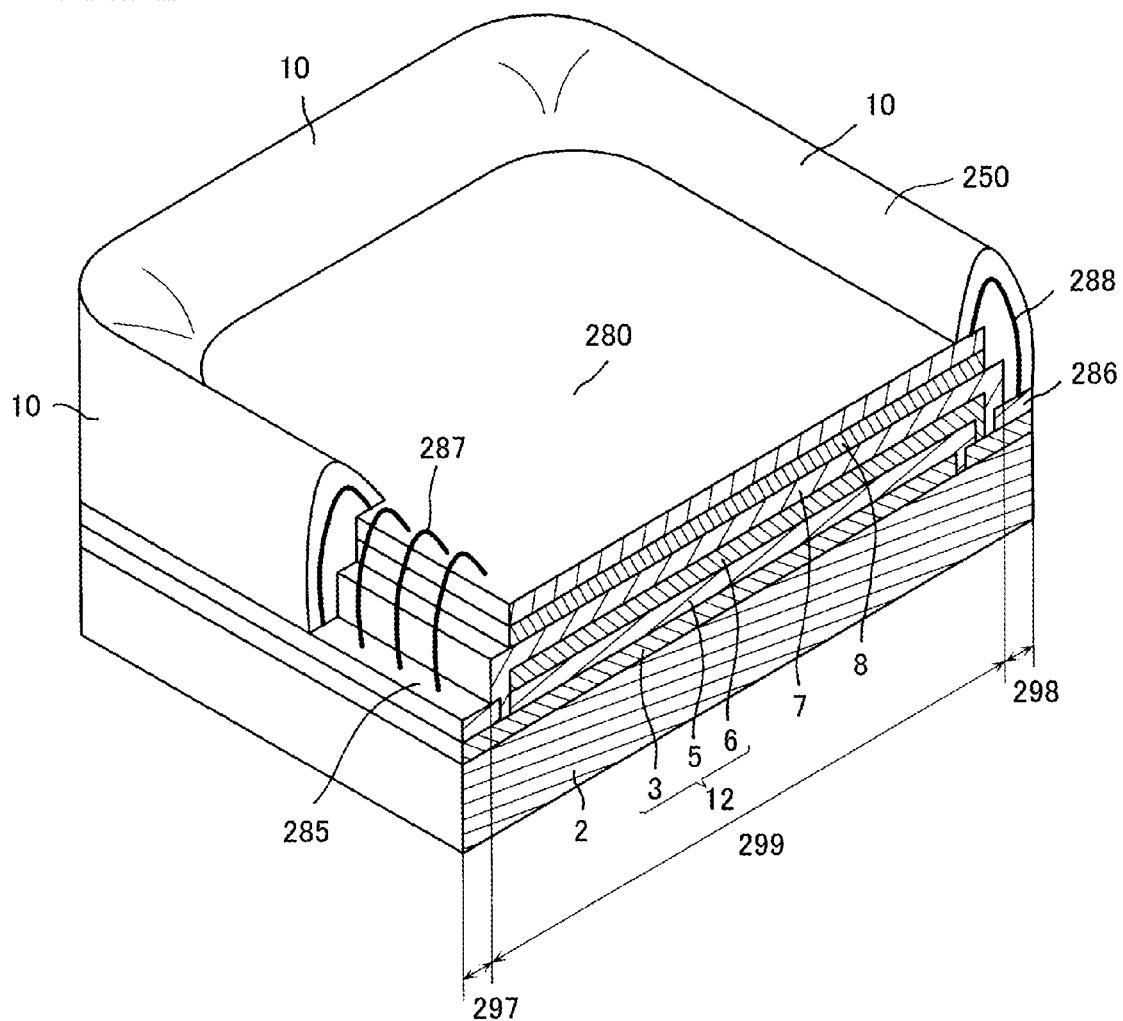
FIG. 21 is a partially broken perspective view of the organic EL device in FIG. 20.

In the organic EL device 200 of the third embodiment, as illustrated in FIG. 21, the organic EL element 12 is stacked on the transparent substrate 2 (base member) having translucency, and further, the inorganic sealing layer 7 (sealing layer), the soft adhesion layer 8, the hard adhesion layer 10 (hard wall part), and a conductive base member 280 are provided thereon.

Figure 22:
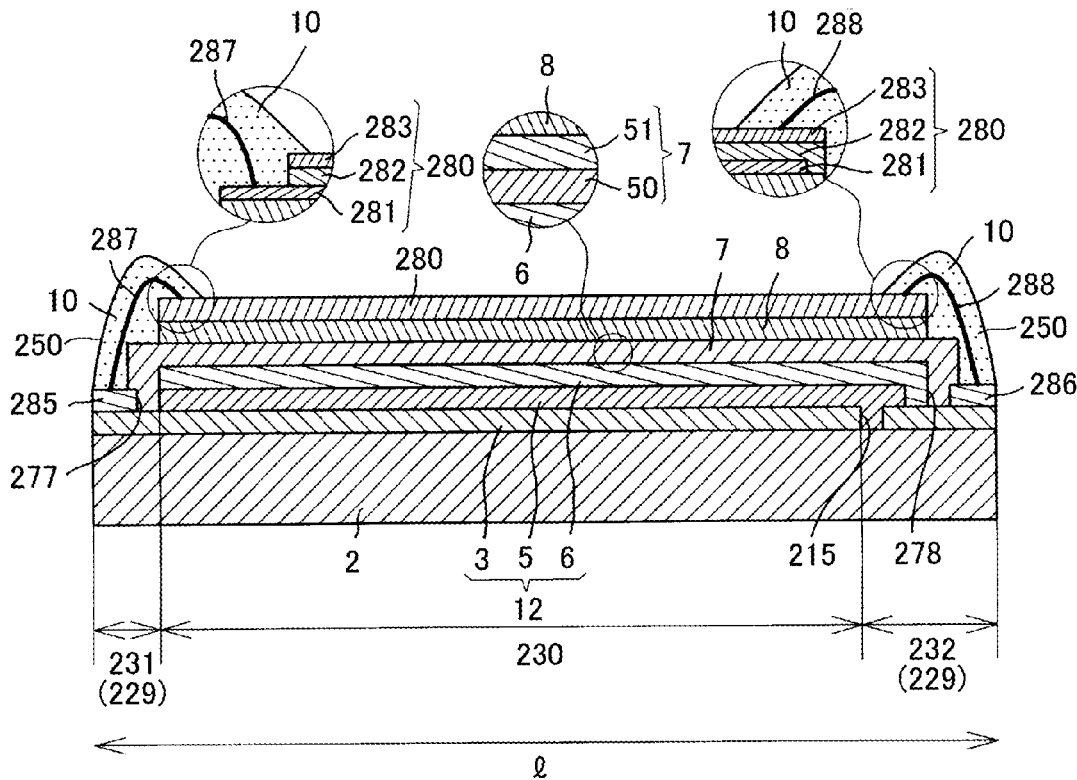
FIG. 22 is a sectional view taken on a line A-A of the organic EL device in FIG. 20.
Figure 23:
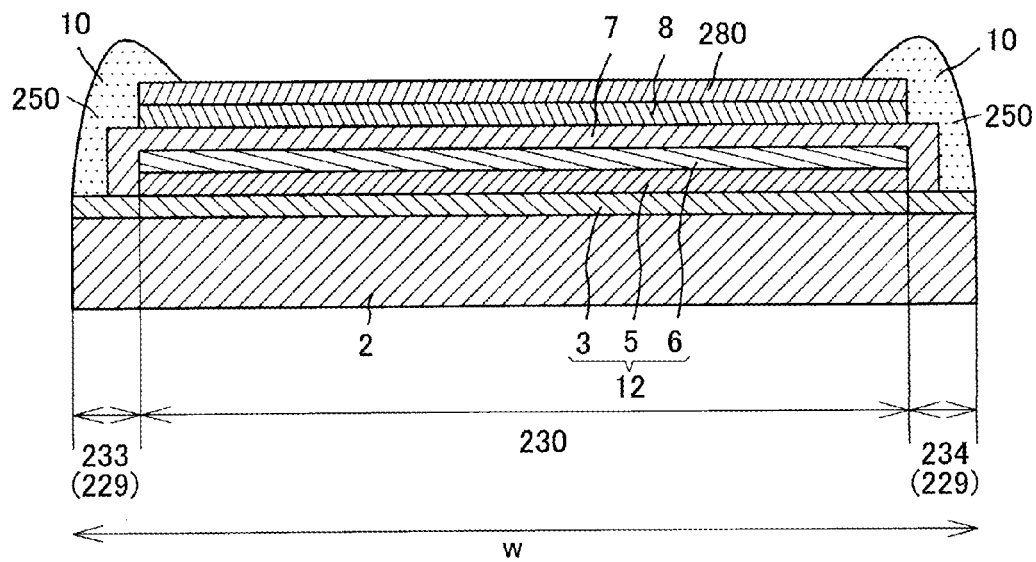
FIG. 23 is a sectional view taken on a line B-B of the organic EL device in FIG. 20.

As illustrated in FIG. 22 and FIG. 23, the organic EL device 200 has an emission area 230 that actually emits light during operation, and a non-emission area 229 that does not emit light around the emission area 230.

The non-emission area 229 is made up of feeding areas 231, 232 that supply electricity to the organic EL element 12 in the emission area 230 illustrated in FIG. 22, and sealing areas 233, 234 that contribute sealing of the organic EL element 12 in the emission area 230 illustrated in FIG. 23.

As illustrated in FIG. 22 and FIG. 23, the emission area 230 is a region where the first electrode layer 3, the functional layer 5, and the second electrode layer 6 are superposed.

As illustrated in FIG. 22 and FIG. 23, the emission area 230 is located in the center in the length direction l and the width direction w (the direction orthogonal to the length direction l), and the non-emission area 229 is located to surround the emission area 230.

Specifically, as illustrated in FIG. 22, the feeding areas 231, 232 are located on both outer sides in the length direction l of the emission area 230, and as illustrated in FIG. 23, the sealing areas 233, 234 are located on both outer sides in the width direction w of the emission area 230. That is, the feeding areas 231, 232 are arranged along opposite sides as illustrated in FIG. 24B, and the sealing areas 233, 234 are arranged along two sides other than the opposite sides.

In the feeding areas 231, 232, as illustrated in FIG. 22, the first electrode layer 3 and conductive layers 285, 286 are directly stacked, respectively, and the conductive layers 285, 286 function as feeding units that feed the electricity supplied from the outside to the organic EL element 12.

As illustrated in FIG. 21, in the organic EL device 200 of the present embodiment, the hard adhesion layer 10 covers around the emission area 230 to form a hard wall part 250, and wires 287, 288 (feeding members) are partly or entirely embedded in the hard adhesion layer 10. In addition, the conductive layers 285, 286 and the conductive base member 280 are connected by the wires 287, 288, respectively.

Next, positional relationships of constituents will be described.

As described above, in the organic EL device 200, as illustrated in FIG. 22, in the emission area 230, the first electrode layer 3, the functional layer 5 and the second electrode layer 6 are stacked in this sequence on the transparent substrate 2, and then the inorganic sealing layer 7, the soft adhesion layer 8, and the conductive base member 280 are stacked thereon in sequence.

In part of the feeding areas 231, 232, the conductive layers 285, 286 are stacked on the first electrode layer 3, respectively, and the hard adhesion layer 10 is stacked thereon. The conductive layers 285, 286 and the conductive base member 280 are connected by the wires 287, 288, respectively.

The hard adhesion layer 10 fixes the conductive base member 280 so as to prevent the conductive base member 280 from departing from the side of the organic EL element 12. That is, the hard adhesion layer 10 covers part of the conductive base member 280 and holds an edge part of the conductive base member 280, to form the hard wall part 250 that surrounds an area including the emission area 230 as illustrated in FIG. 22. In the present embodiment, as illustrated in FIG. 22 and FIG. 23, the hard adhesion layer 10 is formed on the non-emission area 229.

As illustrated in FIG. 22, the hard adhesion layer 10 covers the most part of the wires 287, 288. In other words, the most part of the wires 287, 288 is embedded in the hard adhesion layer 10. In the present embodiment, the whole of the wires 287, 288 is embedded in the hard adhesion layer 10. That is, the wires 287, 288 are not exposed outside.

Focusing on the relationship between the conductive layers 285, 286 and the conductive base member 280, the conductive layers 285, 286 located in the feeding areas 231, 232, and the conductive base member 280 mainly located on the projection plane in the member thickness direction of the emission area 230 are connected by the wires 287, 288, respectively.

Figure 24A:
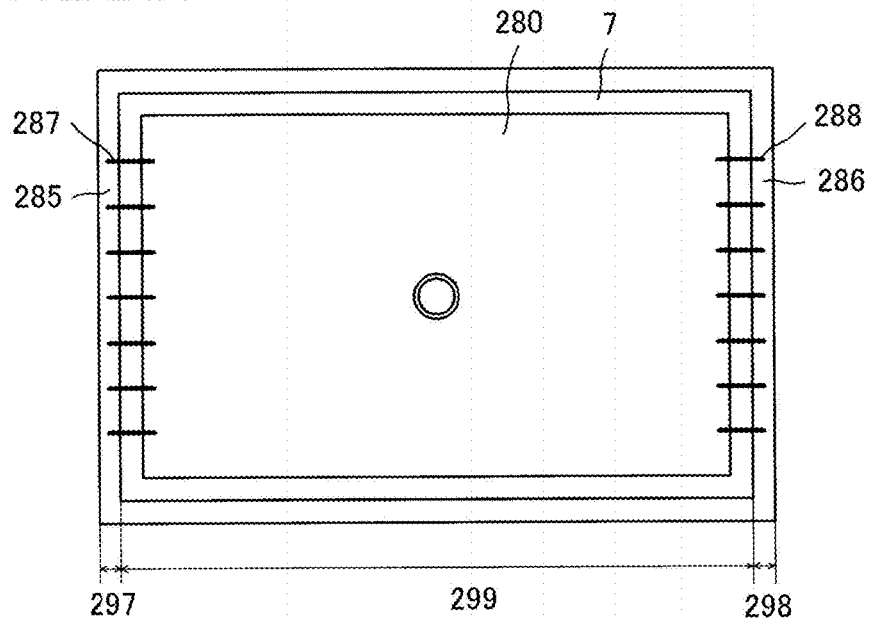
Figure 24B:
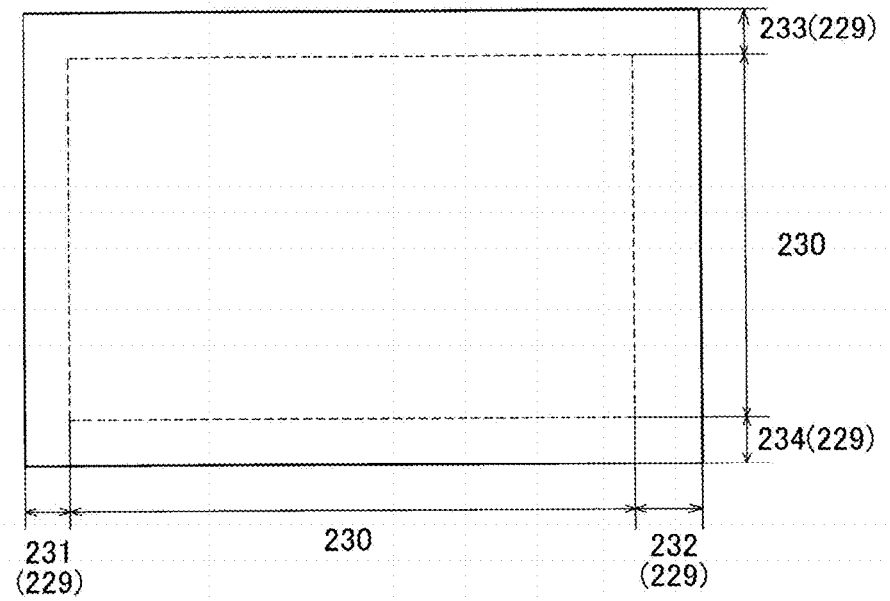

That is, as illustrated in FIG. 24A, one end parts of the wires 287, 288 are connected with the conductive layers 285, 286 in the exposed areas 297, 298 exposed from the inorganic sealing layer 7, respectively. The other end parts are connected with the conductive base member 280 in the coverage area 299 covered with the inorganic sealing layer 7.

In other words, one end part of the wire 287 is connected with the conductive layer 285 in the feeding area 231, and the other end part is connected with the conductive base member 280 in the emission area 230. That is, the wire 287 is attached to stretch from the feeding area 231 to the emission area 230.

One end part of the wire 288 is connected with the conductive layer 286 in the feeding area 232, and the other end part is connected with the conductive base member 280 in the feeding area 232. As illustrated in FIG. 21, the wires 287, 288 are not in contact with the inorganic sealing layer 7 and the soft adhesion layer 8.

As illustrated in FIG. 22 and FIG. 23, the soft adhesion layer 8 is stacked on the inorganic sealing layer 7 so as to cover at least the whole surface of the projection plane in the member thickness direction of the emission area 230. As illustrated in FIG. 22, the soft adhesion layer 8 extends over the whole of the second electrode layer 6 in the length direction l. The soft adhesion layer 8 covers the most part of the inorganic sealing layer 7 with a planar expanse.

Figure 20:
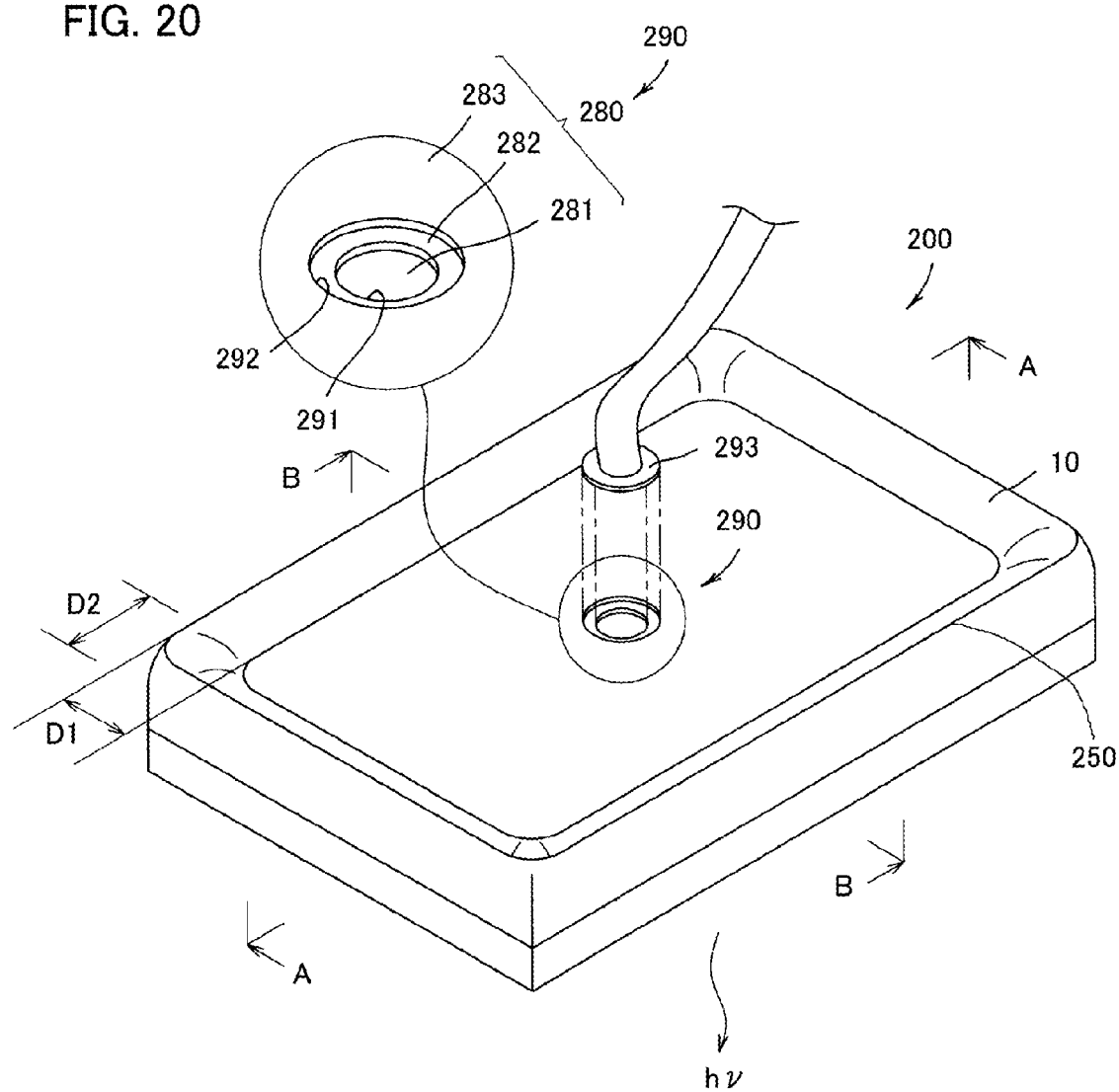
FIG. 20 is a perspective view schematically illustrating an organic EL device according to a third embodiment of the present invention when it is observed from a back side.

In the hard wall part 250 formed by the hard adhesion layer 10, widths (thickness of the hard wall part) D1, D2 of the hard adhesion layer 10 in the direction parallel with the substrate plate illustrated in FIG. 20 range preferably from 0.05 mm to 10 mm, inclusive, more preferably from 0.1 mm to 5 mm, inclusive, further preferably from 0.5 mm to 2 mm, inclusive, from the view point of supporting the conductive base member 280 with sufficient strength, sufficiently preventing invasion of moisture into the organic EL element 12, reinforcing the wires 287, 288 with sufficient strength, preventing oxidation of the same, and narrowing the frame region which is to be the non-emission area 229 where the hard wall part 250 exists.

The conductive base member 280 is a foil-like or plate-like member, and as illustrated in FIG. 22, is formed by laminating three layers including a first conductive foil 281 (conductive film), an insulating sheet 282 (sealing sheet), and a second conductive foil 283 (conductive film) in this order from the side of the transparent substrate 2.

As illustrated in FIG. 20, the conductive base member 280 has a connection unit 290 capable of electrically connecting with an external power source in the center in a planar view.

In the conductive base member 280, a first connection hole 291 is formed in the insulating sheet 282, and a second connection hole 292 is formed in the second conductive foil 283. The first conductive foil 281 is exposed from the first connection hole 291, and the first conductive foil 281 and the insulating sheet 282 are exposed from the second connection hole 292. The insulating sheet 282 is in the shape of a circle that surrounds part of the first conductive foil 281, and functions as a safety zone at the time of turning on electricity.

As illustrated in FIG. 20, both of the first connection hole 291 and the second connection hole 292 have a circular opening, and have different opening diameters. The opening diameter of the first connection hole 291 is smaller than the opening diameter of the second connection hole 292, and they are concentric. That is, both of the first connection hole 291 and the second connection hole 292 form a continuous communication hole, and a feeding terminal 293 which is electrically connected to an external power source can be connected to the first conductive foil 281 from the side of the second conductive foil 283 by inserting the feeding terminal 293 into the communication hole. As described above, in the conductive base member 280, one electrode (for example, positive electrode) of the feeding terminal 293 which is electrically connected to an external power source can be connected to the first conductive foil 281, and the other electrode (for example, negative electrode) of the feeding terminal 293 can be connected to the second conductive foil 283.

Materials for the first conductive foil 281 and the second conductive foil 283 are not particularly limited as far as they have conductivity, and copper foil, aluminum foil, silver foil, gold foil, platinum foil and the like can be used.

A material for insulating sheet 282 is not particularly limited as far as it has an insulating property, and is preferably any one of polyethylene terephthalate (PET), polyvinylidene chloride (PVDC), and polytetrafluoroethylene (PTFE) from the view point of high sealing property.

The wires 287, 288 are linear members, which are so-called bonding wires. Diameters of the wires 287, 288 range from 15 μm to 100 μm, inclusive, preferably from 50 μm to 100 μm, inclusive. Within this range, sufficient rigidity can be obtained while sufficient conductivity is secured.

Materials for the wires 287, 288 are not particularly limited as far as they have electric conductivity, and for example, a copper wire, a silver wire, a gold wire, an aluminum wire or the like can be used.

The conductive layers 285, 286 located in the feeding areas 231, 232 are formed of a material having higher electric conductivity than that of the first electrode layer 3. Regarding the material for the conductive layers 285, 286, for example, when the first electrode layer 3 is formed of a transparent conductive oxide, metal can be used, and gold, silver, copper, aluminum, platinum and the like are particularly preferred. In the present embodiment, the conductive layers 285, 286 are formed of a material similar to that of the second electrode layer 6, and are formed simultaneously with deposition of the second electrode layer 6 as will be described later.

As illustrated in FIG. 22, the conductive layer 285 is connected to the first conductive foil 281 of the conductive base member 280 via the wire 287. That is, the wire 287 is connected over a plurality of areas of the feeding area 231 and the emission area 230. Similarly, the conductive layer 286 is connected with the second conductive foil 283 of the conductive base member 280 via the wire 288.

As illustrated in FIG. 22, the first electrode layer 3 is formed with a first electrode layer separation groove 215 that extends in parallel with one side in the length direction l in the vicinity of the one side. The first electrode layer separation groove 215 extends in the width direction w which is a direction orthogonal to the length direction l.

The first electrode layer separation groove 215 is a groove for dividing the first electrode layer 3 into two areas, and separates the emission area 230 and the feeding area 232 from each other.

On the outer side of the first electrode layer separation groove 215 (the side opposite to the emission area 230), the second electrode layer 6 and the first electrode layer 3 are in contact with each other, and on the further outer side, the conductive layer 286 and the first electrode layer 3 are in contact with each other.

That is, between the second electrode layer 6 constituting the organic EL element 12 and the conductive layer 286, there is a conductive layer separation groove 278, and the inorganic sealing layer 7 proceeds into the conductive layer separation groove 278.

On the other hand, between the second electrode layer 6 constituting the organic EL element 12 and the conductive layer 285 located on the side of the opposite side, there is a conductive layer separation groove 277, and the inorganic sealing layer 7 proceeds into the conductive layer separation groove 277.

As illustrated in FIG. 24A and FIG. 24B, the inorganic sealing layer 7 is deposited at least on the whole surface of the emission area 230, and reaches part of the feeding areas 231, 232.

Specifically, as illustrated in FIG. 22, the inorganic sealing layer 7 partly projects outwardly from the conductive layer separation groove 277 and the conductive layer separation groove 278, and covers part of the conductive layers 285, 286. The inorganic sealing layer 7 covers an end surface of the second electrode layer 6.

A method for manufacturing the organic EL device 200 according to the present embodiment will be described below.

The organic EL device 200 is also manufactured by conducting patterning with a laser scriber in the same manner for the organic EL device 1 of the first embodiment.

First, an organic EL element forming process for laminating the organic EL element 12 is conducted.

Figure 25A:
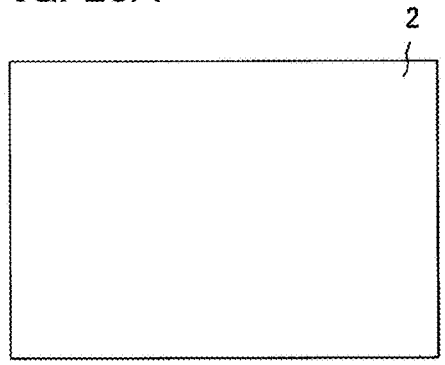
FIGS. 25A to 25G are explanatory views illustrating each process up to formation of a first inorganic sealing layer of the organic EL device in FIG. 20, in which A to G are plan views of respective steps.
Figure 25B:
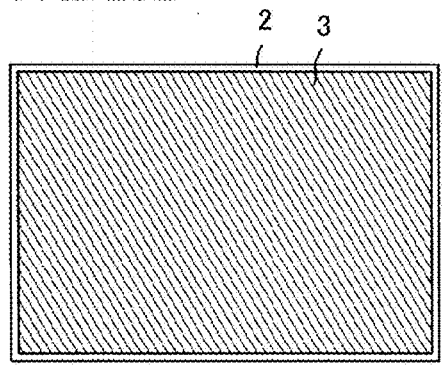

Specifically, the first electrode layer 3 is deposited on part or whole of the transparent substrate 2 by the sputtering method or the CVD method (FIGS. 25A to 25B).

At this point, in the present embodiment, the first electrode layer 3 is not stacked in the vicinities of long side (the side extending in the length direction) and the short side (the side orthogonal to the length direction, that is, the side extending in the width direction) of the transparent substrate 2.

Figure 25C:
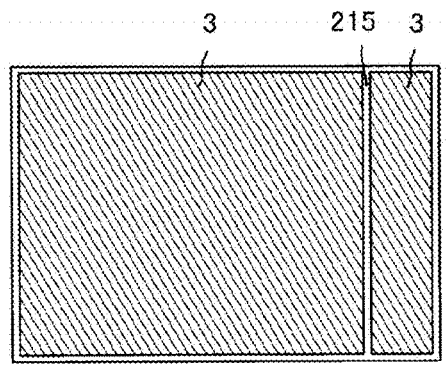

Then, in the substrate on which the first electrode layer 3 is deposited, the first electrode layer separation groove 215 is formed with a laser scriber (FIGS. 25B to 25C).

At this point, the first electrode layer separation groove 215 is formed in parallel with a short side of the transparent substrate 2, and extends throughout the width direction.

The first electrode layer separation groove 215 is formed in a boundary region between the feeding area 232 and the emission area 230 when the organic EL device 200 is formed. That is, the first electrode layer separation groove 215 divides the first electrode layer 3 into two areas in the length direction.

Figure 25D:
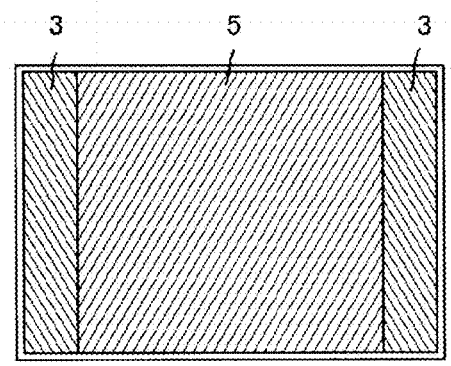

Then the region corresponding to the whole of the feeding area 231 and the region corresponding to part of the feeding area 232 at the time of completion of the organic EL device 200 are hidden with masks, and the electron-injection layer, the electron-transport layer, the light emitting layer, the hole-transport layer, the hole-injection layer and so on are sequentially stacked on this substrate with the vacuum evaporation apparatus to form the functional layer 5 (FIG. 25C to FIG. 25D).

At this point, the functional layer 5 is stacked in the first electrode layer separation groove 215, and the first electrode layer separation groove 215 is filled with the functional layer 5, and the functional layer 5 is stacked on the most part of this substrate.

Figure 25E:
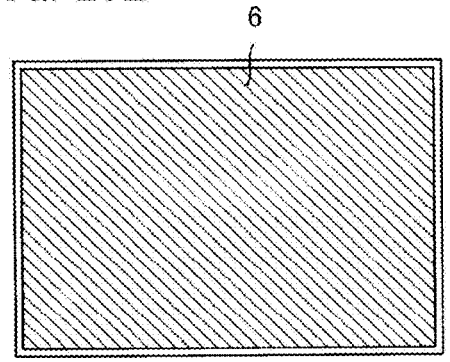

Then, on the substrate on which the functional layer 5 is deposited, the second electrode layer 6 is deposited on almost the whole surface with the vacuum evaporation apparatus (FIG. 25D to FIG. 25E).

At this point, in the region hidden by the mask (the region where the functional layer 5 does not covers), the second electrode layer 6 is stacked and fixedly bonded in the condition that the first electrode layer 3 and the second electrode layer 6 (conductive layers 285, 286) are in contact with each other, and the first electrode layer 3 and the second electrode layer 6 (conductive layers 285, 286) are electrically connected.

Figure 25F:
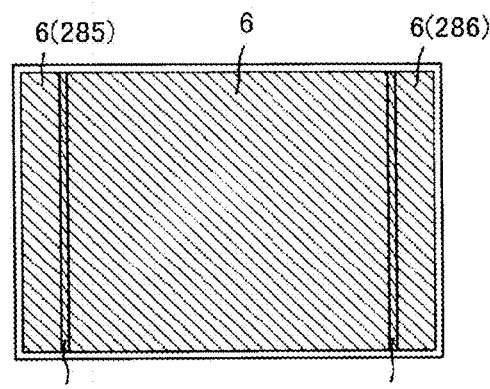

Then, on the substrate on which the second electrode layer 6 is deposited, the conductive layer separation grooves 277, 278 are formed with the lase scriber (FIG. 25E to FIG. 25F).

At this point, the conductive layer separation grooves 277, 278 are formed in parallel with the first electrode layer separation groove 215, and formed in an area on the outer side of the area where the functional layer 5 is formed, where the second electrode layer 6 is stacked. The conductive layer separation groove 277 is formed in a boundary region between the feeding area 231 and the emission area 230 when the organic EL device 200 is formed. The conductive layer separation groove 278 is formed on the outer side of the boundary region between the emission area 230 and the feeding area 232 (on the side of the feeding area 232) when the organic EL device 200 is formed.

The foregoing is the organic EL element forming process.

Subsequently, an inorganic sealing layer forming process for forming the inorganic sealing layer 7 is conducted.

Figure 25G:
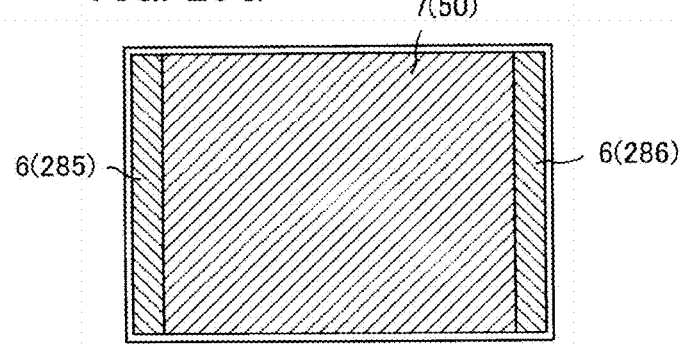

First the substrate is partially covered with a mask, and the first inorganic sealing layer 50 is deposited with the CVD apparatus (FIG. 25F to FIG. 25G) (first inorganic sealing layer forming process).

At this point, as illustrated in FIG. 22, the first inorganic sealing layer 50 covers at least the second electrode layer 6 of the emission area 230, and extends onto the projection planes in the member thickness direction of the conductive layer separation grooves 277, 278. That is, the first inorganic sealing layer 50 is stacked in the conductive layer separation grooves 277, 278 and fills the same. Therefore, the sealing function can sufficiently be secured.

Further, as illustrated in FIG. 22, the first inorganic sealing layer 50 of the present embodiment extends beyond the conductive layer separation grooves 277, 278 in the length direction l and as illustrated in FIG. 23, it reaches the vicinity of the long side of the substrate in the width direction w. That is, on part of the conductive layers 285, 286, the first inorganic sealing layer 50 is deposited. Therefore, the heat-transfer property and the sealing property can be further improved.

Then, the substrate on which the first inorganic sealing layer 50 is deposited is taken out from the CVD apparatus, the raw material for the second inorganic sealing layer 51 is applied to the substrate to form the second inorganic sealing layer 51, and thus the inorganic sealing layer 7 is formed (second inorganic sealing layer forming process).

At this point, the whole surface of the first inorganic sealing layer 50 is covered with the second inorganic sealing layer 51.

In this way, the second inorganic sealing layer 51 is stacked on the first inorganic sealing layer 50, and thus the inorganic sealing layer 7 is formed.

Subsequently, a conductive base member bonding process for bonding the conductive base member 280 to the inorganic sealing layer 7 formed in the manner as described above is conducted.

In the conductive base member bonding process, the soft adhesion layer 8 is formed, and the conductive base member 280 is bonded to the inorganic sealing layer 7.

Figure 26A:
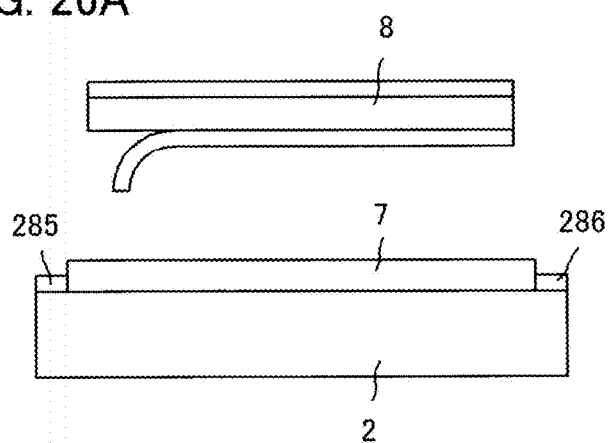
FIGS. 26A to 26C are explanatory views illustrating a process of forming a soft adhesion layer of the organic EL device in FIG. 20, in which A to C denote respective steps.
Figure 26B:
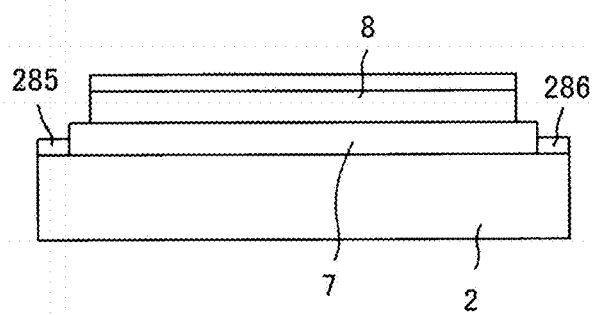

Specifically, the soft adhesion layer 8 is bonded onto the inorganic sealing layer 7 with a vacuum laminating machine (FIG. 26A to FIG. 26B).

At this point, in forming the soft adhesion layer 8, the soft adhesion layer 8 whose both faces are covered with insulating separators is used. At the time of bonding, the separator on one face of the soft adhesion layer 8 is removed, and the stripped face is bonded onto the inorganic sealing layer 7. In this bonded condition, the soft adhesion layer 8 covers the whole of the emission area 230, and further, as illustrated in FIG. 22, it extends to part of the feeding area 232 in the length direction l but does not reach the conductive layer separation grooves 277, 278. That is, the soft adhesion layer 8 does not cover the outer sides of the conductive layer separation grooves 277, 278, and thus the inorganic sealing layer 7 is exposed. In other words, as illustrated in FIG. 22 and FIG. 23, in the inorganic sealing layer 7, the region exposed from the soft adhesion layer 8 and the region covered with the soft adhesion layer 8 coexist, and the region covered with the soft adhesion layer 8 is located in the center of the width direction and the length direction.

Figure 26C:
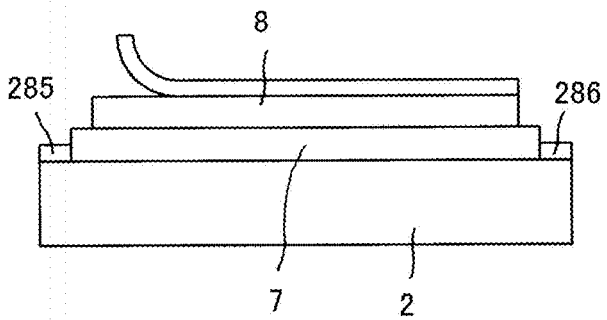
Figure 27D:
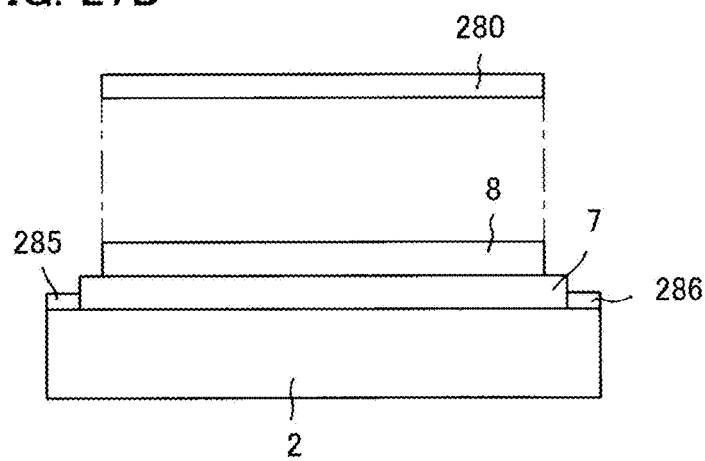
FIGS. 27D to 27F are explanatory views illustrating a process up to formation of a hard adhesion layer of the organic EL device in FIG. 20, in which D to F denote respective steps.

Thereafter, the separator on the opposite side of the stripped face is removed, and the conductive base member 280 is placed to be bonded with the soft adhesion layer 8 with the vacuum laminating machine (FIG. 26C, FIG. 27D).

At this point, the conductive base member 280 covers the whole surface of the soft adhesion layer 8, and is integrated with the inorganic sealing layer 7 by means of the bonding function of the soft adhesion layer 8. That is, the conductive base member 280 indirectly covers the whole surface of the organic EL element 12 in the emission area 230.

Figure 27E:
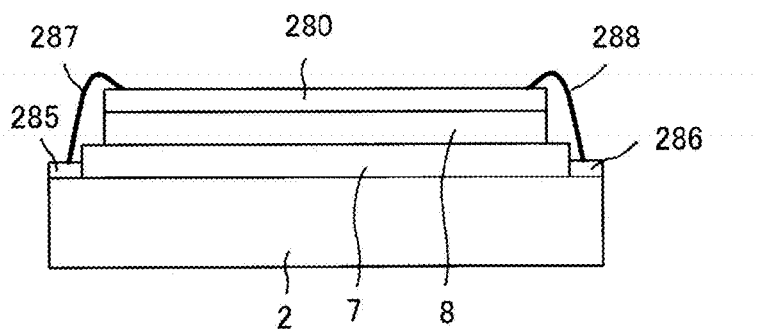

Thereafter, the conductive base member 280 and the conductive layers 285, 286 are connected by conducting a wire bonding process (FIG. 27E).

Specifically, as illustrated in FIG. 24A, the vicinity of one side of the conductive base member 280 and the conductive layer 285 are bonded with a plurality of wires 287. The vicinity of the side opposite to the one side of the conductive base member 280 and the conductive layer 286 are bonded with a plurality of wires 288.

At this point, as illustrated in FIG. 22, the wires 287 pass through the projection plane in the vertical direction of the conductive layer separation groove 277, and the wires 288 pass through the projection plane in the vertical direction of the conductive layer separation groove 278. The conductive layers 285, 286 and the conductive base member 280 are connected by the plural wires 287, 288, respectively. Therefore, the connection strength is high, and the conductive layers 285, 286 hardly peel off under tension of the wires 287, 288. And hence, the reliability is high.

Figure 27F:
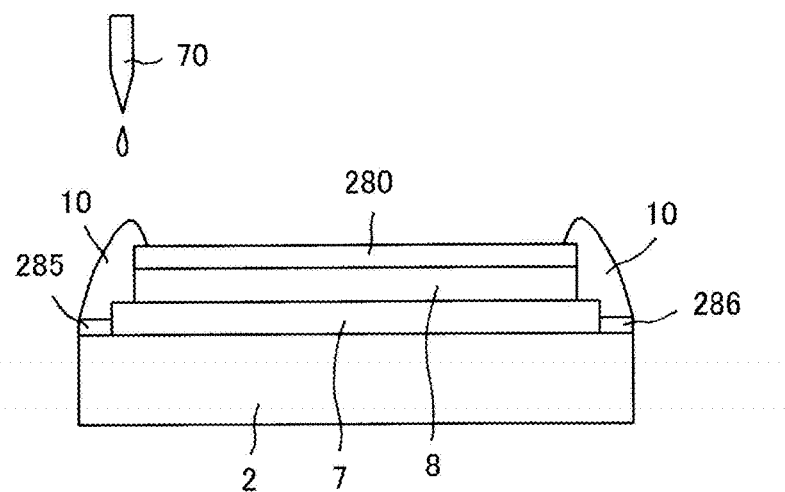

Subsequently, the raw material of the hard adhesion layer 10 is applied to the substrate with a dispenser 270 to deposit the hard adhesion layer 10 (FIG. 27F).

At this point, part of the conductive base member 280 is embedded in the hard adhesion layer 10. That is, the conductive base member 280 is fixed by the soft adhesion layer 8 and the hard adhesion layer 10 both having the bonding property.

As illustrated in FIG. 22, the hard adhesion layer 10 is applied and formed to stretch from the conductive base member 280 to the conductive layers 285, 286 in the length direction l and as illustrated in FIG. 23, the hard adhesion layer 10 is applied and formed to stretch from the conductive base member 280 to the first electrode layer 3 in the width direction w.

Figure 28:
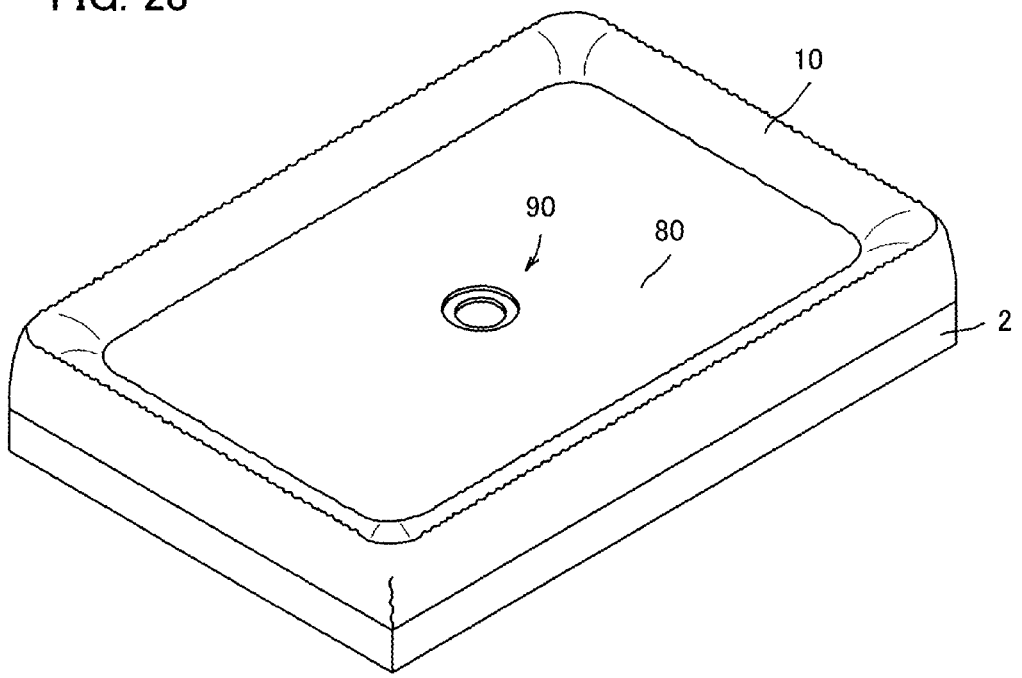
FIG. 28 is a conceptual view of the organic EL device in the condition of FIG. 27F.

As illustrated in FIG. 28, the most part of the conductive base member 280 located in the emission area 230 is not covered with the hard adhesion layer 10. That is, an opening where the conductive base member 280 is exposed is formed. The opening has a substantially rectangular shape. An area of the opening is slightly larger than the area of the emission area 230. The area of the opening ranges from 90% to 98%, inclusive, preferably 95% to 98%, inclusive, of the area where the conductive base member 280 is formed.

The wires 287, 288 are hardened in the condition that they are embedded in the hard adhesion layer 10. That is, pseudo potting sealing is achieved. Therefore, the strengths of the wires 287, 288 are reinforced, and moisture hardly invades into the interior.

In this way, the conductive base member bonding process ends to complete the organic EL device 200.

According to the organic EL device 200 of the present embodiment, the wires 287, 288 are covered with the hard adhesion layer 10. Therefore, the strengths of the wires 287, 288 can be supplemented by the hardness of the hard adhesion layer 10, and thus the wires 287, 288 are hardly broken.

Further, the plural wires 287, 288 are covered with the common hard adhesion layer 10, and the hard adhesion layer 10 has expanse in the side directions. Therefore, they are insusceptible to external force, and are hardly broken.

Figure 29:
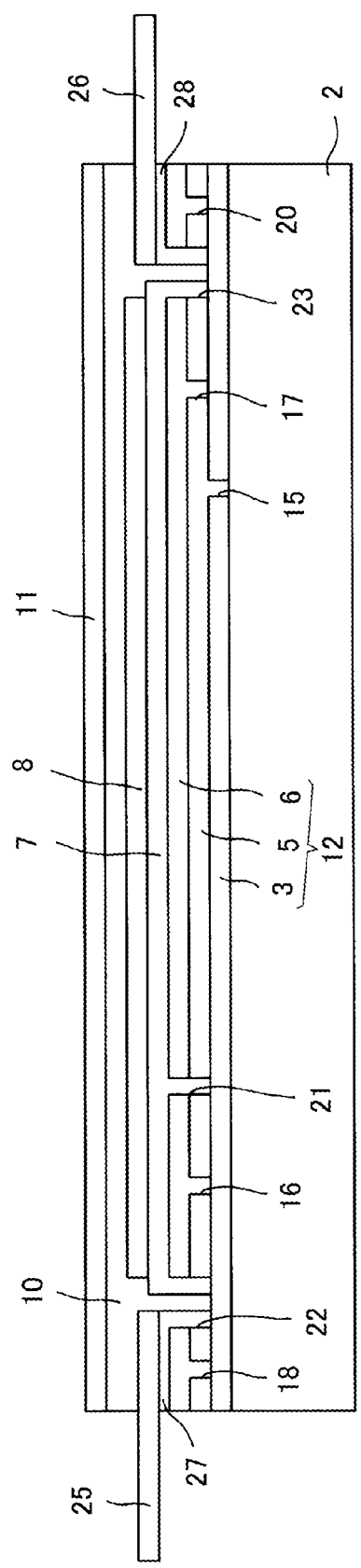
FIG. 29 is a sectional view schematically illustrating an organic EL device in other embodiment of the present invention, and hatching is omitted for the purpose of easy understanding.

In the aforementioned first embodiment, the hard adhesion layer 10 is partially laminated on the inorganic sealing layer 7, however, the present invention is not limited to this configuration, and the hard adhesion layer 10 may wholly cover the soft adhesion layer 8 as illustrated in FIG. 29. In this case, the soft adhesion layer 8 is embedded in the hard adhesion layer 10, and is not exposed outside the hard adhesion layer 10.

Figure 30:
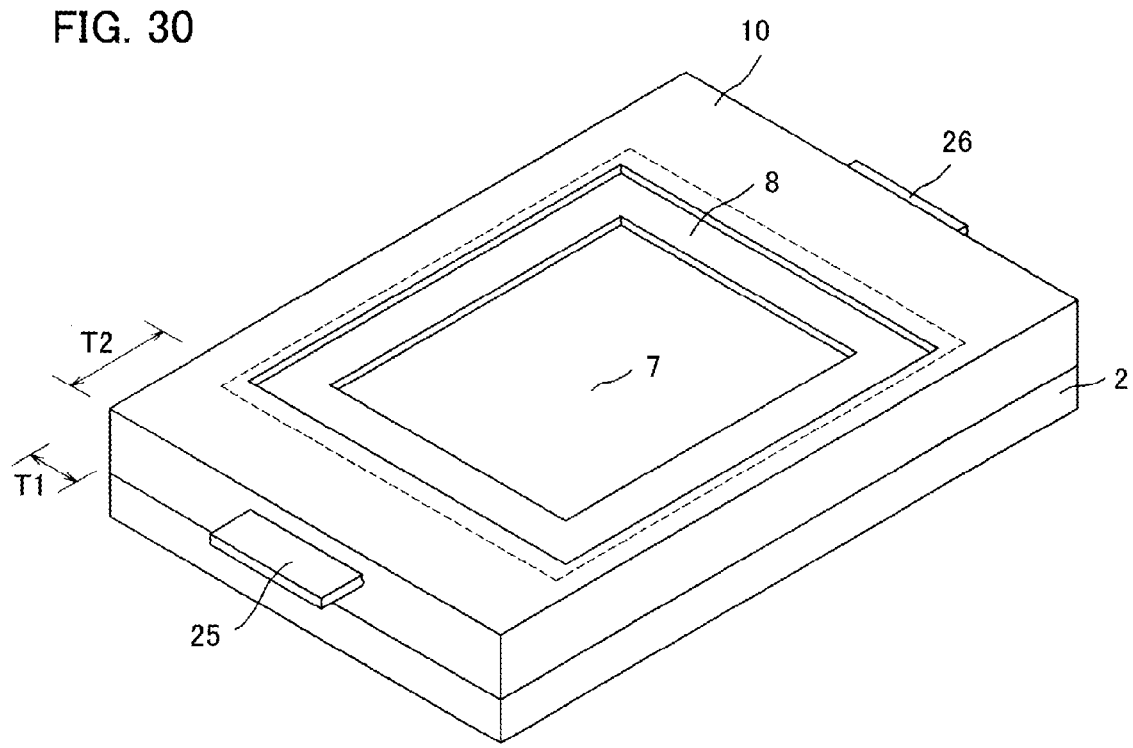
FIG. 30 is a perspective view schematically illustrating an organic EL device in other embodiment of the present invention, and the moisture-proof member is removed for the purpose of easy understanding.

In the above embodiment, the soft adhesion layer 8 covers the whole of the vicinity of the center of the organic EL device 1, however, the present invention is not limited to this configuration, and as illustrated in FIG. 30, the soft adhesion layer 8 in the shape of a hollow square in a planar view may be used, and the hard adhesion layer 10 may cover around the soft adhesion layer 8.

In the hard wall part according to the present invention configured by the hard adhesion layer 10 as described above, widths (thickness of the hard wall part) T1, T2 of the hard adhesion layer 10 in the direction parallel with the plane of the transparent substrate 2 illustrated in FIG. 30 range preferably from 0.05 mm to 10 mm, inclusive, more preferably from 0.1 mm to 5 mm, inclusive, further preferably from 0.5 mm to 2 mm, inclusive, from the view point of supporting the moisture-proof member 11 according to the present invention with sufficient strength, sufficiently preventing invasion of moisture into the organic EL element 12, reinforcing the electrode members 25, 26 (feeding members) according to the present invention with sufficient strength, preventing oxidation of the same, and narrowing the frame region which is to be the non-emission area where the hard wall part exists.

In the aforementioned embodiment, although the hard adhesion layer 10 is provided, the present invention is not limited to this, and it is required that at least the soft adhesion layer 8 is stacked on the inorganic sealing layer 7. That is, the hard adhesion layer 10 is not necessarily provided.

In the aforementioned embodiment, although the one formed by solidifying a fluid such as a solution or gel is used as the hard adhesion layer 10, the present invention is not limited to this. The hard adhesion layer 10 may be in a sheet shape or a plate shape. Also, a sheet-like or plate-like hard resin layer and liquid concentrate of a fluidal hard resin layer may be combined to form the hard adhesion layer 10.

In the aforementioned embodiment, although description is made for the case where a rectangular glass substrate is used as the transparent substrate 2, the present invention is not limited to this. The transparent substrate 2 may have a square shape.

Although the present invention is more specifically described with the organic EL device as examples, the present invention is not limited to the examples.

EXAMPLES

A procedure to prepare the organic EL devices of the specific examples of the present invention and comparative examples and evaluation results of the specific examples and comparative examples will be described below.

First Example

A substrate having a size of 60 mm by 60 mm was used as the transparent substrate 2 on which an organic EL device is formed, and alkali-free glass (thickness of 0.7 mm) in which ITO (Indium Tin Oxide, film thickness of 150 nm) is stacked as the first electrode layer 3 on the whole surface of one of surfaces was used. That is, as the transparent substrate 2 and the first electrode layer 3, a glass substrate on which ITO was deposited was used.

Then the substrate was moved to the vacuum evaporation apparatus, and the following materials were deposited in vacuum.

The hole-injection layer having a thickness of 10 nm was deposited on the whole surface of one of the surfaces of the first electrode layer 3 by the vacuum evaporation method using a mixed layer of 4,4'-bis[N-(2-naphtyl)-N-phenyl-amino]biphenyl (hereinafter, abbreviated to NPB) and molybdenum trioxide. The hole-injection layer was deposited by a co-evaporation method such that a thickness ratio of NPB and molybdenum trioxide becomes 9:1.

Then the hole-transport layer having a thickness of 50 nm (evaporation rate of 0.08 nm/sec to 0.12 nm/sec) was deposited using NPB by the vacuum evaporation method.

Then the light emitting layer and electron-transport layer having a thickness of 70 nm (evaporation rate of 0.24 nm/sec to 0.28 nm/sec) was deposited using tris (8-quinolinolate) aluminum (hereinafter, abbreviated to Alq3) by the vacuum evaporation method.

Then the electron-injection layer having a thickness of 1 nm (evaporation rate of 0.03 nm/sec to 0.05 nm/sec) was deposited using lithium fluoride (LiF) by the vacuum evaporation method.

Aluminum (Al) having a thickness of 300 nm (evaporation rate of 0.3 nm/sec to 0.5 nm/sec) was deposited as part of the functional layer 5 on the electron-injection layer by the vacuum evaporation method.

The functional layer 5 was formed in this way.

The electrode connection grooves 16, 17 were formed in this substrate with the laser scriber. Specifically, the substrate was irradiated with a laser beam having a second harmonic (532 nm) of the YAG laser from the other side of the substrate (the side opposite to the deposited side) to form the electrode connection grooves 16, 17 having a groove width of 60 μm. At the same time, the extraction electrode fixing grooves 18, 20 having the groove width of 60 μm were formed.

Then the second electrode layer 6 having a thickness of 150 nm (evaporation rate of 0.3 nm/sec to 0.5 nm/sec) was deposited using aluminum (Al) by the vacuum evaporation method.

The organic EL element separation groove 21 and the extraction electrode separation grooves 22, 23 were formed in the substrate with the laser scriber. Specifically, the substrate was irradiated with a laser beam having the second harmonic (532 nm) of the YAG laser from the other side of the substrate (the side opposite to the deposited side) to form the organic EL element separation groove 21 and the extraction electrode separation grooves 22, 23 having a groove width of 40 μm.

Then, the substrate was moved to the plasma CVD apparatus, and a silicon nitride film having a thickness of 2 μm was formed as the first inorganic sealing layer 50. Then the organic EL element 12 was moved from a vacuum atmosphere to a glove box filled with a nitrogen atmosphere, and AQUAMICA (registered trademark) NL120A-05 available from AZ Electronic Materials plc (former name: Clariant AG) that is a polysilazane derivative was applied such that the thickness becomes 1 μm during the solidification and solidified to form the second inorganic sealing layer 51. That is, primary sealing was conducted by forming the inorganic sealing layer 7 having a total thickness of 3 μm.

Then a butyl rubber-based resin film (Shore A60, bending modulus of elasticity 25 MPa) having a thickness of 25 μm to which an adhesive is applied on the surface was bonded onto the second inorganic sealing layer 51 to form the soft adhesion layer 8.

Then thermosetting epoxy resin (Hardness after hardening Shore D87, bending modulus of elasticity 2500 MPa) was applied with a dispensing machine along edges of the soft adhesion layer 8 so that an average overlapping width of these layers was 1 mm, and a thickness of the formed hard wall part was 1 mm.

In other words, thermosetting epoxy resin was applied in a width of 2 mm.

Then the moisture-proof member 11 was bonded with a vacuum laminating machine.

The moisture-proof member 11 used herein is a milled aluminum foil (thickness 50 μm) sandwiched between a polyethylene terephthalate (PET) resin film (thickness 16 μm) and a polytetrafluoroethylene (PTFE) resin film (thickness 16 μm), and the PET resin film was adjoined on the side of the inorganic sealing layer 7.

In this way, second sealing was achieved by the moisture-proof member 11, and the resultant organic EL device was given as a first example.

Second Example

The organic EL device was prepared in the same way as the first example except that an acryl rubber resin adhesive resin (Shore A55, bending modulus of elasticity 23 MPa) having a thickness of 100 μm was used as the soft adhesion layer 8, and this was given as a second example.

Third Example

The organic EL device was prepared in the same way as the first example except that a butyl rubber resin film (Shore A60, bending modulus of elasticity 25 MPa) having a thickness of 50 μm was used as the soft adhesion layer 8, and this was given as a third example.

Fourth Example

The organic EL device was prepared in the same way as the first example except that after forming the soft adhesion layer 8, thermosetting epoxy resin (Hardness after hardening Shore D88, bending modulus of elasticity 3800 MPa) was applied to the whole surface thereof, and this was given as a fourth example.

Fifth Example

The organic EL device was prepared in the same way as the first example except that after forming the soft adhesion layer 8, thermosetting epoxy resin was not applied, and this was given as a fifth example.

That is, the organic EL device of the fifth example has the inorganic sealing layer 7 made up of the first inorganic sealing layer 50 formed with the CVD apparatus, and the second inorganic sealing layer 51 formed by silica transfer, and has a butyl rubber resin film (Shore A60, bending modulus of elasticity 25 MPa) having a thickness of 25 μm in the center.

Sixth Example

After forming the soft adhesion layer 8, the hard adhesion layer 10 was not bonded to the whole surface thereof, and a thermosetting sheet-like epoxy resin (Hardness after hardening Shore D88, bending modulus of elasticity 3800 MPa) was applied and cut into a width of 2 mm. The cut piece was bonded to the circumference of the emission area with sufficient care not to cover the emission area. Then, the moisture-proof member 11 was bonded to the hard adhesion layer 10 in a nitrogen atmosphere so as to be supported by the hard wall part. After that, in handling the organic EL device, special care was taken so as not to apply pressure to the hollow space formed between the hard wall part and the moisture-proof member 11. The organic EL device was prepared in the same way as the first example except for these, and this was given as a sixth example.

First Comparative Example

The organic EL device was prepared in the same way as the first example except that the second inorganic sealing layer 51 and the soft adhesion layer 8 were not formed, and a thermosetting epoxy resin (Hardness after hardening Shore D88, bending modulus of elasticity 3800 MPa) was applied on the whole surface of the first inorganic sealing layer 50, and this was given as a first comparative example.

Second Comparative Example

The organic EL device was prepared in the same way as the first example except that the soft adhesion layer 8 was not formed, a thermosetting epoxy resin was not applied, and a PET film having a thickness of 50 μm to which an adhesive was applied in place of the moisture-proof member 11 was bonded, and this was given as a second comparative example.

The number of dark spots and the size of the dark spot were observed with respect to the eight prepared levels (the first to sixth examples and the first and second comparative examples), and a temporal change during an energized accelerated test at a temperature of 60° C. and relative humidity of 85% was evaluated.

A method for evaluating the number of dark spots and the size of the dark spot, and an accelerated test method are as follows.

(Method for Evaluating the Number of Dark Spots and Size of Dark Spot)

After the prepared organic EL device was subjected to the accelerated test for 1 to 1600 hours by the accelerated test method, the number of dark spots and the size of the dark spot were measured with a Nikon microscope Eclipse L300.

(Accelerated Test Method)

A current of 250 mA (corresponding to 1000 cd/m$^2$) was passed through the prepared organic EL device using a source measure unit GS610 available from Yokogawa Meters & Instruments Corporation while the temperature of 60° C. and relative humidity of 85% were maintained in a constant temperature and humidity oven.

Table 1 shows the kinds of dark spots of 10 μm or larger evaluated for the three organic EL devices prepared as the first example, and the results of temporal change of diameter (μm) during the accelerated test.

Here, regarding the kinds of dark spots shown in Table 1 to Table 7, "NDS (circle)" represents a circular dark spot (NDS), and "BDS (burnt)" represents a burnt dark spot (BDS). FIGS. 31A and 31B and FIGS. 32A and 32B each illustrate a microphotograph of a dark spot and a sketch of the microphotograph.

Figure 31A:
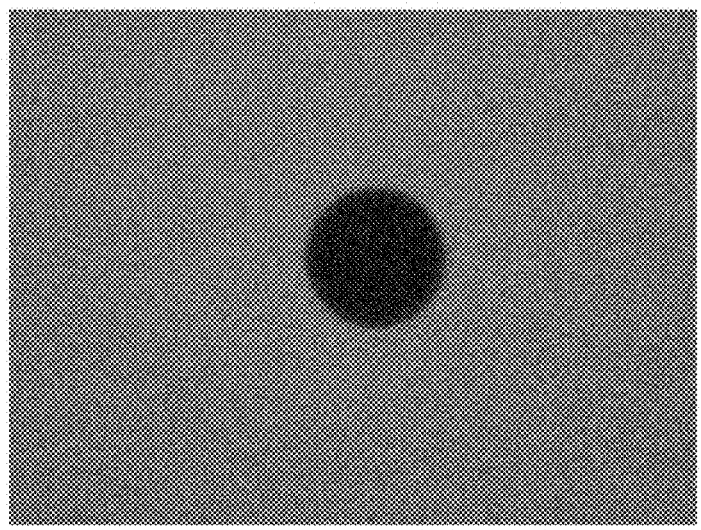
Figure 31B:
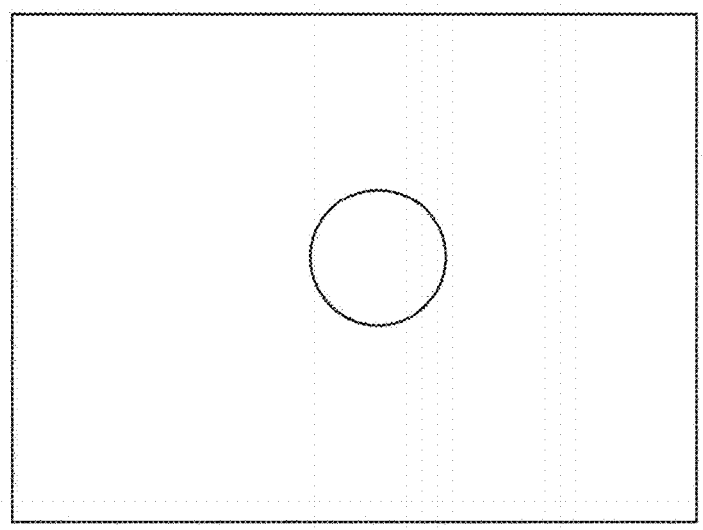

The NDS (circle) illustrated in FIGS. 31A and 31B is a dark spot that is not observable in an unlit condition, but is observable as an unlit region in a lighted condition.

Figure 32A:
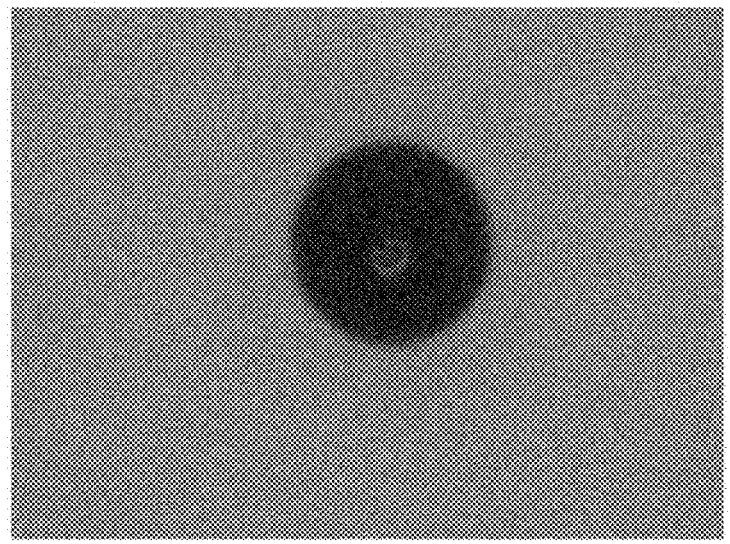
Figure 32B:
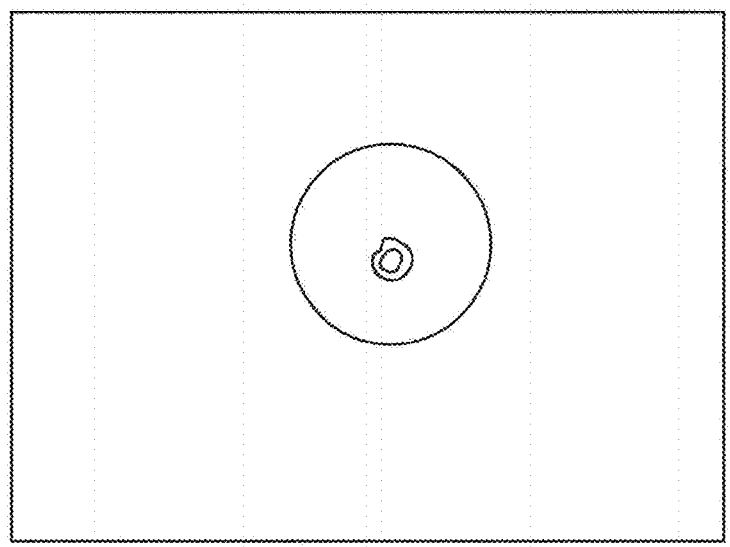
Figure 33A:
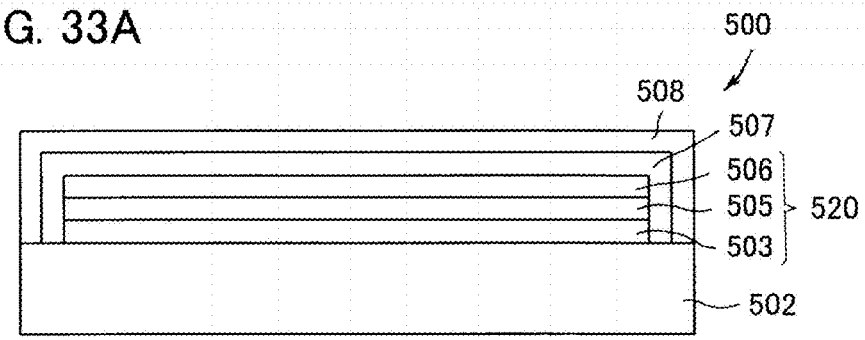
Figure 33B:
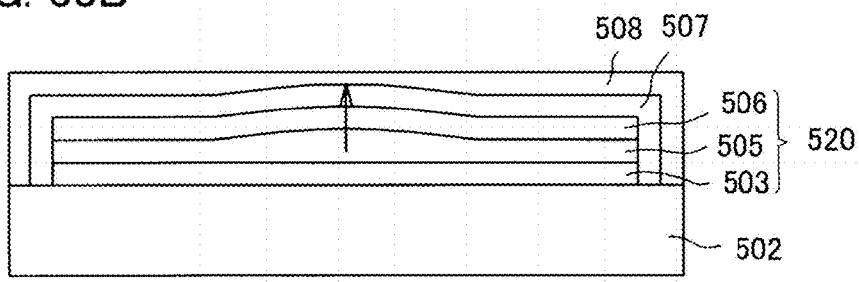
Figure 33C:
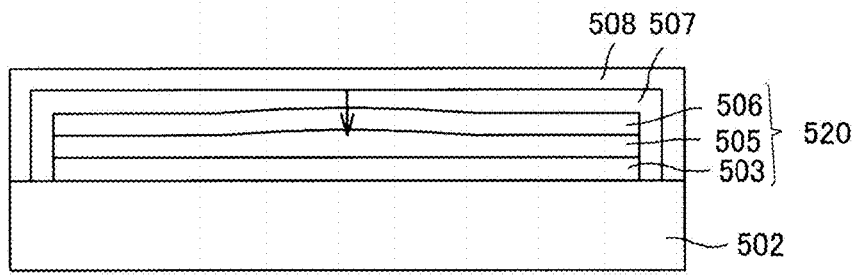

The BDS (burnt) illustrated in FIGS. 32A and 32B is a dark spot that is observable as a black spot in an unlit condition and has a burnt mark observed in the center, and this dark spot suddenly generates at the time of turning on electricity.

TABLE 1

Temporal change of dark spot in first example

| | | Lapse time (HR.) | | | | | | |
|---|---|---|---|---|---|---|---|---|
| | Kind | 0 | 16 | 104 | 196 | 308 | 500 | 780 |
| Device 1 | BDS (burnt) | 23 | 24 | 24 | 24 | 24 | 25 | 24 |
| | NDS (circle) | 50 | 51 | 50 | 50 | 50 | 50 | 50 |
| | BDS (burnt) | 63 | 88 | 82 | 79 | 80 | 83 | 88 |
| | BDS (burnt) | | | 39 | 33 | 33 | 33 | 32 |
| | BDS (burnt) | | | | 24 | 24 | 24 | 25 |
| | BDS (burnt) | | | | | | | 57 |
| Device 2 | NDS (circle) | 24 | 22 | 24 | 23 | 23 | 23 | 24 |
| | NDS (circle) | 21 | 21 | 21 | 21 | 21 | 20 | 21 |
| | NDS (circle) | 77 | 72 | 72 | 72 | 73 | 74 | 76 |
| | NDS (circle) | 70 | 69 | 71 | 72 | 73 | 76 | 80 |
| | BDS (burnt) | 21 | 19 | 20 | 19 | 21 | 20 | 21 |
| | BDS (burnt) | | | | | 26 | 25 | 26 |
| Device 3 | BDS (burnt) | 47 | 66 | 60 | 59 | 57 | 57 | 55 |
| | BDS (burnt) | 21 | 22 | 22 | 21 | 22 | 22 | 22 |
| | NDS (circle) | 51 | 50 | 51 | 50 | 49 | 52 | 57 |
| | BDS (burnt) | | 41 | 42 | 43 | 43 | 43 | 43 |
| | BDS (burnt) | | | | | 32 | 32 | 30 |
| | BDS (burnt) | | | | | | | 19 |

In all of the three evaluated devices, unlit of the overall device was not observed in 780 hours. The sizes of dark spots did not increase in 500 hours regardless of the kind of dark spot.

Next, Table 2 shows the kinds of dark spots of 10 μm or larger evaluated for the three organic EL devices prepared as the second example, and the results of temporal change of diameter (μm) during the accelerated test.

TABLE 2

Temporal change of dark spot in second example

| | | Lapse time (HR.) | | | | | |
|---|---|---|---|---|---|---|---|
| | Kind | 0 | 62 | 127 | 239 | 300 | 500 |
| Device 1 | BDS (burnt) | 51 | 51 | 50 | 51 | 51 | 51 |
| | BDS (burnt) | 66 | 64 | 79 | 79 | 79 | 79 |
| | NDS (circle) | 30 | 29 | 29 | 29 | 29 | 30 |
| | BDS (burnt) | | 18 | 29 | 23 | 24 | 17 |
| | BDS (burnt) | | 40 | 28 | 28 | 29 | 28 |
| | BDS (burnt) | | | | | 23 | 22 |
| Device 2 | BDS (burnt) | 59 | 59 | 60 | 59 | 71 | 59 |
| | NDS (circle) | 71 | 72 | 71 | 72 | 72 | 75 |
| | NDS (circle) | 55 | 56 | 55 | 56 | 56 | 61 |
| | NDS (circle) | 49 | 51 | 52 | 51 | 52 | 52 |
| | BDS (burnt) | 49 | 57 | 57 | 56 | 57 | 56 |
| | BDS (burnt) | 92 | 102 | 103 | 103 | 103 | 103 |
| | BDS (burnt) | | | | | 25 | 24 |
| | BDS (burnt) | | | | | 22 | 14 |
| Device 3 | NDS (circle) | 81 | 86 | 91 | 98 | 101 | 113 |
| | BDS (burnt) | 69 | 60 | 58 | 58 | 74 | 74 |
| | NDS (circle) | 57 | 58 | 59 | 59 | 63 | 61 |
| | BDS (burnt) | | 40 | 40 | 40 | 40 | 40 |

In all of the three evaluated devices, unlit of the overall device was not observed in 500 hours. The sizes of dark spots basically did not increase in 500 hours, however, increase in the size was observed in part of the dark spots.

Next, Table 3 shows the kinds of dark spots of 10 μm or larger evaluated for the three organic EL devices prepared as the third example, and the results of temporal change of diameter (μm) during the accelerated test.

TABLE 3

Temporal change of dark spot in third example

| | | Lapse time (HR.) | | | | | |
|---|---|---|---|---|---|---|---|
| | Kind | 0 | 16 | 104 | 196 | 308 | 500 |
| Device 1 | NDS (circle) | 24 | 18 | 18 | 19 | 19 | 20 |
| | BDS (burnt) | 53 | 49 | 50 | 49 | 49 | 49 |
| | BDS (burnt) | | 71 | 72 | 72 | 72 | 72 |
| | NDS (circle) | | 36 | 35 | 36 | 35 | 35 |
| Device 2 | BDS (burnt) | 57 | 61 | 56 | 56 | 57 | 57 |
| | NDS (circle) | | 33 | 32 | 33 | 32 | 31 |
| | BDS (burnt) | | 21 | 21 | 21 | 22 | 26 |
| | BDS (burnt) | | 60 | 52 | 62 | 62 | 61 |
| | BDS (burnt) | | | | 74 | 92 | 130 |
| Device 3 | NDS (circle) | | 336 | 345 | 351 | 352 | 358 |
| | NDS (circle) | 177 | 175 | 176 | 175 | 177 | 181 |
| | NDS (circle) | 32 | 32 | 32 | 31 | 31 | 31 |
| | NDS (circle) | 59 | 60 | 60 | 60 | 60 | 60 |
| | NDS (circle) | 44 | 45 | 45 | 45 | 46 | 45 |

In all of the three evaluated devices, unlit of the overall device was not observed in 500 hours. The sizes of dark spots basically did not increase in 500 hours, however, increase in the size was observed in part of the dark spots.

Next, Table 4 shows the kinds of dark spots of 10 μm or larger evaluated for the three organic EL devices prepared as the fourth example, and the results of temporal change of diameter (μm) during the accelerated test.

TABLE 4

Temporal change of dark spot in fourth example

| | | Lapse time (HR.) | | | | | | | | |
|---|---|---|---|---|---|---|---|---|---|---|
| | Kind | 0 | 63 | 102 | 214 | 302 | 421 | 509 | 749 | 1005 | 1589 |
| Device 1 | NDS (circle) | | 42 | 42 | 41 | 42 | 41 | 41 | 41 | 42 | 41 |
| | BDS (burnt) | | | | 107 | 108 | 105 | 107 | 107 | 111 | 108 |
| | BDS (burnt) | | | | | | 39 | 37 | 34 | 33 | 32 |
| Device 2 | BDS (burnt) | 20 | 17 | 17 | 16 | 17 | 16 | 16 | 17 | 17 | 16 |
| | BDS (burnt) | 21 | 20 | 20 | 20 | 20 | 19 | 19 | 20 | 21 | 19 |
| | BDS (burnt) | | | 15 | 14 | 14 | 14 | 14 | 15 | 13 | 13 |
| | NDS (circle) | | | 45 | 44 | 44 | 44 | 44 | 44 | 41 | 42 |
| Device 3 | BDS (burnt) | 268 | 290 | 301 | 339 | 372 | 425 | 462 | 521 | 563 | 640 |
| | NDS (circle) | 86 | 84 | 84 | 84 | 85 | 85 | 84 | 85 | 88 | 92 |
| | BDS (burnt) | | 24 | 24 | 24 | 24 | 24 | 24 | 24 | 24 | 24 |
| | NDS (circle) | | 85 | 88 | 88 | 88 | 89 | 91 | 94 | 97 | 105 |
| | BDS (burnt) | | | 20 | 12 | 12 | 12 | 15 | 18 | 18 | 16 |
| | NDS (circle) | | | 22 | 19 | 19 | 19 | 19 | 19 | 19 | 20 |
| | BDS (burnt) | | | | 35 | 35 | 34 | 33 | 31 | 30 | 35 |

In all of the three evaluated devices, unlit of the overall device was not observed in 1589 hours. The sizes of dark spots basically did not increase in 1589 hours, however, increase in the size was observed in part of the dark spots.

Next, Table 5 shows the kinds of dark spots of 10 μm or larger evaluated for the three organic EL devices prepared as the fifth example, and the results of temporal change of diameter (μm) during the accelerated test.

TABLE 5

Temporal change of dark spot in fifth example

| | | Lapse time (HR.) | | | | | | | |
|---|---|---|---|---|---|---|---|---|---|
| | Kind | 0 | 63 | 126 | 213 | 305 | 495 | 751 | 1007 | 1589 |
| Device 1 | BDS (burnt) | 34 | 75 | 67 | 83 | 81 | 82 | 82 | 82 | 81 |
| | NDS (circle) | 103 | 105 | 105 | 106 | 105 | 105 | 104 | 121 | 164 |
| | NDS (circle) | 89 | 90 | 91 | 91 | 90 | 89 | 90 | 103 | 134 |
| | NDS (circle) | 41 | 42 | 42 | 41 | 41 | 41 | 41 | 41 | 39 |
| | BDS (burnt) | | 25 | 16 | 16 | 16 | 16 | 16 | 16 | 22 |
| | BDS (burnt) | | | 47 | 47 | 47 | 47 | 47 | 47 | 47 |
| | BDS (burnt) | | | | 52 | 50 | 50 | 50 | 48 | 49 |
| | BDS (burnt) | | | | 22 | 17 | 18 | 23 | 21 | 22 |
| Device 2 | NDS (circle) | 57 | 59 | 58 | 58 | 58 | 58 | 58 | 62 | 91 |
| | BDS (burnt) | 76 | 76 | 76 | 76 | 75 | 76 | 76 | 74 | 74 |
| | BDS (burnt) | 79 | 80 | 79 | 80 | 80 | 79 | 79 | 79 | 76 |
| | BDS (burnt) | | 27 | 26 | 26 | 26 | 26 | 26 | 26 | 25 |
| | BDS (burnt) | | 47 | 50 | 54 | 55 | 54 | 54 | 54 | 56 |
| | BDS (burnt) | | | | 122 | 121 | 122 | 119 | 123 | 117 |
| | BDS (burnt) | | | | 24 | 21 | 19 | 21 | 20 | 22 |
| | BDS (burnt) | | | | | | | 83 | 76 | 86 |
| | BDS (burnt) | | | | | | | 102 | 95 | 103 |
| | BDS (burnt) | | | | | | | 78 | 71 | 81 |
| Device 3 | BDS (burnt) | 56 | 56 | 55 | 56 | 55 | 55 | 54 | 55 | 54 |
| | BDS (burnt) | 19 | 19 | 19 | 20 | 21 | 19 | 20 | 20 | 19 |
| | NDS (circle) | 27 | 27 | 25 | 26 | 26 | 25 | 25 | 24 | 25 |
| | BDS (burnt) | 46 | 44 | 40 | 46 | 45 | 40 | 44 | 42 | 42 |
| | BDS (burnt) | 26 | 26 | 21 | 26 | 26 | 22 | 27 | 28 | 26 |
| | BDS (burnt) | 57 | 56 | 54 | 55 | 54 | 53 | 54 | 54 | 54 |
| | BDS (burnt) | 78 | 77 | 78 | 81 | 79 | 79 | 78 | 77 | 76 |
| | NDS (circle) | 54 | 57 | 54 | 57 | 53 | 53 | 54 | 53 | 55 |
| | NDS (circle) | 117 | 118 | 117 | 122 | 129 | 146 | 167 | 183 | 224 |
| | BDS (burnt) | | 33 | 31 | 32 | 31 | 31 | 31 | 30 | 30 |

In all of the three evaluated devices, unlit of the overall device was not observed in 1589 hours. The sizes of dark spots basically did not increase in 751 hours, however, increase in the size was observed in part of the dark spots. In some dark spots, the diameters suddenly increased after a lapse of 751 hours. This is attributable to invasion of moisture into the organic EL element 12 after a lapse of long time because the hard adhesion layer 10 is not stacked to cover the edge of the soft adhesion layer 8 serving as the buffer layer.

Next, Table 6 shows the kinds of dark spots of 10 μm or larger evaluated for the three organic EL devices prepared as the sixth example, and the results of temporal change of diameter (μm) during the accelerated test.

TABLE 6

Temporal change of dark spot in sixth example

| | | Lapse time (HR.) | | | | | |
|---|---|---|---|---|---|---|---|
| | Kind | 0 | 62 | 127 | 239 | 304 | 500 |
| Device 1 | NDS (circle) | 37 | 37 | 37 | 36 | 37 | 36 |
| | NDS (circle) | 27 | 26 | 27 | 27 | 27 | 27 |
| | NDS (circle) | 61 | 61 | 62 | 62 | 62 | 69 |
| | BDS (burnt) | | | | | 47 | 46 |

In the evaluated devices, unlit of the overall device was not observed in 500 hours. The sizes of dark spots basically did not increase in 500 hours.

Next, Table 7 shows the kinds of dark spots of 10 μm or larger evaluated for the three organic EL devices prepared as the first comparative example, and the results of temporal change of diameter (μm) during the accelerated test.

TABLE 7

Temporal change of dark spot in first comparative example

| | | Lapse time (HR.) | | | | | | |
|---|---|---|---|---|---|---|---|---|
| | Kind | 0 | 12 | 36 | 100 | 200 | 300 | 500 |
| Device 1 | NDS (circle) | 370 | 370 | 370 | 370 | 375 | 375 | 375 |
| | BDS (burnt) | | 207 | 207 | 207 | 207 | 207 | 207 |
| | BDS (burnt) | | | 79 | 79 | 79 | 79 | 79 |
| Device 2 | NDS (circle) | 188 | 189 | 189 | 189 | Unlit | | |
| | NDS (circle) | 207 | 207 | 207 | 207 | Unlit | | |
| | NDS (circle) | 335 | 341 | 349 | 352 | Unlit | | |
| | NDS (circle) | 392 | 411 | 417 | 430 | Unlit | | |
| | BDS (burnt) | | 601 | 601 | 601 | Unlit | | |
| Device 3 | NDS (circle) | 107 | 107 | 107 | 111 | Unlit | | |
| | BDS (burnt) | | | 48 | | Unlit | | |

Among three devices, unlit of the overall device was observed in two devices at a lapse of 200 hours. The sizes of dark spots did not increase in 500 hours regardless of the kind of dark spot.

When the number of times of measurement was increased, unlit of the overall device was observed in 22 devices of 33 devices prepared by applying the epoxy resin on the whole surface of the emission area without polysilazane after CVD, and being sealed with a milled aluminum film.

In the above, in the device in which sealing was conducted with a glass substrate in place of the milled aluminum film, unlit of the overall device was observed in 33 devices of 33 devices.

Next, Table 8 shows the kinds of dark spots of 10 μm or larger evaluated for the three organic EL devices prepared as the second comparative example, and the results of temporal change of diameter (μm) during the accelerated test.

TABLE 8

Temporal change of dark spot in second comparative example

| | | Lapse time (HR.) | | | | | |
|---|---|---|---|---|---|---|---|
| | Kind | 0 | 14 | 53 | 117 | 203 | 298 | 509 |
| Device 1 | NDS (circle) | 56 | 58 | 62 | 68 | 76 | 78 | 85 |
| | NDS (circle) | 108 | 119 | 133 | 156 | 176 | 187 | 208 |

TABLE 8-continued

Temporal change of dark spot in second comparative example

|  | Kind | \multicolumn{7}{c}{Lapse time (HR.)} | | | | | | |
| --- | --- | --- | --- | --- | --- | --- | --- | --- |
|  |  | 0 | 14 | 53 | 117 | 203 | 298 | 509 |
|  | NDS (circle) | 52 | 53 | 51 | 53 | 54 | 58 | 61 |
|  | BDS (burnt) |  | 22 | 19 | 21 | 18 | 17 | 20 |
|  | NDS (circle) |  |  | 20 | 17 | 19 | 20 | 21 |
|  | NDS (circle) |  |  | 33 | 32 | 30 | 30 | 28 |
|  | BDS (burnt) |  |  |  |  | 20 | 20 | 21 |
| Device 2 | NDS (circle) | 89 | 97 | 108 | 121 | 137 | 151 | 175 |
|  | BDS (burnt) |  | 24 | 22 | 20 | 21 | 22 | 19 |
|  | BDS (burnt) |  |  |  |  |  | 28 | 27 |
|  | BDS (burnt) |  |  |  |  |  | 17 | 15 |

In the two evaluated devices, unlit of the overall device was not observed in 500 hours. Regarding the circular dark spot (NBS), the diameter increased significantly after a lapse of 50 hours.

REFERENCE SINGS LIST 1 organic EL device
2 transparent substrate (base member)
3 first electrode layer
5 functional layer (organic light emitting layer)
6 second electrode layer
7 inorganic sealing layer (sealing layer)
8 soft adhesion layer (soft resin layer, buffer layer)
10 hard adhesion layer (hard resin layer, hard wall part)
11 moisture-proof member (sealing member)
12 organic EL element (laminate)
30 emission area
250 hard wall part
280 conductive base member
287, 288 wire (feeding member)

The invention claimed is:

1. An organic EL device having a sectional structure including a laminate having a first electrode layer, an organic light emitting layer and a second electrode layer on a base member, and a sealing layer that seals the whole or part of the laminate, wherein
a buffer layer is stacked directly or indirectly with respect to the sealing layer,
the buffer layer is a soft resin layer made of a resin, having flexibility,
an emission area that actually emits light and a feeding area to which a feeding member is connected exist when the base member is planarly viewed,
the organic EL device has a hard wall part surrounding an area including the emission area, and at least part of the feeding member is embedded in the hard wall part,
electricity is fed to the feeding area from outside via the embedded feeding member,
the organic EL device further has a conductive base member having electric conductivity on the second electrode layer,
the conductive base member and the feeding area are electrically connected with each other via the feeding member, and
in the emission area, electricity is fed from the outside via the conductive base member.

2. The organic EL device according to claim 1, wherein the conductive base member is bonded by the soft resin layer.

3. The organic EL device according to claim 1, wherein the feeding member is arranged to stretch from the feeding area to the emission area.

4. The organic EL device according to claim 1, wherein the hard wall part is a hard resin layer formed of a hard resin having an insulating property, and covers part of the conductive base member.

5. The organic EL device according to claim 1, wherein the feeding member is a bonding wire.

6. The organic EL device according to claim 1, wherein the feeding member is wholly embedded in the hard wall part.

* * * * *